(12) United States Patent
Cartier, Jr. et al.

(10) Patent No.: US 11,637,403 B2
(45) Date of Patent: Apr. 25, 2023

(54) ELECTRICAL CONNECTOR WITH HIGH SPEED MOUNTING INTERFACE

(71) Applicant: Amphenol Corporation, Wallingford, CT (US)

(72) Inventors: Marc B. Cartier, Jr., Dover, NH (US); John Robert Dunham, Windham, NH (US); Mark W. Gailus, Concord, MA (US); David Levine, Amherst, NH (US); Allan Astbury, Milford, NH (US); Vysakh Sivarajan, Nashua, NH (US); Daniel B. Provencher, Nashua, NH (US); Eric Leo, Nashua, NH (US)

(73) Assignee: Amphenol Corporation, Wallingford, CT (US)

( * ) Notice: Subject to any disclaimer, the term of this patent is extended or adjusted under 35 U.S.C. 154(b) by 144 days.

(21) Appl. No.: 17/159,855

(22) Filed: Jan. 27, 2021

(65) Prior Publication Data

US 2021/0257788 A1 Aug. 19, 2021

Related U.S. Application Data

(60) Provisional application No. 62/966,508, filed on Jan. 27, 2020.

(51) Int. Cl.
*H01R 13/648* (2006.01)
*H01R 13/6587* (2011.01)
(Continued)

(52) U.S. Cl.
CPC ......... *H01R 13/6587* (2013.01); *H01R 12/51* (2013.01); *H01R 12/718* (2013.01); *H01R 13/6471* (2013.01)

(58) Field of Classification Search
CPC ...... H01R 12/51; H01R 12/52; H01R 12/523; H01R 12/526; H01R 12/716; H01R 12/718; H01R 13/6587; H01R 13/6471
(Continued)

(56) References Cited

U.S. PATENT DOCUMENTS 4,632,476 A   12/1986 Schell
4,806,107 A   2/1989 Arnold et al.
(Continued)

FOREIGN PATENT DOCUMENTS

CN   1329812 A   1/2002
CN   1918952 A   2/2007
(Continued)

OTHER PUBLICATIONS

Chinese Office Action in connection with Chinese Application No. 201811207671.X, dated Sep. 3, 2020.
(Continued)

*Primary Examiner* — Khiem M Nguyen
(74) *Attorney, Agent, or Firm* — Wolf, Greenfield & Sacks, P.C.

(57) ABSTRACT

An electrical interconnect for passing high speed signals through an electronic system with a high density of signals and high signal integrity. The interconnect includes an electrical connector and a transition portion of a printed circuit board to which the connector is mounted. Signal conductors are connected to pads on the surface of the PCB using edge-to-pad mounting. The pads align with intermediate portions of the signal conductors such that transitions within the connector that could degrade signal integrity are avoided. The signal conductors may be positioned as individually shielded broadside coupled pairs extending in rows within the connector. Surface traces on the PCB connect the pads to signal vias aligned for vertical routing out of the
(Continued)

connector footprint. Ground planes underlying the surface traces facilitate a transition from the signal paths in the connector to those in the PCB with low mode conversion avoiding resonances in the connector shields.

32 Claims, 28 Drawing Sheets

(51) Int. Cl.
    *H01R 12/51*     (2011.01)
    *H01R 12/71*     (2011.01)
    *H01R 13/6471*     (2011.01)

(58) Field of Classification Search
    USPC .................................................. 439/607.07
    See application file for complete search history.

(56) References Cited

U.S. PATENT DOCUMENTS

| | | |
|---|---|---|
| 4,846,727 A | 7/1989 | Glover et al. |
| 4,975,084 A | 12/1990 | Fedder et al. |
| 5,038,252 A | 8/1991 | Johnson |
| 5,066,236 A | 11/1991 | Broeksteeg |
| 5,120,258 A | 6/1992 | Carlton |
| 5,429,520 A | 7/1995 | Morlion et al. |
| 5,429,521 A | 7/1995 | Morlion et al. |
| 5,433,617 A | 7/1995 | Morlion et al. |
| 5,433,618 A | 7/1995 | Morlion et al. |
| 5,484,310 A | 1/1996 | McNamara et al. |
| 5,496,183 A | 3/1996 | Soes et al. |
| 5,828,555 A | 10/1998 | Itoh |
| 6,162,997 A | 12/2000 | Memis |
| 6,166,615 A | 12/2000 | Winslow et al. |
| 6,181,219 B1 | 1/2001 | Gailus et al. |
| 6,183,301 B1 | 2/2001 | Paagman |
| 6,293,827 B1 | 9/2001 | Stokoe |
| 6,299,438 B1 | 10/2001 | Sahagian et al. |
| 6,384,341 B1 | 5/2002 | Rothermel et al. |
| 6,394,822 B1 | 5/2002 | McNamara |
| 6,503,103 B1 | 1/2003 | Cohen et al. |
| 6,607,402 B2 | 8/2003 | Cohen et al. |
| 6,663,442 B1 | 12/2003 | Helster et al. |
| 6,696,732 B2 | 2/2004 | Matsuoka et al. |
| 6,776,659 B1 | 8/2004 | Stokoe et al. |
| 6,843,657 B2 | 1/2005 | Driscoll et al. |
| 6,910,897 B2 | 6/2005 | Driscoll et al. |
| 7,139,177 B2 | 11/2006 | Gottlieb |
| 7,163,421 B1 | 1/2007 | Cohen et al. |
| 7,239,526 B1 | 7/2007 | Bibee |
| 7,317,166 B2 | 1/2008 | Nakamura |
| 7,448,909 B2 | 11/2008 | Regnier et al. |
| 7,633,766 B2 | 12/2009 | Regnier et al. |
| 7,645,944 B2 | 1/2010 | Casher et al. |
| 7,705,246 B1 | 4/2010 | Pritchard et al. |
| 7,731,537 B2 | 6/2010 | Amleshi et al. |
| 7,794,278 B2 | 9/2010 | Cohen et al. |
| 7,819,697 B2 | 10/2010 | Glover et al. |
| 7,897,880 B1 | 3/2011 | Goergen et al. |
| 7,985,097 B2 | 7/2011 | Gulla |
| 8,080,738 B2 | 12/2011 | Morgan |
| 8,241,067 B2 | 8/2012 | Girard, Jr. et al. |
| 8,251,745 B2 | 8/2012 | Johnescu |
| 8,273,994 B2 | 9/2012 | Reynov et al. |
| 8,715,006 B2 | 5/2014 | Jeon |
| 8,841,560 B1 | 9/2014 | Roberts |
| 8,889,999 B2 | 11/2014 | Thurairajaratnam et al. |
| 9,202,783 B1 | 12/2015 | Simpson et al. |
| 9,544,992 B2 | 1/2017 | Minich |
| 9,560,741 B2 | 1/2017 | Rose et al. |
| 9,585,259 B1 | 2/2017 | Reynov |
| 9,640,913 B1 | 5/2017 | Wang |
| 9,775,231 B2 | 9/2017 | Cartier, Jr. |
| 9,807,869 B2 | 10/2017 | Gailus et al. |
| 9,923,293 B2 | 3/2018 | Swernofsky et al. |
| 9,930,772 B2 | 3/2018 | Morgan et al. |
| 10,034,366 B2 | 7/2018 | Gailus et al. |
| 10,187,972 B2 | 1/2019 | Charbonneau et al. |
| 10,201,074 B2 | 2/2019 | Charbonneau et al. |
| 10,375,822 B2 | 8/2019 | Li et al. |
| 10,455,689 B2 | 10/2019 | Gailus et al. |
| 10,485,097 B2 | 11/2019 | Charbonneau et al. |
| 10,638,599 B2 | 4/2020 | Charbonneau et al. |
| 10,849,218 B2 | 11/2020 | Gailus et al. |
| 10,993,314 B2 | 4/2021 | Charbonneau et al. |
| 2002/0179332 A1 | 12/2002 | Uematsu et al. |
| 2003/0188889 A1 | 10/2003 | Straub et al. |
| 2004/0115968 A1 | 6/2004 | Cohen |
| 2004/0150970 A1 | 8/2004 | Lee |
| 2004/0183212 A1 | 9/2004 | Alcoe |
| 2004/0263181 A1 | 12/2004 | Ye et al. |
| 2005/0161254 A1 | 7/2005 | Clink |
| 2005/0201065 A1 | 9/2005 | Regnier et al. |
| 2005/0202722 A1 | 9/2005 | Regnier et al. |
| 2005/0245105 A1 | 11/2005 | Driscoll et al. |
| 2006/0022303 A1 | 2/2006 | Desai et al. |
| 2006/0043572 A1 | 3/2006 | Sugimoto et al. |
| 2006/0090933 A1 | 5/2006 | Wig et al. |
| 2006/0091545 A1 | 5/2006 | Casher et al. |
| 2006/0185890 A1 | 8/2006 | Robinson |
| 2006/0228912 A1 | 10/2006 | Morlion et al. |
| 2006/0232301 A1 | 10/2006 | Morlion et al. |
| 2006/0244124 A1 | 11/2006 | Ohlsson |
| 2007/0130555 A1 | 6/2007 | Osaka |
| 2008/0093726 A1 | 4/2008 | Preda et al. |
| 2008/0237893 A1 | 10/2008 | Quach et al. |
| 2008/0283285 A1 | 11/2008 | Freeh et al. |
| 2008/0308313 A1 | 12/2008 | Gorcea |
| 2008/0318450 A1 | 12/2008 | Regnier et al. |
| 2009/0056999 A1 | 3/2009 | Kashiwakura |
| 2009/0111289 A1 | 4/2009 | Vinther |
| 2009/0188711 A1 | 7/2009 | Ahmad |
| 2010/0048043 A1 | 2/2010 | Morlion et al. |
| 2010/0101083 A1 | 4/2010 | Lee et al. |
| 2010/0307798 A1 | 12/2010 | Izadian |
| 2011/0062593 A1 | 3/2011 | Abe et al. |
| 2011/0081809 A1 | 4/2011 | Morgan |
| 2011/0165784 A1 | 7/2011 | Gulla |
| 2011/0203843 A1 | 8/2011 | Kushta |
| 2011/0232955 A1 | 9/2011 | Morgan |
| 2012/0003848 A1 | 1/2012 | Casher et al. |
| 2012/0167386 A1 | 7/2012 | Goergen et al. |
| 2012/0199380 A1 | 8/2012 | Olsen |
| 2012/0243147 A1 | 9/2012 | Marconi et al. |
| 2012/0243184 A1 | 9/2012 | Lee |
| 2012/0252232 A1 | 10/2012 | Buck et al. |
| 2013/0005160 A1 | 1/2013 | Minich |
| 2013/0056255 A1 | 3/2013 | Biddle et al. |
| 2013/0077268 A1 | 3/2013 | Brunker et al. |
| 2013/0098671 A1 | 4/2013 | Thurairajaratnam et al. |
| 2013/0109232 A1 | 5/2013 | Paniaqua |
| 2013/0112465 A1 | 5/2013 | Duvanenko |
| 2013/0175077 A1 | 7/2013 | Kim et al. |
| 2013/0199834 A1 | 8/2013 | De Geest et al. |
| 2013/0215587 A1 | 8/2013 | Kawai |
| 2013/0330941 A1 | 12/2013 | Jeon |
| 2014/0004724 A1 | 1/2014 | Cartier, Jr. et al. |
| 2014/0140027 A1 | 5/2014 | Enriquez Shibayama et al. |
| 2014/0182891 A1 | 7/2014 | Rengarajan et al. |
| 2014/0197545 A1 | 7/2014 | Chase et al. |
| 2014/0209370 A1 | 7/2014 | Minich |
| 2014/0209371 A1 | 7/2014 | Minich et al. |
| 2015/0015288 A1 | 1/2015 | Ma |
| 2015/0114706 A1 | 4/2015 | Rose et al. |
| 2015/0264801 A1 | 9/2015 | Martin et al. |
| 2016/0150633 A1 | 5/2016 | Cartier, Jr. |
| 2016/0150639 A1 | 5/2016 | Gailus et al. |
| 2016/0150645 A1 | 5/2016 | Gailus et al. |
| 2016/0183373 A1 | 6/2016 | Williams et al. |
| 2017/0047686 A1 | 2/2017 | Wig |
| 2017/0196079 A1 | 7/2017 | Morgan et al. |
| 2017/0265296 A1 | 9/2017 | Charbonneau et al. |
| 2017/0294743 A1 | 10/2017 | Gailus et al. |

(56) References Cited

U.S. PATENT DOCUMENTS

| | | | |
|---|---|---|---|
| 2018/0145457 A1 | 5/2018 | Kondo et al. | |
| 2018/0301835 A1 | 10/2018 | Taylor | |
| 2018/0324941 A1 | 11/2018 | Gailus et al. | |
| 2019/0037684 A1 | 1/2019 | Park et al. | |
| 2019/0110359 A1 | 4/2019 | Charbonneau et al. | |
| 2019/0150273 A1 | 5/2019 | Charbonneau et al. | |
| 2019/0380204 A1 | 12/2019 | Cartier et al. | |
| 2020/0022252 A1 | 1/2020 | Gailus et al. | |
| 2020/0068705 A1 | 2/2020 | Charbonneau et al. | |
| 2020/0229299 A1 | 7/2020 | Charbonneau et al. | |
| 2020/0373689 A1* | 11/2020 | Cartier | H01R 9/24 |
| 2021/0076486 A1 | 3/2021 | Gailus et al. | |
| 2021/0257788 A1* | 8/2021 | Cartier, Jr. | H01R 13/6471 |

FOREIGN PATENT DOCUMENTS

| | | |
|---|---|---|
| CN | 101142860 A | 3/2008 |
| CN | 101378633 A | 3/2009 |
| CN | 101849324 A | 9/2010 |
| CN | 101925253 A | 12/2010 |
| CN | 201709040 U | 1/2011 |
| CN | 102265708 A | 11/2011 |
| CN | 202840016 U | 3/2013 |
| CN | 104040787 A | 9/2014 |
| JP | 2000-183242 A | 6/2000 |
| JP | 2002-531960 A | 9/2002 |
| JP | 2007-142307 A | 6/2007 |
| JP | 2009-059873 A | 3/2009 |
| JP | 2014-107494 A | 6/2014 |
| WO | WO 00/33624 A1 | 6/2000 |
| WO | WO 01/57964 A1 | 8/2001 |
| WO | WO 2009/023238 A1 | 2/2009 |
| WO | WO 2010/111379 A2 | 9/2010 |
| WO | WO 2014/105435 A1 | 7/2014 |

OTHER PUBLICATIONS

Extended European Search Report for European Application No. 14745727.9 dated Oct. 21, 2016.
International Preliminary Report on Patentability dated Dec. 24, 2020 for Application No. PCT/US2019/036285.
International Preliminary Report on Patentability dated Jun. 1, 2017 for Application No. PCT/US2015/061907.
International Preliminary Report on Patentability dated Jun. 1, 2017 for Application No. PCT/US2015/061919.
International Preliminary Report on Patentability dated Jun. 1, 2017 for Application No. PCT/US2015/061930.
International Preliminary Report on Patentability dated May 22, 2020 for Application No. PCT/US2018/059757.
International Preliminary Report on Patentability dated Sep. 20, 2018 for Application No. PCT/US2017/021158.
International Search Report and Written Opinion for International Application No. PCT/US2018/059757 dated Mar. 7, 2019.
International Search Report and Written Opinion for International Application No. PCT/US2019/036285 dated Sep. 27, 2019.
International Search Report and Written Opinion dated Apr. 8, 2016 for Application No. PCT/US2015/061919.
International Search Report and Written Opinion dated Apr. 8, 2016 for Application No. PCT/US2015/061930.
International Search Report and Written Opinion dated Mar. 8, 2016 for Application No. PCT/US2015/061907.
International Search Report and Written Opinion dated May 31, 2017 for Application No. PCT/US2017/021158.
International Search Report and Written Opinion dated May 17, 2021 in connection with International Application No. PCT/US2021/015234.
International Search Report and Written Opinion for International Application No. PCT/US2021/015221, dated May 18, 2021.
[No Author Listed], ExaMAX™ Connector System, press-fit products. FCI Application Specification No. GS-20-0361. Preliminary. Revision 6. Mar. 12, 2014. 25 pages.
[No Author Listed], SFF-8643 Specification for Mini Multilane 12 Gbs 8/4x Unshielded Connector, Rev 2.3. SFF Committee, Jan. 11, 2011, 24 pages.
[No Author Listed], Strada Whisper Connector Daughtercard Footprint. Tyco Electronics, Mar. 24, 2010, 1 page.
[No Author Listed], Strada Whisper High Speed Backplane Connector System. Tyco Electronics. Presentation. Mar. 24, 2010. 15 pages.
[No Author Listed], Zipline Connector System, http://www.slideshare.net/element14/zipline-connector-system Mar. 10, 2011. Last accessed Oct. 12, 2015. 15 pages.
Charbonneau et al., Backplane Footprint For High Speed, High Density Electrical Connectors, U.S. Appl. No. 17/218,335, filed Mar. 31, 2021.
Dunham et al., Electrical Connector With High Speed Mounting Interface, U.S. Appl. No. 17/159,794, filed Jan. 27, 2021.
U.S. Appl. No. 16/435,781, filed Jun. 10, 2019, Cartier et al.
U.S. Appl. No. 16/837,222, filed Apr. 1, 2020, Charbonneau et al.
U.S. Appl. No. 17/082,105, filed Oct. 28, 2020, Gailus et al.
U.S. Appl. No. 17/159,794, filed Jan. 27, 2021, Dunham et al.
U.S. Appl. No. 17/218,335, filed Mar. 31, 2021, Charbonneau et al.
CN 201811207671.X, Sep. 3, 2020, Chinese Office Action.
EP 14745727.9, Oct. 21, 2016, Extended European Search Report.
PCT/US2015/061907, Mar. 8, 2016, International Search Report and Written Opinion.
PCT/US2015/061907, Jun. 1, 2017, International Preliminary Report on Patentability.
PCT/US2015/061919, Apr. 8, 2016, International Search Report and Written Opinion.
PCT/US2015/061919, Jun. 1, 2017, International Preliminary Report on Patentability.
PCT/US2015/061930, Apr. 8, 2016, International Search Report and Written Opinion.
PCT/US2015/061930, Jun. 1, 2017, International Preliminary Report on Patentability.
PCT/US2017/021158, May 31, 2017, International Search Report and Written Opinion.
PCT/US2017/021158, Sep. 20, 2018, International Preliminary Report on Patentability.
PCT/US2018/059757, Mar. 7, 2019, International Search Report and Written Opinion.
PCT/US2018/059757, May 22, 2020, International Preliminary Report on Patentability.
PCT/US2019/036285, Sep. 27, 2019, International Search Report and Written Opinion.
PCT/US2019/036285, Dec. 24, 2020, International Preliminary Report on Patentability.
PCT/US2021/015234, May 17, 2021, International Search Report and Written Opinion.
PCT/US2021/015221, May 18, 2021, International Search Report and Written Opinion.

* cited by examiner

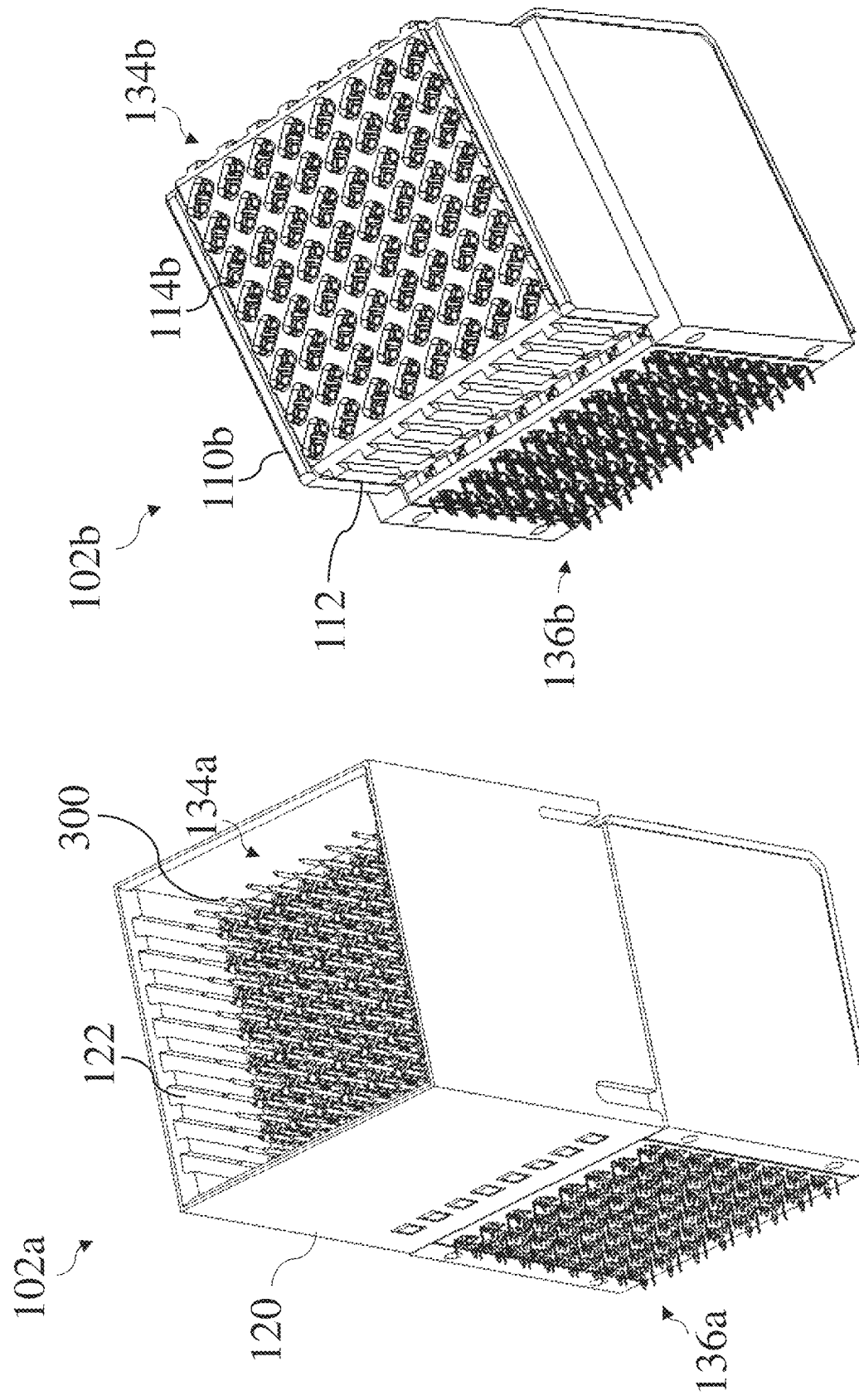

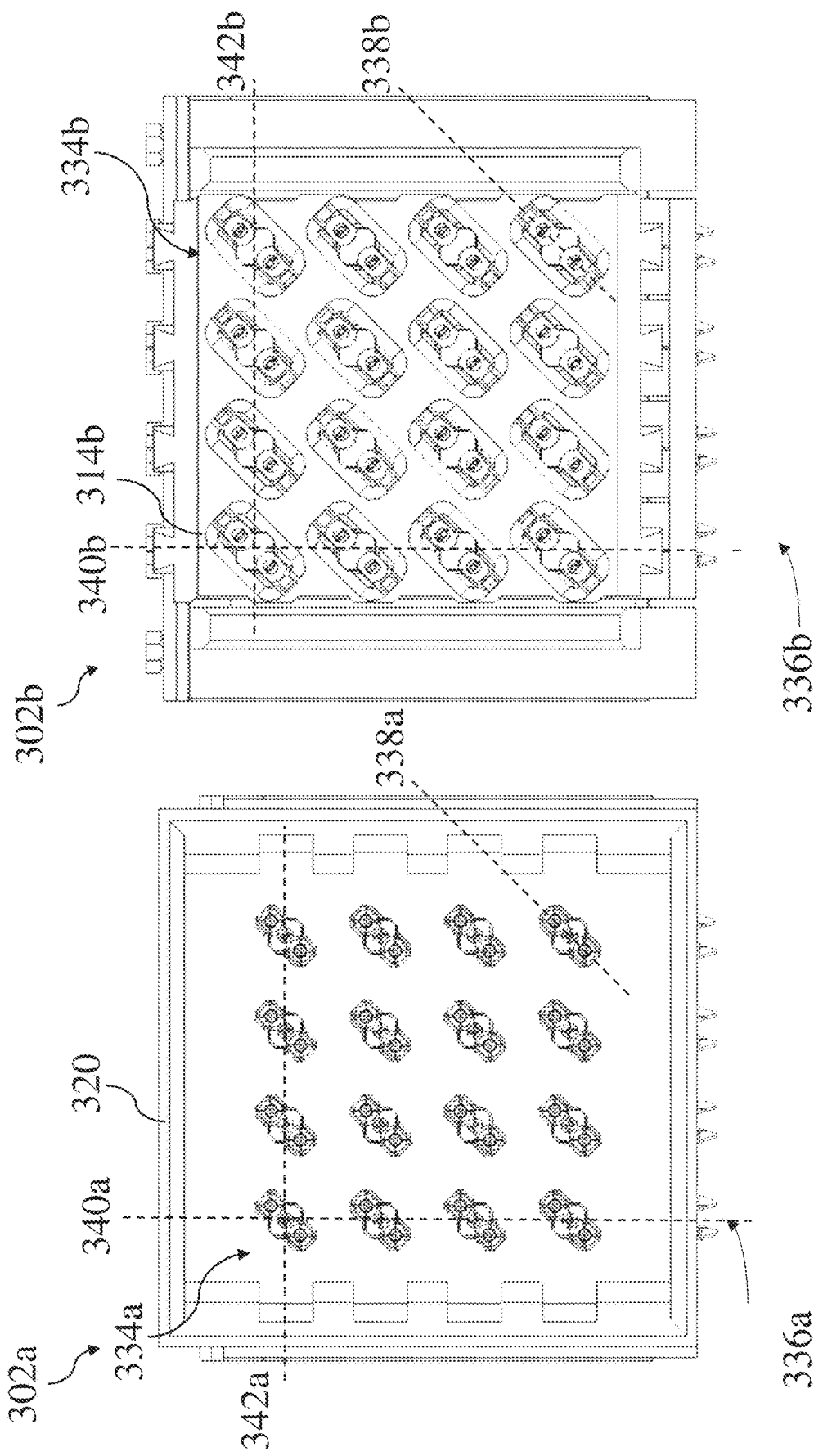

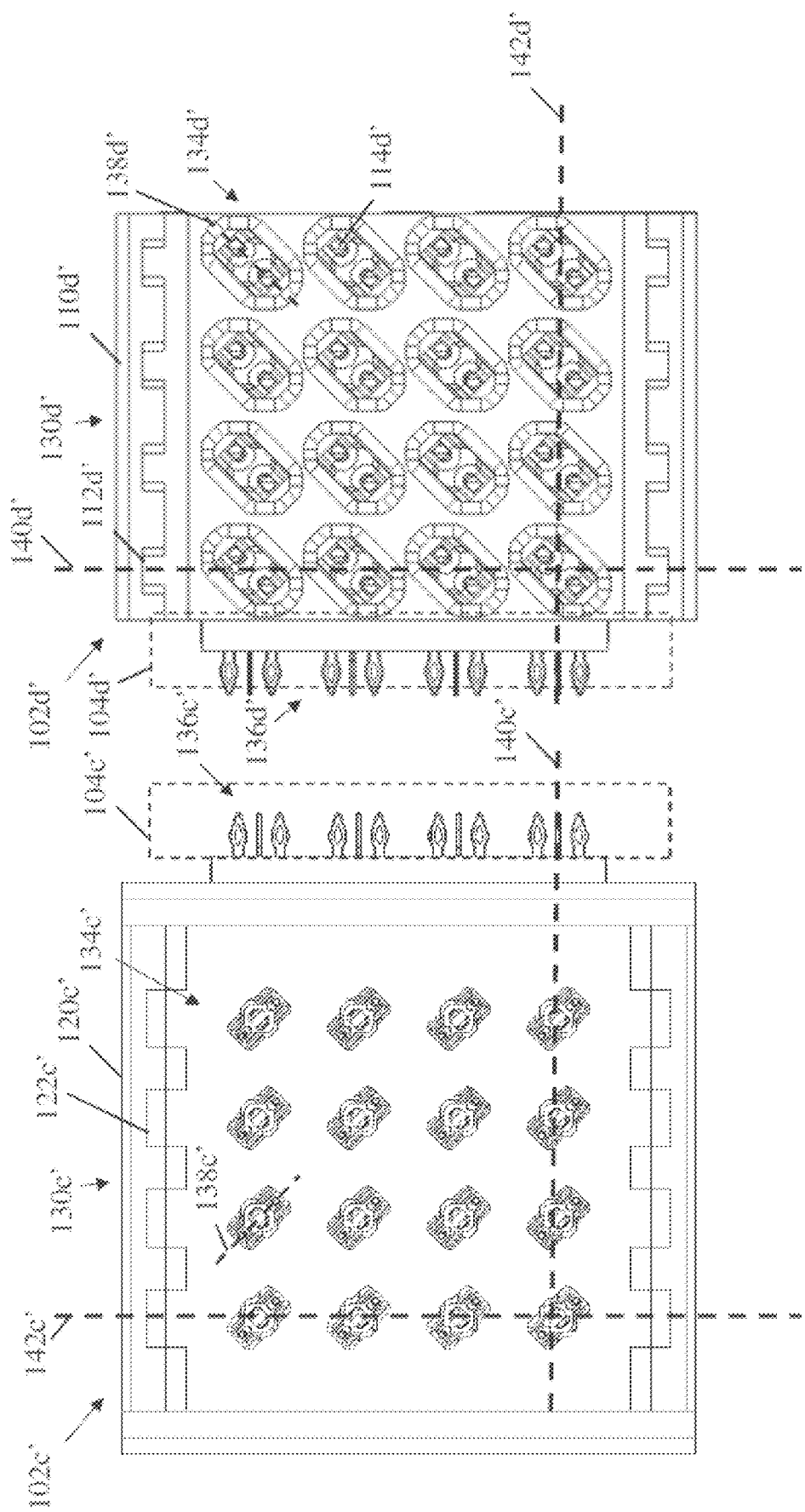

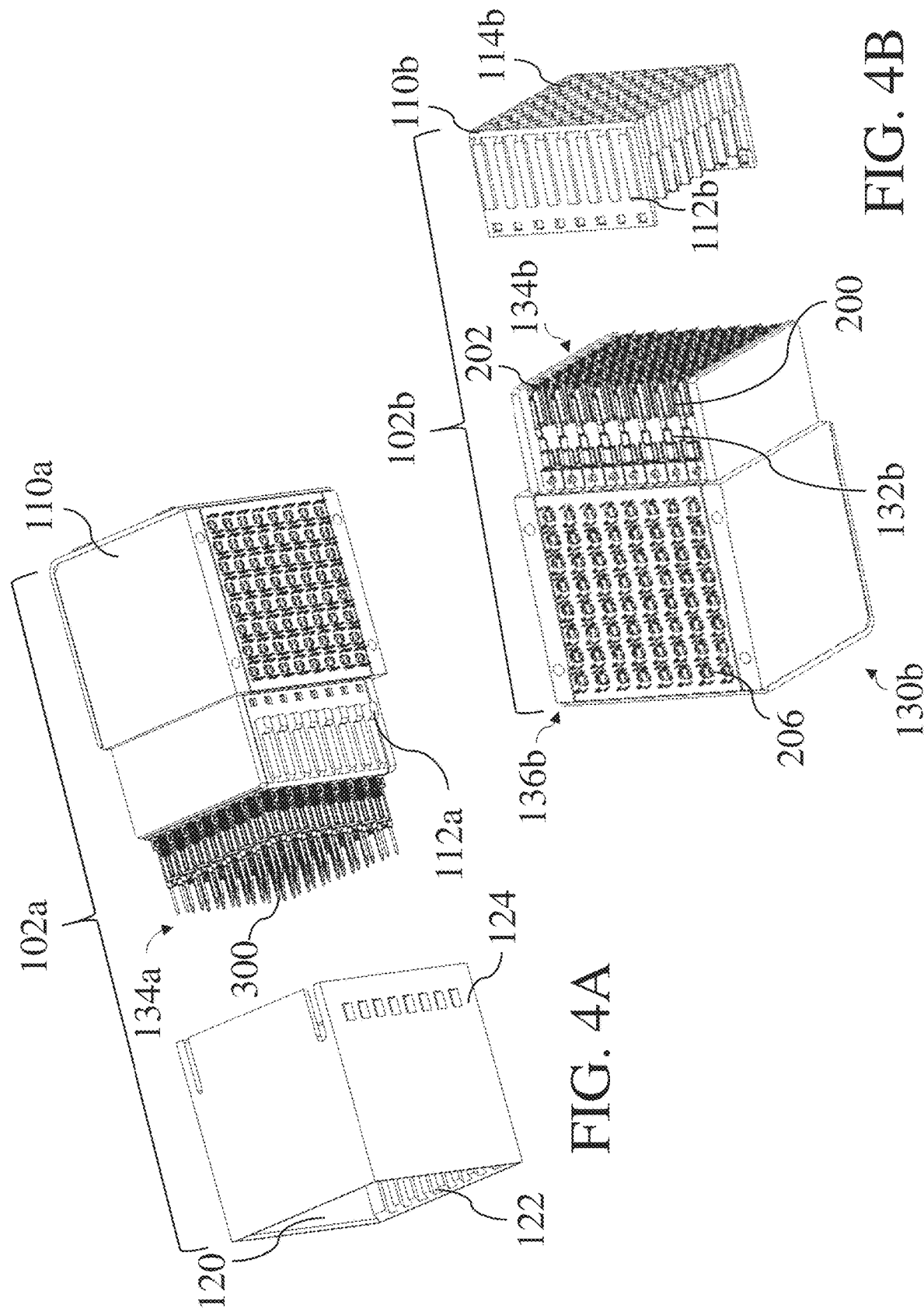

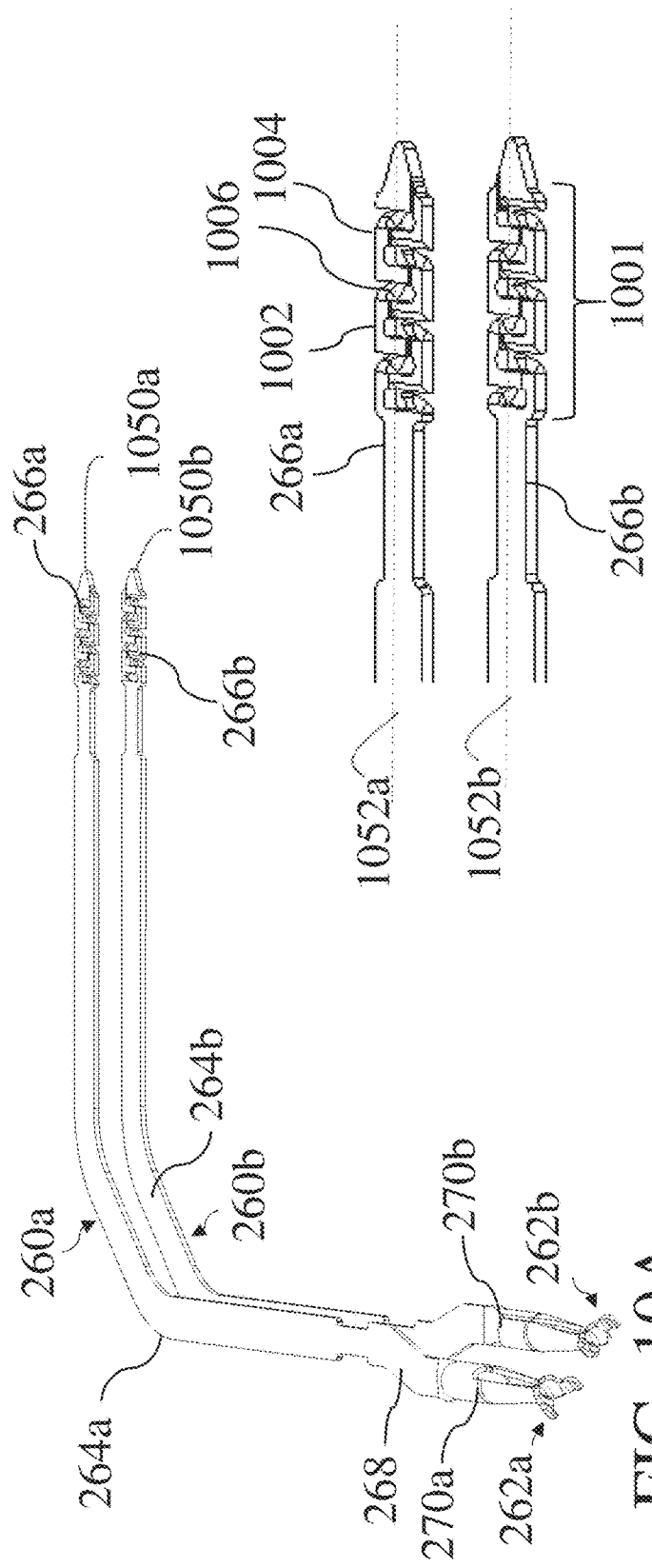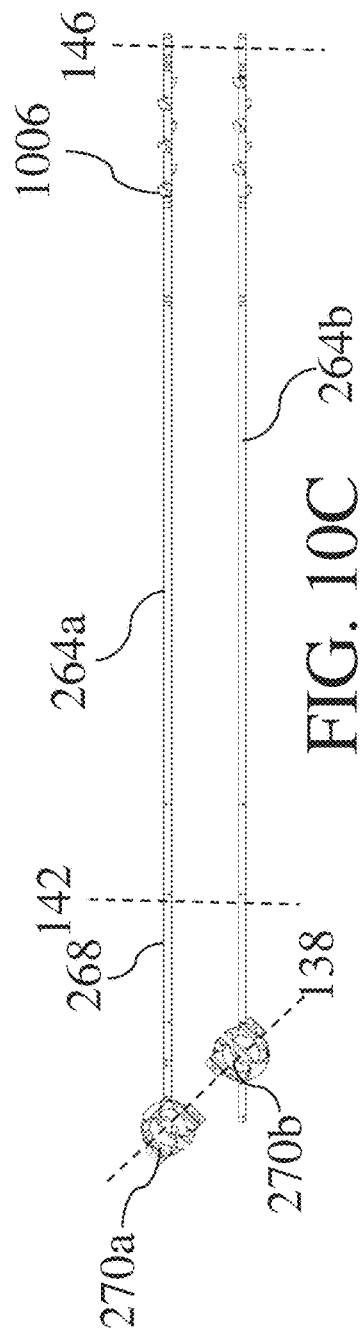
FIG. 10A
FIG. 10B
FIG. 10C

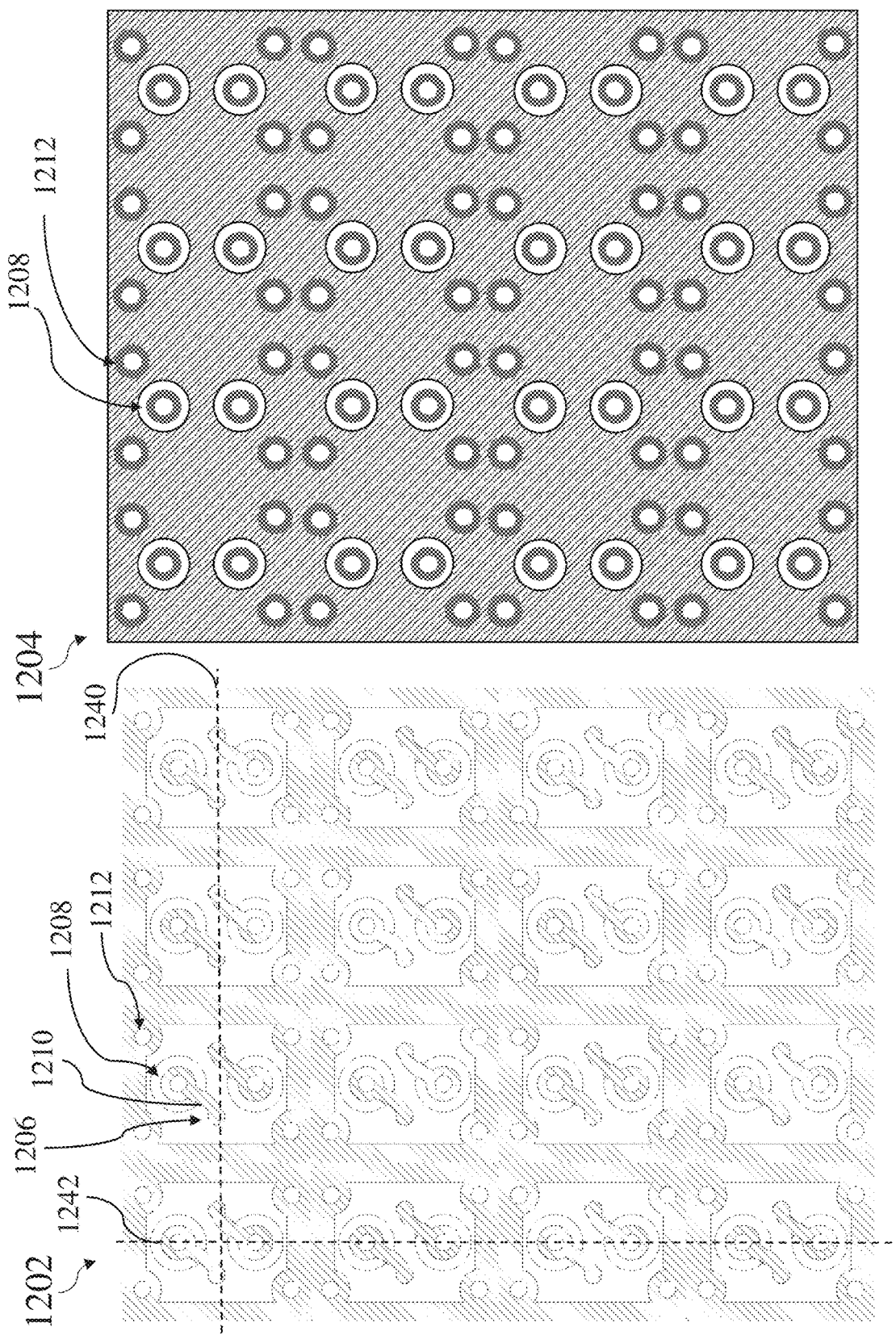

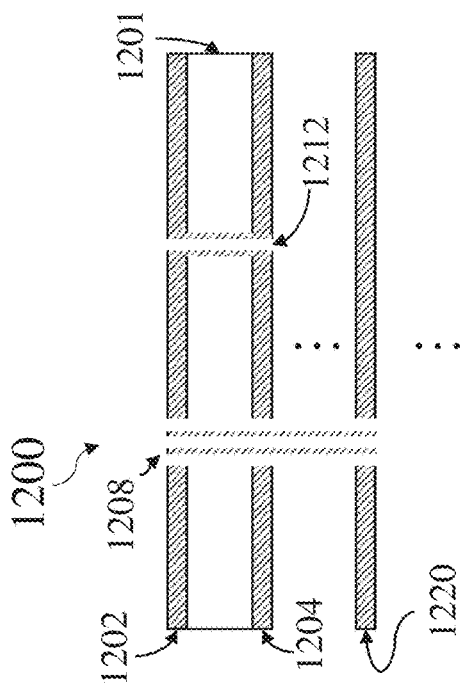
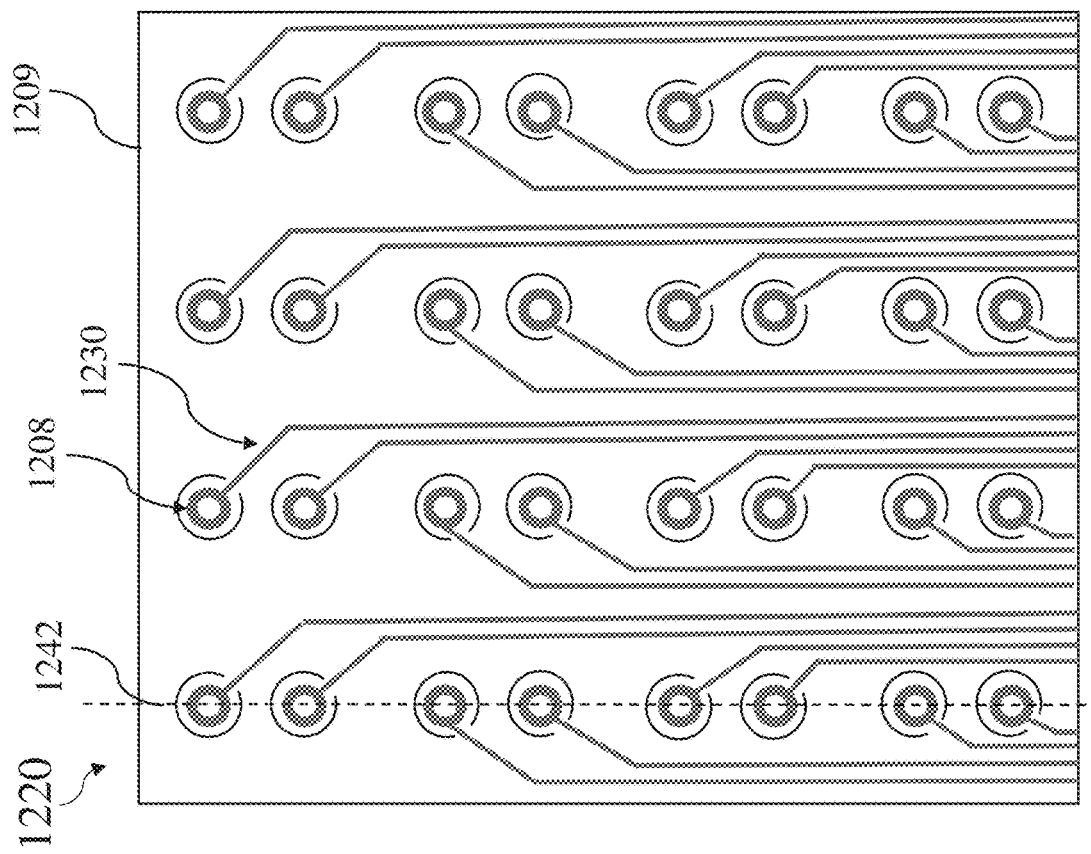
FIG. 12D
FIG. 12C

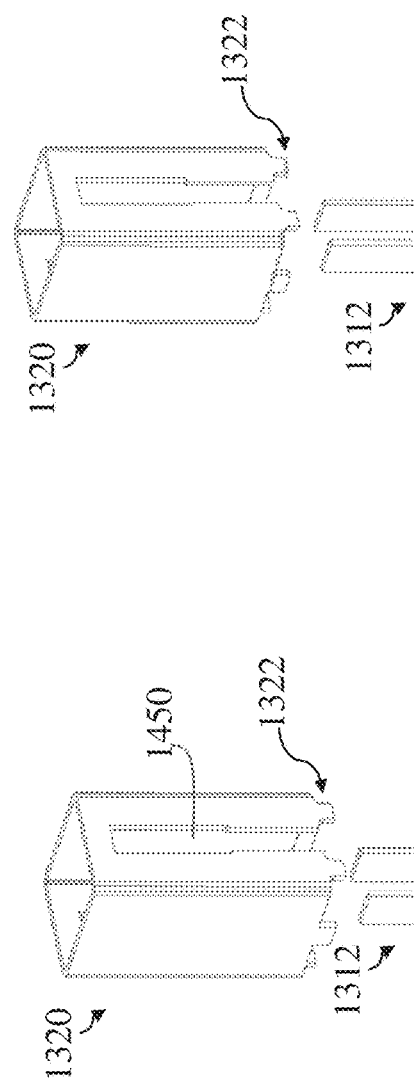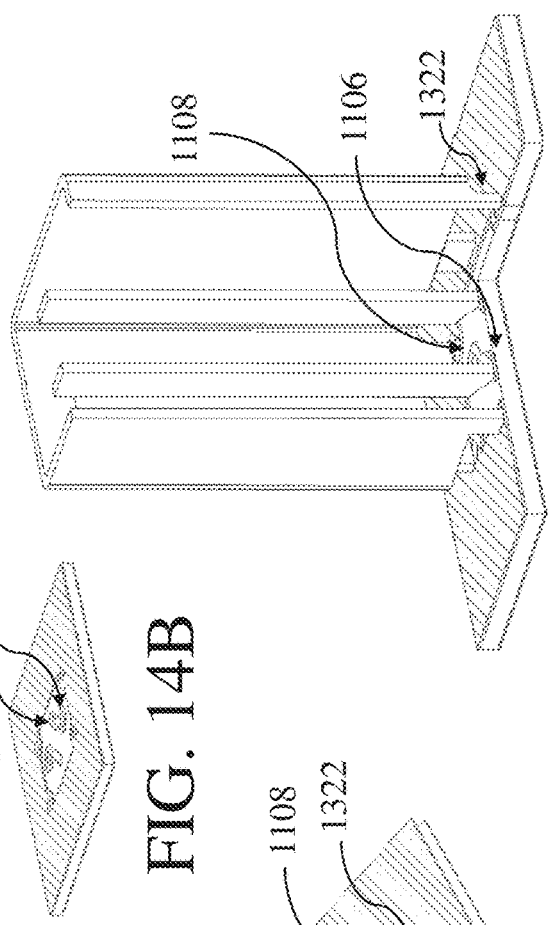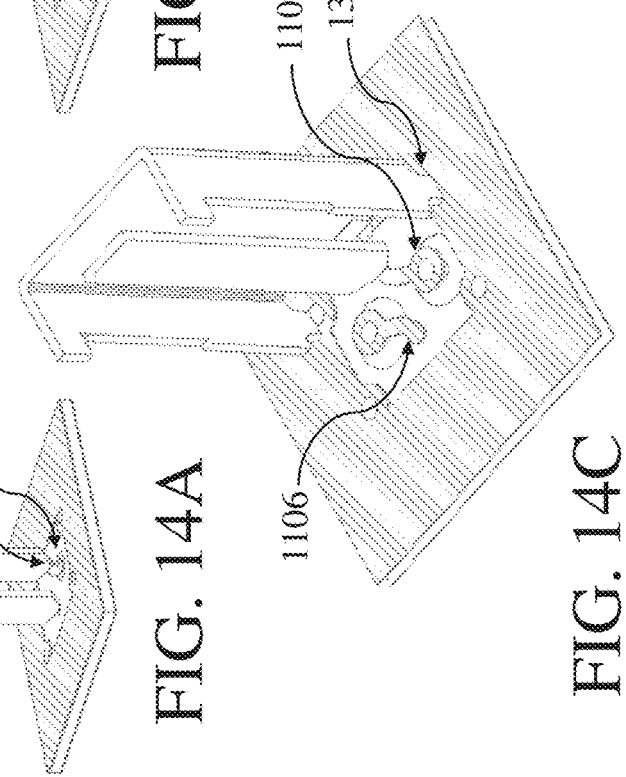
FIG. 14A  FIG. 14B  FIG. 14C  FIG. 14D

ELECTRICAL CONNECTOR WITH HIGH SPEED MOUNTING INTERFACE

CROSS-REFERENCE TO RELATED APPLICATIONS

This application claims the benefit under 35 U.S.C. § 119(e) of U.S. Provisional Patent Application Ser. No. 62/966,508, filed on Jan. 27, 2020, entitled "ELECTRICAL CONNECTOR WITH HIGH SPEED MOUNTING INTERFACE," which is hereby incorporated herein by reference in its entirety.

BACKGROUND

This patent application relates generally to interconnection systems, such as those including electrical connectors, used to interconnect electronic assemblies.

Electrical connectors are used in many electronic systems. It is generally easier and more cost effective to manufacture a system as separate electronic assemblies, such as printed circuit boards ("PCBs"), which may be joined with electrical connectors. A known arrangement for joining several printed circuit boards is to have one printed circuit board serve as a backplane. Other printed circuit boards, called "daughterboards" or "daughtercards," may be connected through the backplane.

A known backplane is a printed circuit board onto which many connectors may be mounted. Conducting traces in the backplane may be electrically connected to signal conductors in the connectors so that signals may be routed between the connectors. Daughtercards may also have connectors mounted thereon. The connectors mounted on a daughtercard may be plugged into the connectors mounted on the backplane. In this way, signals may be routed among the daughtercards through the backplane. The daughtercards may plug into the backplane at a right angle. The connectors used for these applications may therefore include a right angle bend and are often called "right angle connectors."

Connectors may also be used in other configurations for interconnecting printed circuit boards. Some systems use a midplane configuration. Similar to a backplane, a midplane has connectors mounted on one surface that are interconnected by routing channels within the midplane. The midplane additionally has connectors mounted on a second side so that daughter cards are inserted into both sides of the midplane.

The daughter cards inserted from opposite sides of the midplane often have orthogonal orientations. This orientation positions one edge of each printed circuit board adjacent the edge of every board inserted into the opposite side of the midplane. The traces within the midplane connecting the boards on one side of the midplane to boards on the other side of the midplane can be short, leading to desirable signal integrity properties.

A variation on the midplane configuration is called "direct attach." In this configuration, daughter cards are inserted from opposite sides of the system. These boards likewise are oriented orthogonally so that the edge of a board inserted from one side of the system is adjacent to the edges of the boards inserted from the opposite side of the system. These daughter cards also have connectors. However, rather than plug into connectors on a midplane, the connectors on each daughter card plug directly into connectors on printed circuit boards inserted from the opposite side of the system.

Connectors for this configuration are sometimes called orthogonal connectors. Examples of orthogonal connectors are shown in U.S. Pat. Nos. 7,354,274, 7,331,830, 8,678,860, 8,057,267 and 8,251,745.

BRIEF DESCRIPTION OF DRAWINGS

FIG. 2A is a perspective view of electrical connector 102a of FIG. 1;

FIG. 2B is a perspective view of electrical connector 102b of FIG. 1;

FIG. 3A is a front view of an alternative embodiment of electrical connector 102a of FIG. 1;

FIG. 3B is a front view of an alternative embodiment of electrical connector 102b of FIG. 1, configured to mate with the connector of FIG. 3A;

FIG. 3E is a front view of a further alternative embodiment of electrical connector 102a of FIG. 1;

FIG. 3F is a front view of a further alternative embodiment of electrical connector 102b of FIG. 1;

FIG. 4A is a partially exploded view of electrical connector 102a of FIG. 1;

FIG. 4B is a partially exploded view of electrical connector 102b of FIG. 1;

FIG. 10A is a perspective view of signal conductors 260a and 260b of connector module 200 of FIGS. 9A-9B;

FIG. 10B is an enlarged view of compliant portions 266 of signal conductors 260a and 260b as shown in FIG. 10A;

FIG. 10C is a front view of signal conductors 260a and 260b of FIG. 10A;

FIG. 12A is a top view of a conductive layer 1202 of a substrate 1200 having a connector footprint, according to some embodiments;

FIG. 12B is a top view of an interior layer 1204 of substrate 1200 of FIG. 12A;

FIG. 12C is a top view of a signal routing conductive layer 1220 of substrate 1200 of FIG. 12;

FIG. 12D is a cross-sectional view of a portion of substrate 1200 of FIG. 12A;

FIG. 14A is a partially exploded view of the electronic assembly 1300 of FIG. 13A further illustrating a shielding member of the electrical connector;

FIG. 14B is an exploded view of the electronic assembly 1300 of FIG. 14A;

FIG. 14C is a perspective view of the electronic assembly 1300 of FIG. 14A with one contact tail 1312 and half of the shielding member 1320 cut away;

FIG. 14D is a perspective view of the electronic assembly 1300 of FIG. 14A with half of each contact tail 1312 and part of the shielding member 1320 cut away

FIG. 21B is a side view of compliant portion 1766a of signal conductor 1760a;

DETAILED DESCRIPTION

Figure 1:
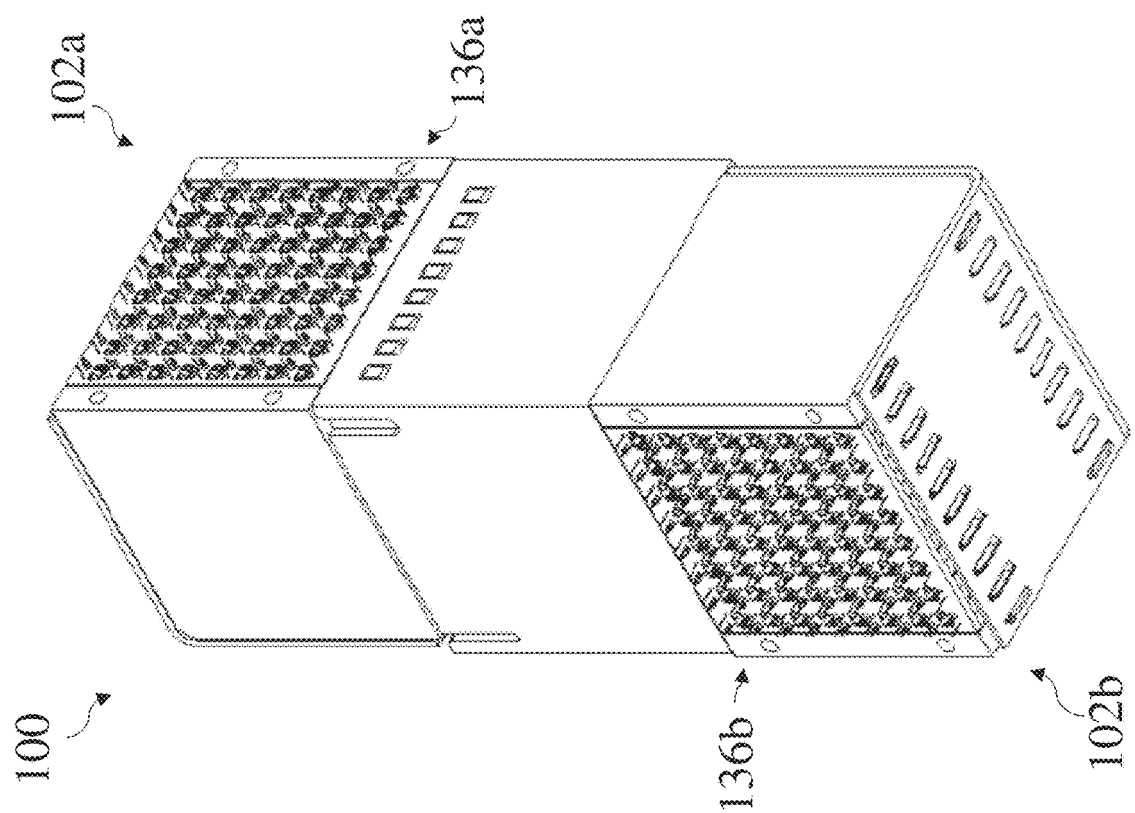
FIG. 1 is a perspective view of mated, direct attach orthogonal connectors, in accordance with some embodiments.

The inventors have developed techniques for making electrical connectors and electronic assemblies capable of supporting high speed signals and having high density, including at 112 Gb/s and higher. These techniques include designs for a mounting interface of the connector that enable operation at high frequencies without resonances or other degradation of signal integrity. The mounting interface may be used in a connector with individually shielded modules with a pair of signal conductors, providing low crosstalk and good impedance control. In some embodiments, the connector footprint of a printed circuit board may be integrated with the connector mounting interface to provide a compact footprint and efficient routing channels with low mode conversion, which the inventors have recognized and appreciated can limit the operating range of an interconnection system.

In some embodiments, signal conductors of the connector may be connected at their distal edges to pads on a surface of a substrate, an example of which is a printed circuit board (PCB). In some embodiments, the signal conductors may be pressure mounted to a PCB. The signal conductors may have compliant portions extending perpendicular to the surface of the printed circuit board such that, upon pressing the connector against the PCB, the signal conductors compress, with the compliant portions generating a spring force that presses the edges of the signal conductors against the pads.

The signal conductors may be shaped to reliably form an edge-to-pad pressure mount connection. In some embodiments, for example, the distal ends of the signal conductors may be pointed, or otherwise form a tip that can break through an oxide layer or other contaminants on the pad. Alternatively or additionally, the signal conductors may be configured to twist as they are compressed. Twisting may further aid in breaking through oxide or other contaminants on the pad.

In some embodiments, an edge-to-pad connection may be made using surface mount soldering techniques.

In some embodiments, signal conductors of the connector may be configured to carry differential signals. Pairs of signal conductors may pass through the connector with the intermediate portions of the signal conductors arranged for broadside coupling. Broadside coupling in a right angle connector may provide for low skew interconnects when the signal conductors of a pair are aligned in a row direction parallel to an edge of a PCB at which the connector is mounted.

As changes in geometry along a signal path may contribute to changes in impedance, mode conversion, or other artifacts that degrade signal integrity, high signal integrity may be achieved with mounting ends of the signal conductors aligned with intermediate portions of the signal conductors adjacent the mounting interface. Edge-to-pad mounting onto pads of a PCB that are similarly aligned with those intermediate portions of the signal conductors avoids changes in geometry along the signal path and similarly promotes signal integrity.

Despite positioning of the pads on the PCB for a connector footprint to align with signal conductors within a connector, signal vias connecting those pads to traces within the PCB may be positioned to enable efficient routing of those traces out of the connector footprint. The inventors have recognized and appreciated techniques to provide good signal integrity, even at high frequencies, and efficient routing, which contributes to cost-effective design of an electronic system using the connector. An appropriate transition region within the PCB may enable the pads, positioned to align with signal conductors of the connector, to connect with vias positioned for efficient routing of signal traces in the PCB, while providing good signal integrity.

The transition region may include pairs of pads aligned in a first line and pairs of vias aligned in a second line. The first line may be transverse to the second line. In some embodiments, the first line and the second line may be orthogonal, supporting broadside coupling within the connector and vertical routing channels within the PCB. The pads and vias may be connected with surface traces. An underlying conductive layer of the PCB may be connected to ground, which may provide a ground plane under the surface traces. A ground plane in that location may provide low mode conversion and other desirable signal integrity characteristics at the transition.

As a result, the pairs of signal vias may be aligned in a column direction, supporting vertical routing of signal traces out of the connector footprint, even if the signal conductors of the corresponding pairs within the connector are aligned in a row direction. Moreover, as the signal vias do not receive press-fits, they can be small, such as less than 12 mils in diameter, for example. Small diameter vias enable wide routing channels, which enable more traces per layer to be routed out of the connector footprint, and reduce the number of layers required to route all signals out of the connector footprint. Such a design provides both efficient routing of traces and high signal integrity.

These techniques may be used separately or together, in any suitable combination. As a result of improved electrical properties achieved by these techniques, electrical connectors and electronic assemblies described herein may be configured to operate with high bandwidth for a high data transmission rate. For example, electrical connectors and electronic assemblies described herein may operate at 40 GHz or above and may have a bandwidth of at least 50 GHz, such as a frequency up to and including 56 GHz and/or bandwidth in the range of 50-60 GHz. Such electrical connectors and electronic assemblies may pass data at rates up to 112 Gb/s, for example.

Turning to the figures, FIGS. 1 and 2A-B illustrate electrical connectors of an electrical interconnect system in accordance with some embodiments. FIG. 1 is a perspective view of electrical interconnect system 100 including first and second mated connectors, here configured as direct attach orthogonal connector 102a and right angle connector 102b. FIG. 2A is a perspective view of electrical connector 102a, and FIG. 2B is a perspective view of electrical connector 102b, showing mating interfaces and mounting interfaces of those connectors. In the embodiment illustrated, the mating interfaces are complementary such that connector 102a mates with connector 102b. The mounting interfaces, in the embodiment illustrated, are similar, as each comprises an array of press-fit contact tails configured for mounting to a printed circuit board. In alternative embodiments, some or all of the contact tails of connectors 102a and 102b may be configured for edge-to-pad mounting, such as through pressure mounting to conductive pads on a surface of a substrate. Alternatively or additionally, some or all of the contact tails may be configured for soldering to conductive pads of a substrate using butt joints. These alternative tail configurations may be used for signal conductors of either or both of the connectors, while the contact tails of the connector shields may be press-fits.

In the illustrated example, each of the connectors is a right angle connector, and each may have broadside coupled pairs of signal conductors with conductors of the pairs aligned in a row direction for low intra-pair skew. Each of the pairs may be partially or wholly surrounded by a shield. Electrical connectors 102a and 102b may be manufactured using similar techniques and materials. For example, electrical connector 102a and 102b may include wafers 130 (FIGS. 4A, 5, 6A-6B) that are substantially the same. Electrical connectors 102a and 102b having wafers 130 that may be manufactured and/or assembled in a same process may have a low manufacturing cost.

In the embodiment illustrated in FIG. 1, first connector 102a includes first wafers 130a, including one or more individual wafers 130 positioned side-by-side. Wafers 130 include one or more connector modules 200, each of which may include a pair of signal conductors and shielding for that pair. Connector modules are described further herein, including with reference to FIG. 10B.

Wafers 130 also include wafer housings 132a that hold the connector modules 200. The wafers are held together, side-by-side, such that contact tails extending from the wafers 130 of first connector 102a form first contact tail array 136a. Contact tails of first contact tail array 136a may be configured for mounting to a substrate, such as substrate 1100 or 1200 described herein including with reference to FIGS. 11A-11C and 12A-12D. In some embodiments, contact tail array 136 may be configured to compress in a direction in which electrical connector 102a is pressed for mounting to a substrate. First contact tail array 136a may include contact tails configured for press-fit insertion. Alternatively or additionally, some or all of the contact tails may be configured for pressure mount or surface mount soldering. In other embodiments, some or all of the contact tails may have other mounting configurations, either for mounting to a printed circuit board or to conductors within an electrical cable.

In the illustrated embodiment, first connector 102a includes extender housing 120, within which are extender modules 300, described further herein including with reference to FIG. 2A. In the illustrated embodiment, first connector 102a includes signal conductors that have contact tails forming a portion of first contact tail array 136a. The signal conductors have intermediate portions joining the contact tails to mating ends. In the illustrated embodiment, the mating ends are configured to mate with further signal conductors in the extender modules 300. In some embodiments, there may be separable interfaces to extender modules 300. In other embodiments, that interface may be configured for a single mating, without unmating and re-mating. The signal conductors in extender modules 300 likewise have mating ends, which form the mating interface of connector 102a visible in FIG. 2A. Ground conductors similarly extend from wafers 130a, through the extender modules 300, to the mating interface of connector 102a visible in FIG. 2A.

Second connector 102b includes second wafers 130b, including one or more wafers 130 positioned side-by-side. Wafers 130 of second wafers 130b may be configured as described for first wafers 130a. For example, wafers 130 of second wafers 130b have wafer housings 132b. Additionally, second contact tail array 136b of second connector 102b is formed of contact tails of conductive elements within second wafers 130b. As with first contact tail array 136a, some or all of the contact tails of second contact tail array 136b may be configured to compress in a direction in which electrical connector 102b is pressed for mounting to a substrate. Alternatively or additionally, some or all of the contact tails of contact tail array 136b may be configured for press-fit insertion, compression mount, solder mount, or any other mounting configuration, either for mounting to a printed circuit board or to conductors within an electrical cable.

As shown in FIG. 1, first contact tail array 136a faces a first direction and second contact tail array 136b faces a second direction perpendicular to the first direction. Thus, when first contact tail array 136a is mounted to a first substrate (such as a printed circuit board) and second contact tail array 136b is mounted to a second substrate, surfaces of the first and second substrates may be perpendicular to one another. Additionally, first connector 102a and second connector 102b mate along a third direction perpendicular to each of the first and second directions. During the process of mating first connector 102a with second connector 102b, one or both of first and second connectors 102a and 102b move towards the other connector along the third direction.

Figure 15:
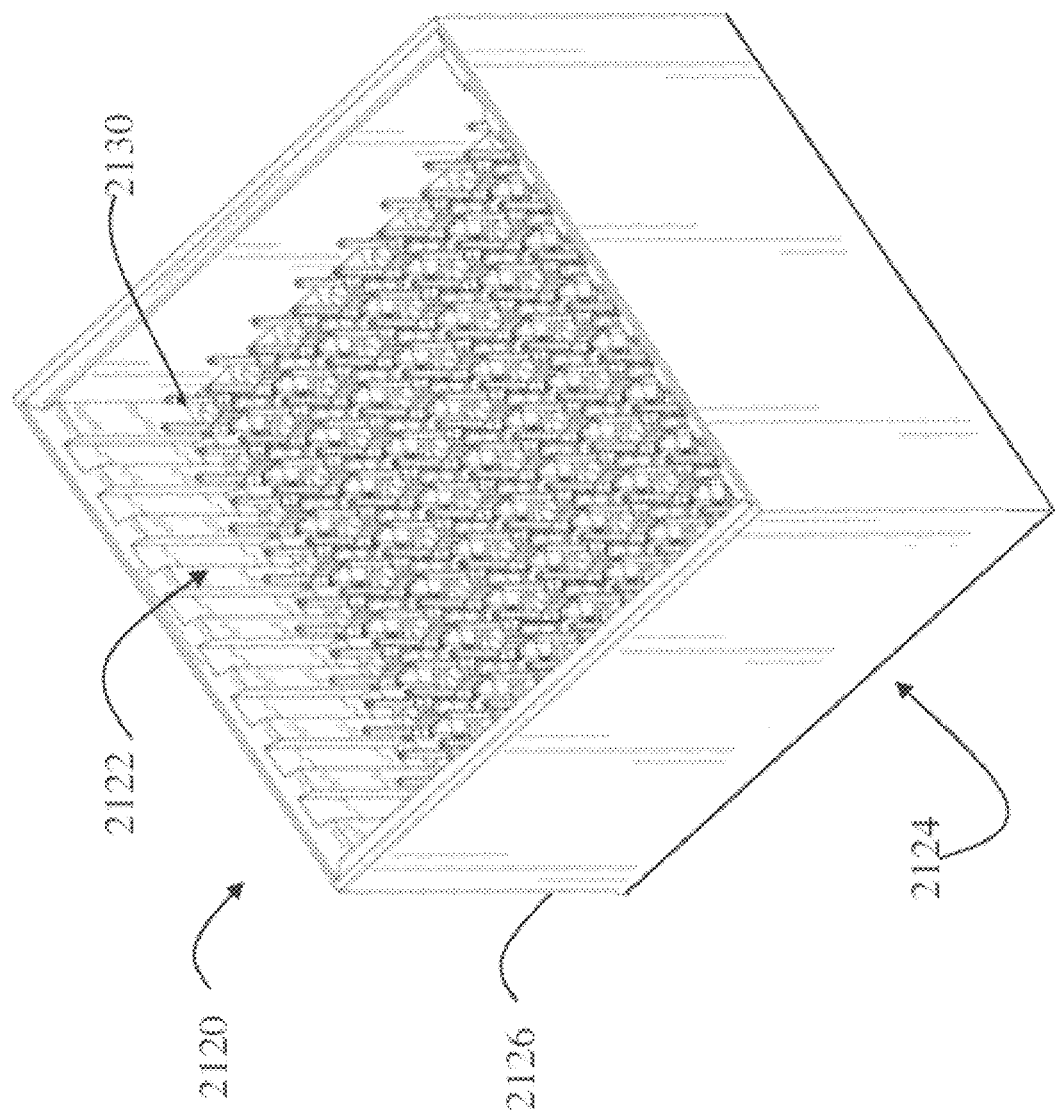
FIG. 15 is a perspective view of a header connector.
Figure 16:
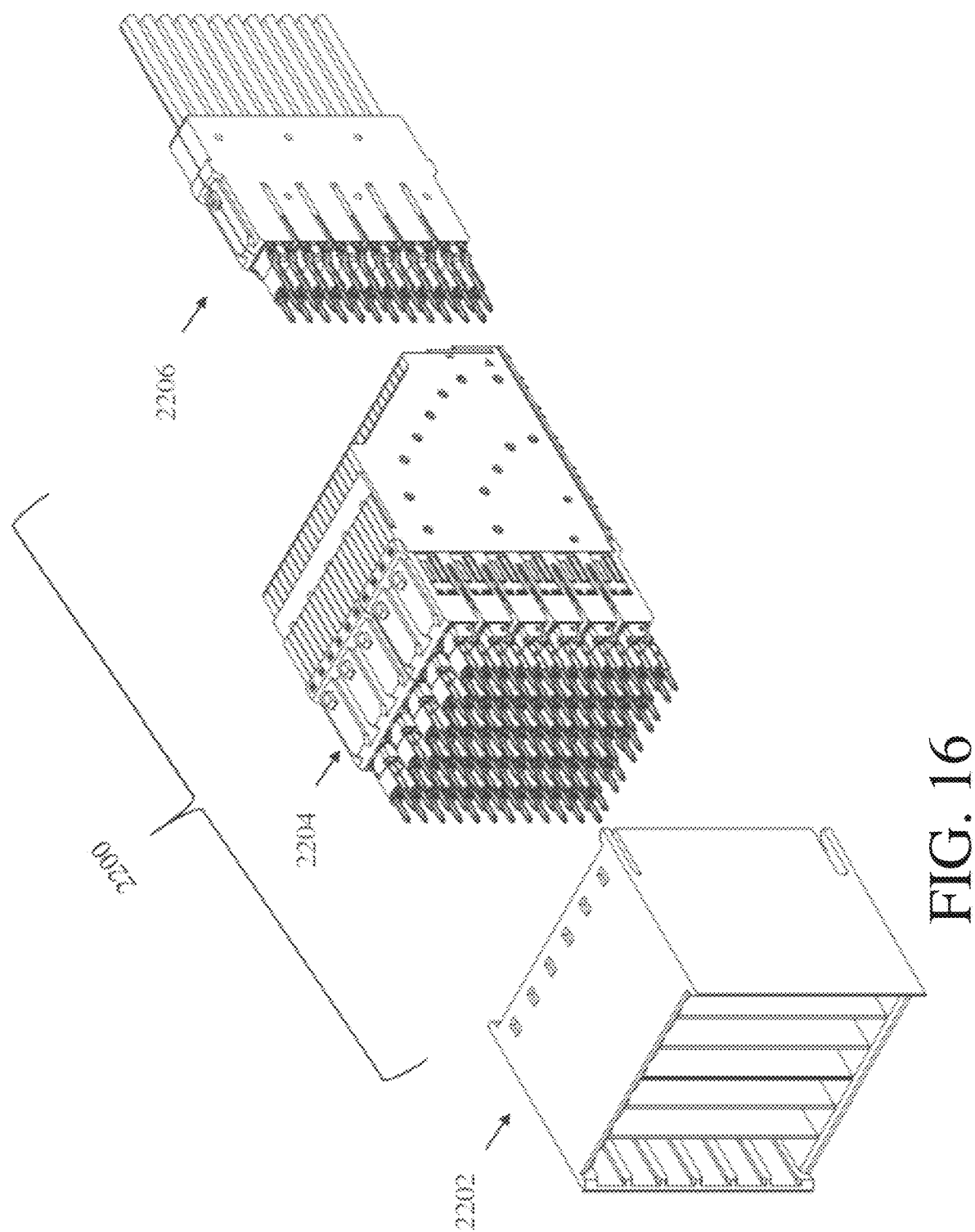
FIG. 16 is a perspective view of an alternative configuration of a connector in which some connector modules are configured for attachment to a printed circuit board and other connector modules are terminated to a cable.

It should be appreciated that, while first and second electrical connectors 102a and 102b are shown in a direct attach orthogonal configuration in FIG. 1, connectors described herein may be adapted for other configurations. For example, connectors illustrated in FIGS. 3E to 3F have mating interfaces angled in opposite directions and may be used for a co-planar configuration. FIG. 15 illustrates that construction techniques as described herein may be used in a backplane, midplane, or mezzanine configuration. However, it is not a requirement that the mating interface be used in board to board configuration. FIG. 16 illustrates that some or all of the signal conductor's within a connector may be terminated to cables, creating a cable connector or hybrid cable connector. Other configurations are also possible.

As shown in FIG. 2A, first electrical connector 102a includes extender modules 300, which provide a mating interface for first connector 102a. For example, mating portions of extender modules 300 form first mating end array 134a. Additionally, extender modules 300 may be mounted to connector modules 200 of first wafers 130a. Extender housing 120 holds extender modules 300, surrounding at least a portion of the extender modules 300. Here, extender housing 120 surrounds the mating interface and includes grooves 122 for receiving second connector 102b. Extender housing 120 may also include apertures through which extender modules 300 extend.

As shown in FIG. 2B, second electrical connector 102b has a front housing 110b shaped to fit within an opening in extender housing 120. Second wafers 130b are attached to front housing 110b, as described further herein, including with reference to FIG. 4B.

Front housing 110b provides a mating interface for second connector 102b. For example, front housing 110b includes projections 112 which are configured to be received in grooves of extender housing 120. Mating ends of signal conductors of wafers 130b are exposed within apertures 114b of front housing 110b, forming second mating end array 134b, such that the mating ends may engage with signal conductors of the wafers 130a of first connector 102a. For example, extender modules 300 extend from first connector 102a and may be received by the pairs of signal conductors of second connector 102b. Ground conductors of wafers 130b are similarly exposed within apertures 114b and may similarly mate with ground conductors in the extender modules 300, which in turn are connected to ground conductors in wafers 130a.

In FIGS. 2A-B, first connector 102a is configured to receive second connector 102b. As illustrated, grooves 122 of extender housing 120 are configured to receive projections 112 of front housing 110b. Additionally, apertures 114b are configured to receive mating portions of extender modules 300.

It should be appreciated that first wafers 130a of first connector 102a and second wafers 130b of second connector 102b may be substantially identical, in some embodiments. For example, first connector 102a may include front housing 110a, which may receive wafers from one side, and which may be configured similarly to a corresponding side of front housing 110b. An opposite side of front housing 110a may be configured for attachment to extender housing 120 such that front housing 110a is disposed between first wafers 130a and extender housing 120. Front housing 110a is described further herein, including with reference to FIG. 4.

Front housing 110b may be configured to mate with extender housing 120. In some embodiments, extender housing 120 may be configured such that features that might latch to features if inserted into one side of extender housing 120 would slide in an out, to support separable mating, if inserted in an opposite side of extender housing 120. In such a configuration the same component could be used for front housing 110a or front housing 110b. Using extender modules to interface between identical connectors allows for manufacturing of a single type of connector to be used on each side of an electrical interconnect system, thus reducing a cost of producing the electrical interconnect system. Even if front housing 110a and front housing 110b are shaped differently to support either a fixed attachment to extender housing 120 or a sliding engagement to extender housing 120, efficiencies are achieved by using wafers that can be made with the same tooling in both connectors 102a and 102b. Similar efficiencies may be achieved in other configurations, for example, if front housing 110a and extender housing 120 are made as a single component.

Electrical connectors as described herein may be formed with different numbers of signal conductors than shown in FIGS. 2A and 2B. FIG. 3A is a front view of third electrical connector 302a having extender housing 320, in accordance with an alternative embodiment. Although third electrical connector 302a is illustrated having fewer signal pairs than first electrical connector 102a, third electrical connector 302a may be otherwise assembled using components as described with reference to first electrical connector 102a. For example, electrical connector 302a may be assembled from extender housing 320a and third wafers 330a having third mating end array 334a and third contact tail array 336a, which may be configured in the manner described herein with reference to extender housing 120, first wafers 130a, first mating end array 134a, and first contact tail array 136a.

In some embodiments, third connector 302a may be a right angle connector configured for mounting adjacent an edge of a substrate, such as substrate 1100 or 1200 described herein including with reference to FIGS. 11A-11C and 12A-12D. In the illustrated embodiment of FIG. 3A, pairs of contact tails of third contact tail array 336a may be configured for mounting to a substrate. In some embodiments, contact tails of third contact tail array 336a are configured for inserting into holes (e.g., plated vias) in a substrate. In some embodiments, some or all of the contact tails of third contact tail array 336a are configured for connecting to conductive pads of a substrate in an edge-to-pad configuration, such as using surface mount soldering techniques, and/or using butt joints. Alternatively or additionally, some or all of the contact tails may support pressure mount contacts. Contact tails configured for pressure mounting may extend between 6 and 12 mils from the housing of connector 302a, or from an organizer of the housing and may be pushed back into the housing when the housing is pressed against a substrate for mounting, generating a spring force for pressure mounting.

In the illustrated embodiment, pairs of mating ends of third mating end array 334a are connected along parallel lines 338a and are disposed at a 45 degree angle relative to each of mating column direction 340a and mating row direction 342a.

FIG. 3B is a front view of fourth electrical connector 302b configured to mate with third connector 302a illustrated in FIG. 3A. Although fourth electrical connector 302b is illustrated having fewer signal pairs than second electrical connector 102b, fourth electrical connector 302b may be otherwise configured in the manner described with reference to second electrical connector 302b. For example, electrical connector 302b may be assembled from front housing 310b and fourth wafers 330b having fourth mating end array 334b and fourth contact tail array 336b. These components may be configured in the manner described herein with reference to front housing 110b, second wafers 130b, second mating end array 134b, and second contact tail array 136b.

In FIG. 3B, fourth electrical connector 302b also may be configured for mounting to a substrate. In some embodiments, fourth connector 302b comprises an edge connector configured for mounting adjacent an edge of a substrate (e.g., a printed circuit board). Contact tails of fourth contact tail array 336b may be configured for mounting to the substrate. In some embodiments, contact tails of fourth contact tail array 336b may be configured for inserting into holes in a (e.g., plated vias). In some embodiments, some or all of the contact tails of fourth contact tail array 336b may be configured for connecting to pads of a substrate in an edge-to-pad configuration, such as by surface mount soldering Alternatively or additionally, some or all of the contact tails may support pressure mount contacts.

Front housing 310b includes apertures 314b in which mating ends of pairs of signal conductors of fourth wafers 330b are positioned, enabling signal conductors from connector 302a inserted into apertures 314b to mate with the signal conductors of fourth wafers 330b. Ground conductors of fourth wafers 330b are similarly exposed within apertures 314b for mating with ground conductors from connector 302a.

Fourth mating end array 334b comprises rows extending along row direction 342b and spaced from each other in column direction 340b perpendicular to row direction 342b. Pairs of mating ends of fourth mating end array 334b are aligned along parallel lines 338b. In the illustrated embodiment, parallel lines 338b are disposed at an angle of 45 degrees relative to row direction 342b.

In the illustrated embodiment, mating ends of signal conductors of the second wafers are connected along parallel lines 338b disposed at a 45 degree angle relative to each of mating column direction 340b and mating row direction 342b.

Figures 3C, 3D:
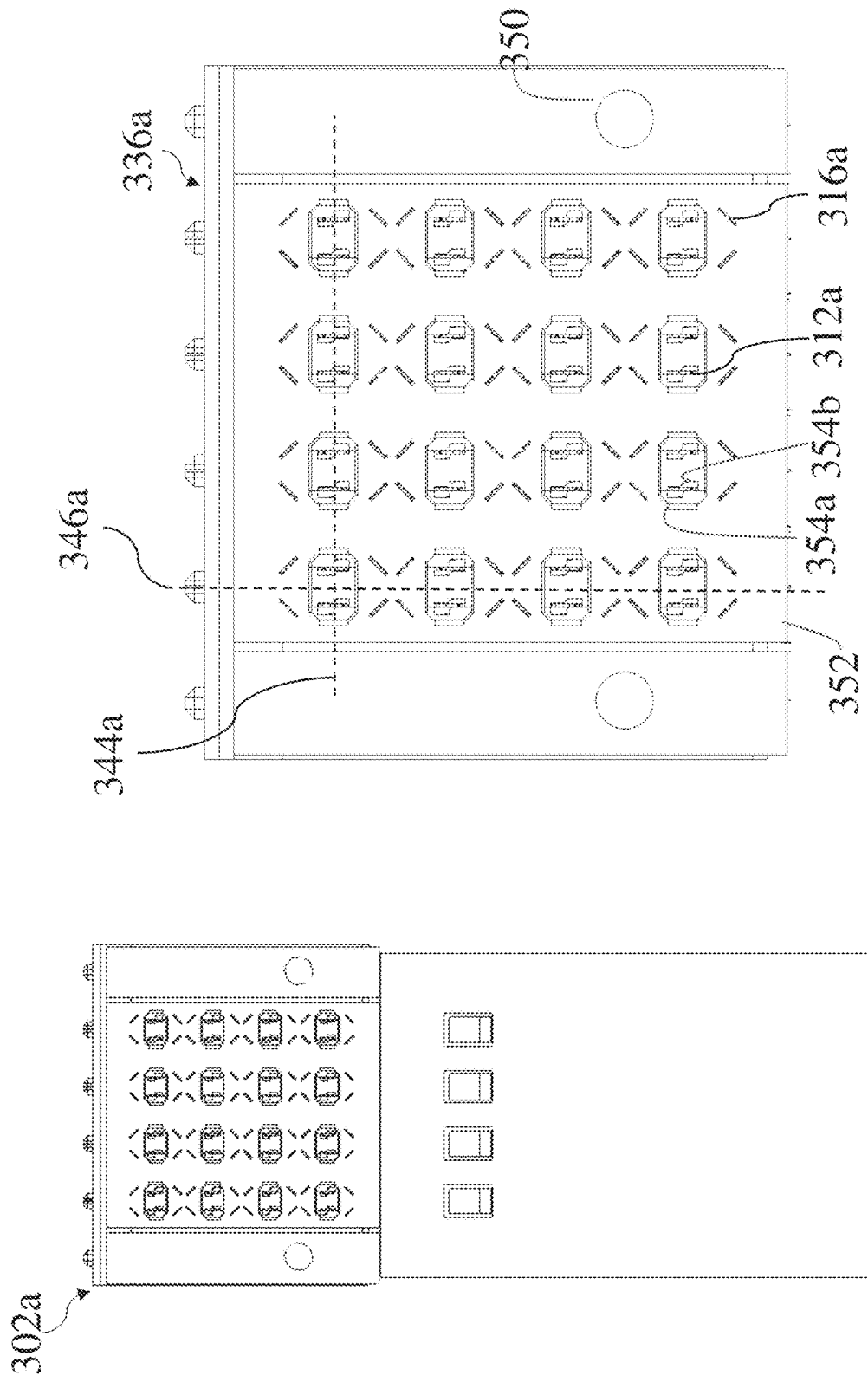
FIG. 3C is a bottom view of electrical connector 302a of FIG. 3A.
FIG. 3D is an enlarged view of the mounting interface of the electrical connector 302a as shown in FIG. 3C.

FIG. 3C is a bottom view of electrical connector 302a of FIG. 3A, and FIG. 3D is an enlarged view of the connector as shown in FIG. 3C. FIGS. 3C-3D illustrate contact tail array 336a of electrical connector 302a, including contact tails 312a, corresponding to signal conductors, and shield contact tails 316a.

Pairs of contact tails 312a are positioned in rows along row direction 344a and columns along column direction 346a. Each pair of contact tails 312a is shown in broadside coupled configuration along row direction 346a. Shielding tails 316a may extend from electromagnetic shielding of the connector modules that include contact tails 312a.

Figures 7A, 7B:
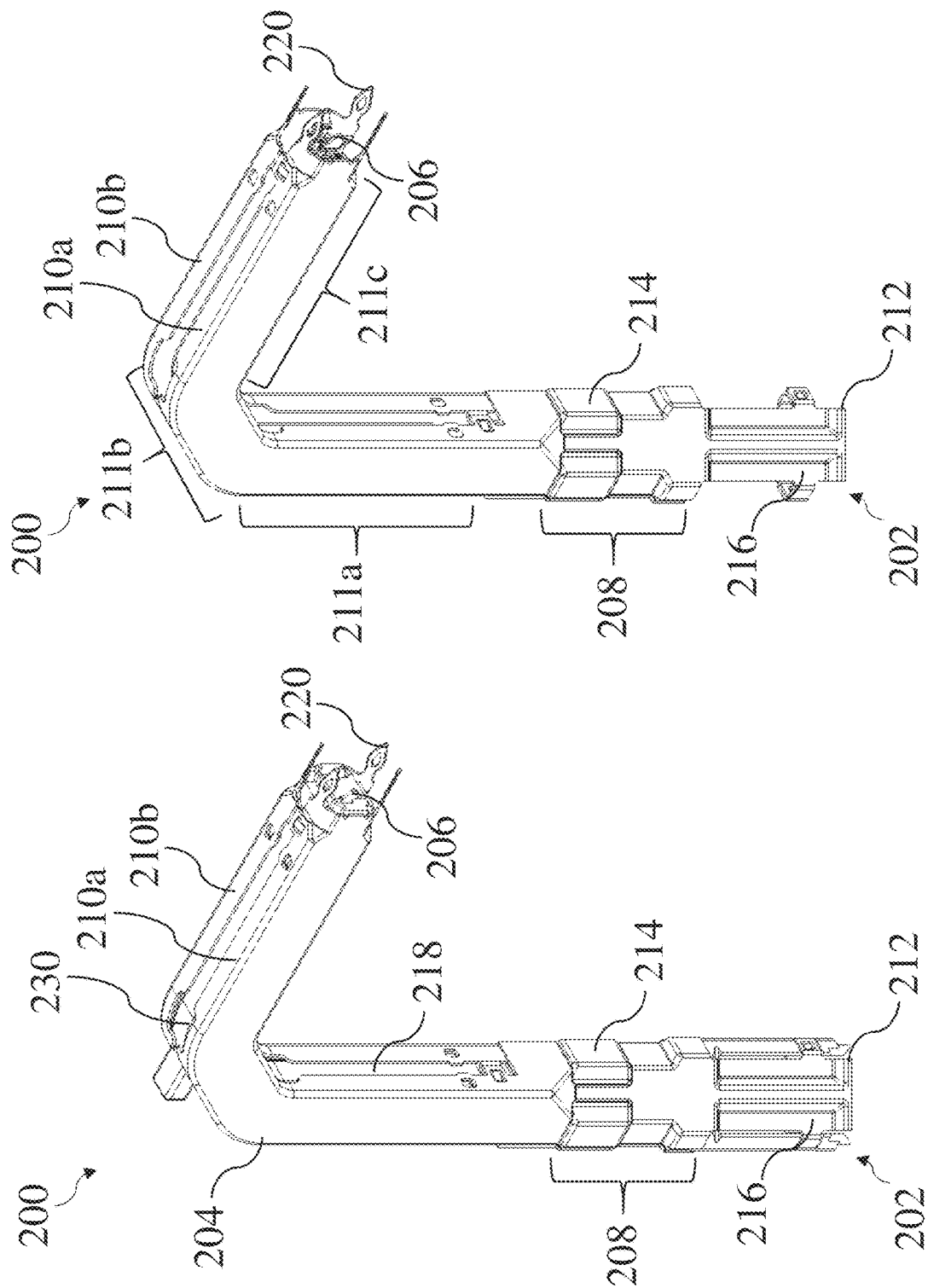
FIG. 7A is a perspective view of connector module 200 of FIG. 6B.
FIG. 7B is a perspective view of connector module 200 of FIG. 6B with outer insulative members 180a and 180b and inner insulative member 230 removed.

Accordingly, shielding tails 316a are also positioned in rows along row direction 344a and columns along column direction 346a. Shielding tails 316a are angularly offset with respect to contact tails 312a. For example, shielding tails 316a are shown positioned at a 45 degree angle with respect to the column and row directions 344a and 346a. In the embodiment illustrated, there are four shielding contact tails 316a for each pair of signal contact tails 312a. Such a configuration corresponds to a connector formed of shielded modules as shown in FIG. 7A, for example. Contact tail array 336a, for example, includes contact tails of an array of such shielded modules. The configuration illustrated in FIGS. 3C and 3D corresponds to a 4×4 array of such modules. Techniques as described herein enable the modules to be closely spaced in the plane of that array. Here, the contact tails of the mounting interface of each module fits in a 2.4 mm×2.4 mm area, enabling the modules to be spaced on a pitch of 2.4 mm or less in both the row and column direction.

As shown, shielding tails 316a comprise press-fit ends configured to compress in a direction perpendicular to the direction in which connector 302a is pressed for mounting to a substrate. For instance, the press-fit ends may be configured to compress upon insertion into a plated via having walls perpendicular to the surface of a PCB to which the connector is mounted such that the press-fit ends exert an outwards force on the walls of the via, both making an electrical connection and providing mechanical retention. Additional retention force may be provide by fasteners or other structures of the connector. For example, a lower face of the connector housings may include holes 350 that receive screws or other fasteners inserted through a PCB to which the connector is mounted. In use, a connector with a mounting interface as shown in FIG. 3D may be mounted on a PCB or other substrate by inserting the shielding tails 316a into vias in the PCB. As a PCB may be made with pads positioned with respect to those vias, inserting the shielding tails 316a of a connector module in the vias may position the module such that the contact tails 312a of the module align with corresponding pads. The press-fits on the shielding tails 316a may provide sufficient retention force to retain the position of the contact tails 312a until fasteners are inserted into holes 350 securing the connector to the PCB. In embodiments in which the contact tails 312a are soldered to the pads, the shielding tails 316a may retain the contact tails 312a in place during soldering.

FIG. 3D illustrates an embodiment in which the contact tails 312a are configured for pressure mounting. Both the signal contact tails 312a and shielding tails 316a extend through a lower surface 352 of the connector, which in this example may be a surface of an organizer or a compliant shield, such as compliant shield 170 described below. The openings through which signal contact tails 312a extend may be shaped to facilitate a pressure mount connection. A contact configured for pressure mount connection may compress and may retract into the connector housing as a connector is mounted to a substrate. Accordingly, the openings may be sufficiently large to enable the contact tip to slide relative to the housing, while nonetheless providing support for the mating end.

In some embodiments, the contact may be configured such that the contact tail rotates as it retracts into the housing. Rotation may aid in breaking the oxide or removing other contaminates on the surface of a pad, and may promote a better electrical connection. The openings may be configured to enable rotation of the contact tail. In the example of FIG. 3D the openings through which the contact tails 312a have a first region 354a at one side of the contact tail and a second region 354b diametrically opposite the region 354a. Such a configuration restrains the contact tail 312a from translation motion relative to a central axis of the contract tail, but enables rotation about that central axis. The regions 354a and 354b may be shaped to enable 5-25 degrees of rotation, such as 10 to 20 degrees.

Similar to connectors 102a and 102b, FIGS. 1-2, FIGS. 3A-3B illustrate connectors 302a and 302b having a direct attach orthogonal configuration. FIGS. 3E-3F illustrate electrical connectors 102c' and 102d' having a co-planar configuration. When connector 102c' is mated with connector 102d', substrate 104c' and substrate 104d' may be co-planar. Substrates 104c' and 104d' on which connectors 102c' and 102d' are mounted may be aligned in parallel. In this example, connectors 102c' and 102d' differ from connectors 102a, 102b, and 302a and 302b in that the mating interfaces of connectors 102c' and 102d' are angled in opposite directions whereas the mating interfaces of connectors 102a, 102b, and 302a and 302b are angled in the same direction. Otherwise, connectors 102c' and 102d' may be constructed in the manner described for connectors 102a, 102b, and 302a and 302b.

Mating end arrays 134c' and 134d' may be adapted for a co-planar configuration. Similar to FIGS. 3A-3B, mating ends of mating end array 134c' are positioned along parallel lines 138c' and mating ends of mating end array 134d' are positioned along parallel lines 138d'. In FIGS. 3E-3F, parallel lines 138c' and 138d' are perpendicular to one another as mating end arrays 134c' and 134d' are shown facing along a same direction. For example, while a same connector may be used on both sides of the direct attach orthogonal configuration shown in FIGS. 3A-3B, variants of a same connector may be used in the co-planar configuration shown in FIGS. 3E-3F.

In some embodiments, a relative position of pairs of mating ends of mating end array 134c' may be rotated 90 degrees with respect to the relative position of pairs of mating ends of mating end array 134d'. In some embodiments, parallel lines 138c' may be disposed at a counter-clockwise angle of 45 degrees (e.g., +45 degrees) relative to mating row direction 142c', and parallel lines 138d' may be disposed at a clockwise angle of 45 degrees (e.g., −45 degrees, or +135 degrees counter-clockwise) relative to mating row direction 142d'. It should be appreciated that, alternatively, parallel lines 138d' may be disposed at a counter-clockwise angle of 45 degrees (e.g., +45 degrees) relative to mating row direction 142d', and parallel lines 138c' may be disposed at a clockwise angle of 45 degrees (e.g., −45 degrees, or +135 degrees counter-clockwise) relative to mating row direction 142c'.

FIGS. 4A and 4B are partially exploded views of electrical connectors 102a and 102b, respectively, of FIGS. 1 and 2A-2B. In this illustrated embodiment of FIG. 4A, extender housing 120 is shown removed from front housing 110a to show front housing 110a and an array of extender modules 300.

In the illustrated embodiment, front housing 110a is attached to wafers 130a. Front housing 110a may be formed using a dielectric such as plastic, for example in one or more molding processes. Also as shown, front housing 110a includes projections 112a, which are here configured for latching front housing 110a to extender housing 120. For example, projections 112a may be received in openings 124 of extender housing 120. Extender modules 300 are shown protruding from front housing 110a. Extender modules 300 may be mounted to signal conductors of wafers 130 to form mating array 134a. Engagement of the projections 112a into openings 124 may be achieved by applying a force that exceeds the mating force required to press connectors 102a and 102b together for mating or to separate those connectors upon unmating. Accordingly, extender housing 120 may be fixed to front housing 110a during operation of the connectors 102a and 102b.

Apertures of extender housing 120 may be sized to allow mating ends of extender modules 300 to extend therethrough. Mating ends of the signal and ground conductors of the extender modules 300 may then be exposed within a cavity serving as a mating interface area bounded by walls of extender housing 120. The opposite ends of the signal and ground conductors within the extender modules 300 may be electrically coupled to corresponding signal and ground conductors within wafers 130a. In this way, connections between signal and ground conductors within wafers 130a and connector 102b inserted into the mating interface area.

Extender housing 120 may be formed using a dielectric such as plastic, for example in one or more molding processes. In the illustrated embodiment, extender housing 120 includes grooves 122. Grooves 122 are configured to receive projections 112b (FIG. 4B) of front housing 110b of second connector 102b. Sliding of projections 112b in grooves 122 may aid in aligning mating array 134a of first electrical connector 102a with mating array 134b of second electrical connector 102b before sliding the two connectors into a mated configuration.

FIG. 4B is a partially exploded view of second electrical connector 102b of FIG. 1. Here, front housing 110b is shown separated from wafers 130b. As shown in FIG. 4B, wafers 130b of second electrical connector 102b are each formed from multiple connector modules 200. In the embodiment illustrated, there are eight connector modules per wafer. Mating ends 202 of connector modules 200 extend from wafer housing 132b to form mating end array 134b. When front housing 110b is attached to wafers 130b, mating end array 134b extends into front housing 110b. The mating ends 202 are accessible through respective apertures 114b.

Contact tails 206 extend from wafer housing 132b in a direction perpendicular to the direction in which mating ends 202 extend, so as to form contact tail array 136b. Connector modules 200 also include electromagnetic shielding 210 to provide isolation for electrical signals carried by signal pairs of adjacent connector modules 200. In the illustrated embodiment, that shielding also has structures that form mating contact portions a the mating ends 202 and structures that form contact tails that are within contact tail array 136b. The electromagnetic shielding may be formed from electrically conductive material, such as a sheet of metal bent and formed into the illustrated shape so as to form electrically conductive shielding.

Figure 5:
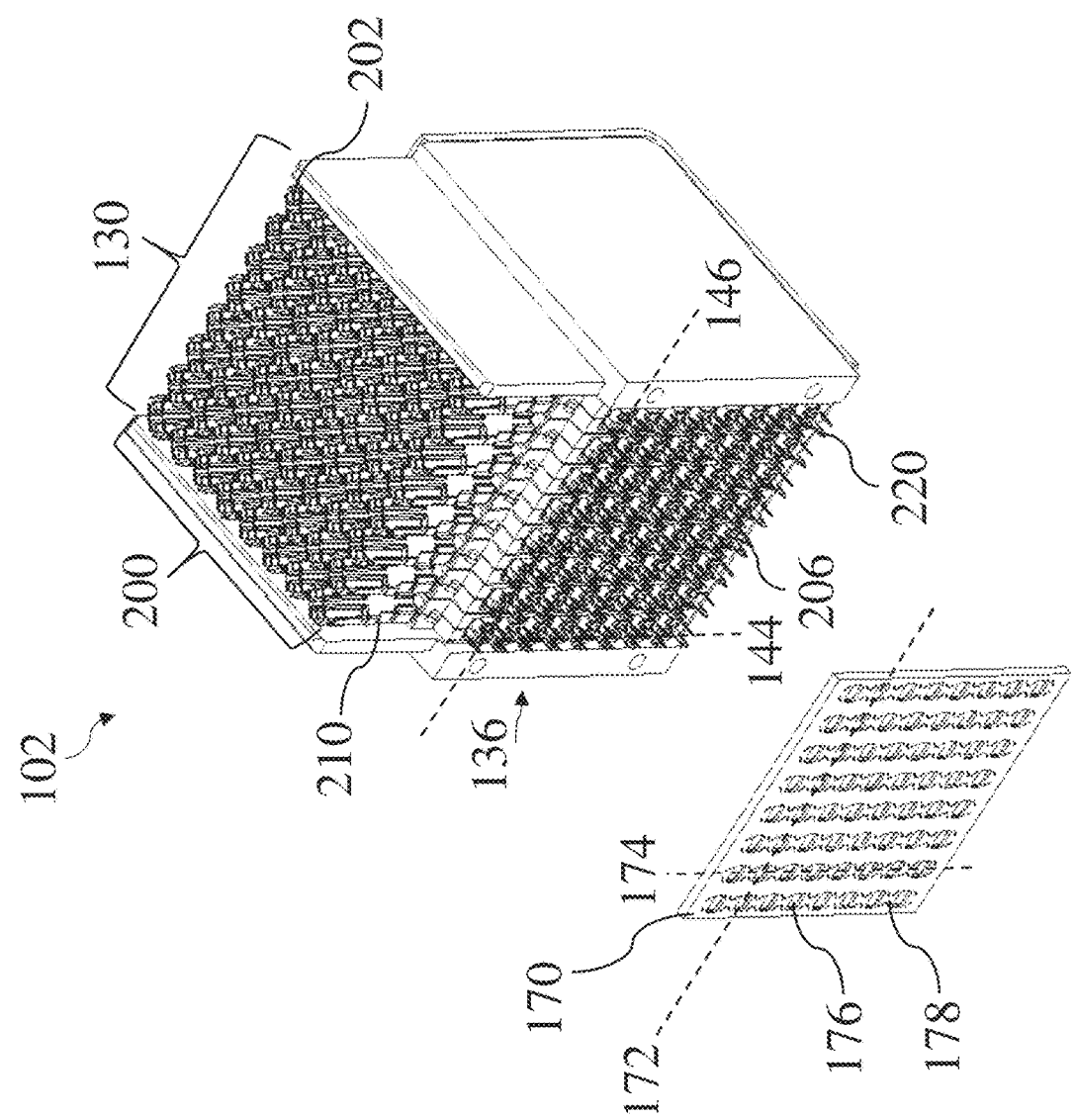
FIG. 5 is a partially exploded view of an electrical connector with a front housing removed and with a compliant shield member, in accordance with some embodiments.

FIG. 5 is a partially exploded view of electrical connector 102 with compliant shield 170, and without a front housing. The inventors have recognized and appreciated that pairs of contact tails 206 and/or electromagnetic shielding tails 220 passing through compliant shield 170 may improve signal integrity in electrical connector 102.

Pairs of contact tails 206 of contact tail array 136 may extend through compliant shield 170. In embodiments in which conductive elements in a connector are configured for pressure mounting, they may extend beyond the compliant shield in an uncompressed state sufficiently far that, when the compliant shield is compressed between a connector and the substrate to which the connector is mounted, the conductive element is compressed a sufficient distance to generate sufficient force for a reliable pressure mount connection. That distance may be between 5 and 15 mils, for example. The force generated may be between 20 and 60 grams, for example.

Compliant shield 170 may include lossy and/or conductive portions and may also include insulative portions. Contact tails 206 may pass through openings or insulative portions of compliant shield 170, and may be insulated from lossy or conductive portions. Ground conductors within connector 102 may be electrically coupled to the lossy or conductive portions, such as by electromagnetic shielding tails 220 passing through or pressing against lossy or conductive portions.

In some embodiments, the conductive portions may be compliant such that their thickness may be reduced when pressed between connector 102 and a printed circuit board when connector 102 is mounted to the printed circuit board. Compliance may result from the material used, and may result, for example, from an elastomer filled with conductive particles or a conductive foam. Such materials may lose volume when a force is exerted upon them or may be displaced so as to exhibit compliance. The conductive and/or lossy portions may be, for example, a conductive elastomer, such as a silicone elastomer filled with conductive particles such as particles of silver, gold, copper, nickel, aluminum, nickel coated graphite, or combinations or alloys thereof. Alternatively or additionally, such a material may be a conductive open-cell foam, such as a polyethylene foam plated with copper and nickel.

If insulative portions are present, they may also be compliant. Alternatively or additionally, the compliant material may be thicker than the insulative portions of compliant shield 170 such that the compliant material may extend from the mounting interface of connector 102 to the surface of a printed circuit board to which connector 102 is mounted.

Compliant material may be positioned to align with pads on a surface of a printed circuit board to which pairs of contact tails 206 of contact tail array 136 are to be attached to or inserted through. Those pads may be connected to ground structures within the printed circuit board such that, when electrical connector 102 is attached to the printed circuit board, the compliant material makes contact with the ground pads on the surface of the printed circuit board.

The conductive or lossy portions of compliant shield 170 may be positioned to make electrical connection to electromagnetic shielding 210 of connector modules 200. Such connections may be formed, for example, by electromagnetic shielding tails 220 passing through and contacting the lossy or conductive portions. Alternatively or additionally, in embodiments in which the lossy or conductive portions are compliant, those portions may be positioned to press against the electromagnetic shielding tails 220 or other structures extending from the electromagnetic shielding when electrical connector 102 is attached to a printed circuit board.

Insulative portions 176 may be organized into rows along a row direction 172 and a column direction 174. When pairs of contact tails 206 of contact tail array 136 extend through insulative portions 176, row direction 172 of compliant shield 170 may substantially align with contact tail row direction 146, and column direction 174 of compliant shield 170 may substantially align with contact tail column direction 144.

In the illustrated embodiment, conductive members 178 join insulative portions 176 and are positioned between rows of contact tail array 136. In this position, they may contact electromagnetic shielding tails 220, as a result of being pressed against the tails when compressed or as a result of shielding tails 220 passing through conductive members 178.

Figure 6B:
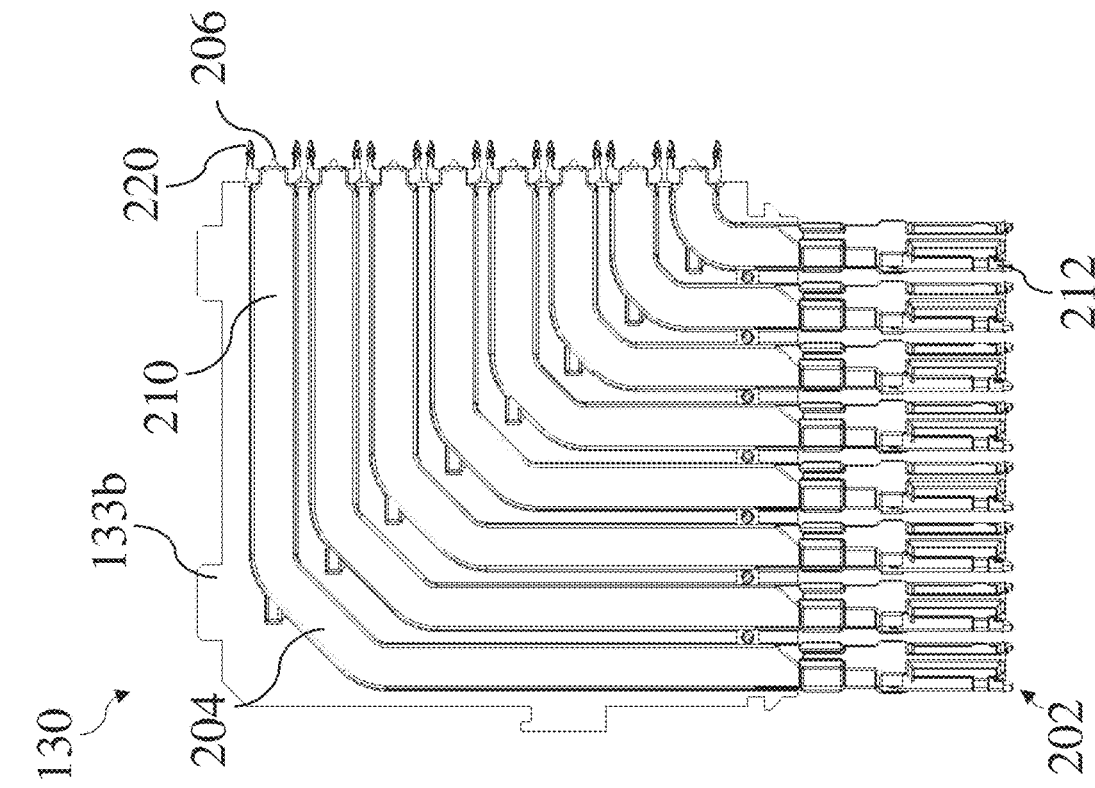
FIG. 6B is a plan view of wafer 130 of FIG. 5 with a wafer housing member 133b cut away.
Figure 6A:
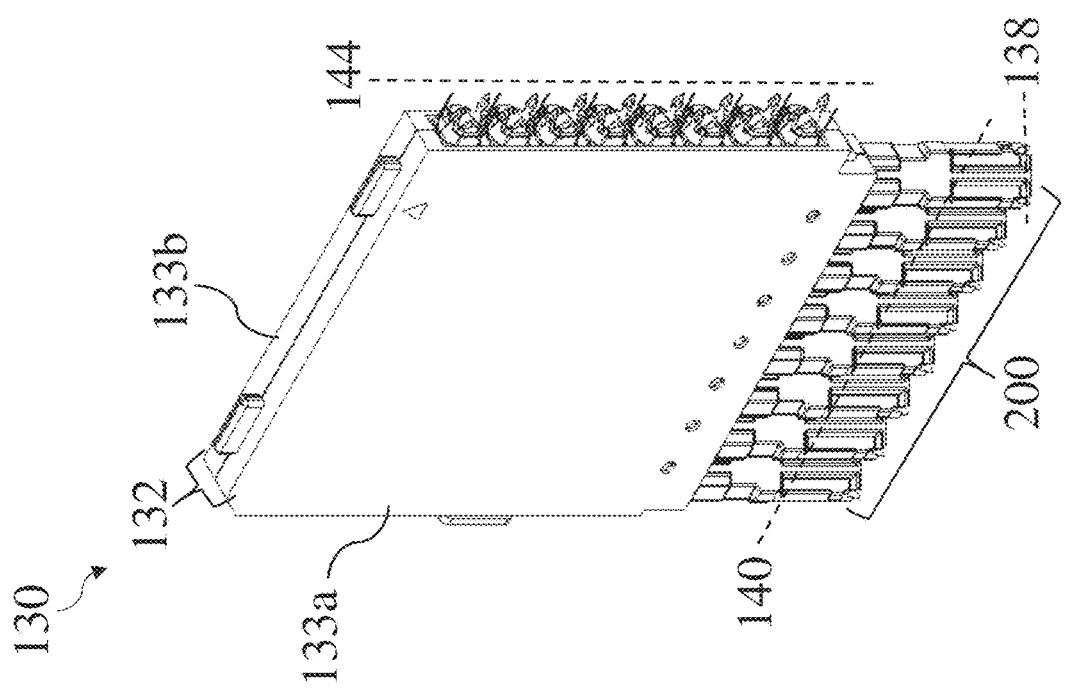
FIG. 6A is a perspective view of wafer 130 of electrical connector 102 illustrated in FIG. 5.

FIG. 6A is a perspective view of wafer 130 of electrical connector 102. In the illustrated embodiment, wafer housing 132 is formed from two housing members 133a and 133b. FIG. 6B is a perspective view of wafer 130 with a wafer housing member 133a cut away. As shown in FIGS. 6A and 6B, wafer 130 includes connector modules 200 between two wafer housing members 133a and 133b. In the illustrated embodiment, wafer housing members 133a and 133b hold connector modules 200 in wafer 130.

In some embodiments, wafer housing members 133a and 133b may be formed from or include a lossy conductive material such as conductively plated plastic, or an insulative material. The inventors have recognized and appreciated that implementing wafer housing members 133a and 133b using lossy conductive material provides damping for undesired resonant modes in and between connector modules 200, thereby improving signal integrity of signals carried by electrical connector 102.

Any suitable lossy material may be used for these and other structures that are "lossy." Materials that conduct, but with some loss, or material which by another physical mechanism absorbs electromagnetic energy over the frequency range of interest are referred to herein generally as "lossy" materials. Electrically lossy materials can be formed from lossy dielectric and/or poorly conductive and/or lossy magnetic materials. Magnetically lossy material can be formed, for example, from materials traditionally regarded as ferromagnetic materials, such as those that have a magnetic loss tangent greater than approximately 0.05 in the frequency range of interest. The "magnetic loss tangent" is the ratio of the imaginary part to the real part of the complex electrical permeability of the material. Practical lossy magnetic materials or mixtures containing lossy magnetic materials may also exhibit useful amounts of dielectric loss or conductive loss effects over portions of the frequency range of interest. Electrically lossy material can be formed from material traditionally regarded as dielectric materials, such as those that have an electric loss tangent greater than approximately 0.05 in the frequency range of interest. The "electric loss tangent" is the ratio of the imaginary part to the real part of the complex electrical permittivity of the material. Electrically lossy materials can also be formed from materials that are generally thought of as conductors, but are either relatively poor conductors over the frequency range of interest, contain conductive particles or regions that are sufficiently dispersed that they do not provide high conductivity or otherwise are prepared with properties that lead to a relatively weak bulk conductivity compared to a good conductor such as copper over the frequency range of interest.

Electrically lossy materials typically have a bulk conductivity of about 1 Siemen/meter to about 10,000 Siemens/meter and preferably about 1 Siemen/meter to about 5,000 Siemens/meter. In some embodiments material with a bulk conductivity of between about 10 Siemens/meter and about 200 Siemens/meter may be used. As a specific example, material with a conductivity of about 50 Siemens/meter may be used. However, it should be appreciated that the conductivity of the material may be selected empirically or through electrical simulation using known simulation tools to determine a suitable conductivity that provides a suitably low crosstalk with a suitably low signal path attenuation or insertion loss.

Electrically lossy materials may be partially conductive materials, such as those that have a surface resistivity between 1 Ω/square and 100,000 Ω/square. In some embodiments, the electrically lossy material has a surface resistivity between 10 Ω/square and 1000 Ω/square. As a specific example, the material may have a surface resistivity of between about 20 Ω/square and 80 Ω/square.

In some embodiments, electrically lossy material is formed by adding to a binder a filler that contains conductive particles. In such an embodiment, a lossy member may be formed by molding or otherwise shaping the binder with filler into a desired form. Examples of conductive particles that may be used as a filler to form an electrically lossy material include carbon or graphite formed as fibers, flakes, nanoparticles, or other types of particles. Metal in the form of powder, flakes, fibers or other particles may also be used to provide suitable electrically lossy properties. Alternatively, combinations of fillers may be used. For example, metal plated carbon particles may be used. Silver and nickel are suitable metal plating for fibers. Coated particles may be used alone or in combination with other fillers, such as carbon flake. The binder or matrix may be any material that will set, cure, or can otherwise be used to position the filler material. In some embodiments, the binder may be a thermoplastic material traditionally used in the manufacture of electrical connectors to facilitate the molding of the electrically lossy material into the desired shapes and locations as part of the manufacture of the electrical connector. Examples of such materials include liquid crystal polymer (LCP) and nylon. However, many alternative forms of binder materials may be used. Curable materials, such as epoxies, may serve as a binder. Alternatively, materials such as thermosetting resins or adhesives may be used.

Also, while the above described binder materials may be used to create an electrically lossy material by forming a binder around conducting particle fillers, the invention is not so limited. For example, conducting particles may be impregnated into a formed matrix material or may be coated onto a formed matrix material, such as by applying a conductive coating to a plastic component or a metal component. As used herein, the term "binder" encompasses a material that encapsulates the filler, is impregnated with the filler or otherwise serves as a substrate to hold the filler.

Preferably, the fillers will be present in a sufficient volume percentage to allow conducting paths to be created from particle to particle. For example, when metal fiber is used, the fiber may be present in about 3% to 40% by volume. The amount of filler may impact the conducting properties of the material.

Filled materials may be purchased commercially, such as materials sold under the trade name Celestran® by Celanese Corporation which can be filled with carbon fibers or stainless steel filaments. A lossy material, such as lossy conductive carbon filled adhesive preform, such as those sold by Techfilm of Billerica, Mass., US may also be used. This preform can include an epoxy binder filled with carbon fibers and/or other carbon particles. The binder surrounds carbon particles, which act as a reinforcement for the preform. Such a preform may be inserted in a connector wafer to form all or part of the housing. In some embodiments, the preform may adhere through the adhesive in the preform, which may be cured in a heat treating process. In some embodiments, the adhesive may take the form of a separate conductive or non-conductive adhesive layer. In some embodiments, the adhesive in the preform alternatively or additionally may be used to secure one or more conductive elements, such as foil strips, to the lossy material.

Various forms of reinforcing fiber, in woven or non-woven form, coated or non-coated may be used. Non-woven carbon fiber is one suitable material. Other suitable materials, such as custom blends as sold by RTP Company, can be employed, as the present invention is not limited in this respect.

In some embodiments, a lossy portion may be manufactured by stamping a preform or sheet of lossy material. For example, a lossy portion may be formed by stamping a preform as described above with an appropriate pattern of openings. However, other materials may be used instead of or in addition to such a preform. A sheet of ferromagnetic material, for example, may be used.

However, lossy portions also may be formed in other ways. In some embodiments, a lossy portion may be formed by interleaving layers of lossy and conductive material such as metal foil. These layers may be rigidly attached to one another, such as through the use of epoxy or other adhesive, or may be held together in any other suitable way. The layers may be of the desired shape before being secured to one another or may be stamped or otherwise shaped after they are held together. As a further alternative, lossy portions may be formed by plating plastic or other insulative material with a lossy coating, such as a diffuse metal coating.

As shown in FIG. 6A, connector modules 200 are aligned along mating column direction 140. As shown in FIG. 6B, connector modules 200 include mating ends 202 and mounting ends where contact tails 206 of signal conductors within the module are exposed. The mating ends and mounting ends of modules 200 are connected by intermediate portions 204. Connector modules 200 also include electromagnetic shielding 210, having electromagnetic shielding tails 220 and electromagnetic shielding mating ends 212, that are at the mounting end and mating end of the module, respectively.

In the illustrated embodiment, mating ends of signal conductors of each connector module are separated along parallel lines 138 at mating ends 202, which make a 45 degree angle relative to mating column direction 140.

In the illustrated embodiment, contact tails 206 of signal conductors within the connector modules are positioned in a column along contact tail column direction 144, and pairs of contact tails 206 are also separated along contact tail column direction 144. As shown, contact tail column direction 144 is orthogonal to mating column direction 140. It should be appreciated, however, the mating end and mounting end may have any desired relative orientation. Contact tails 206 may be either edge or broadside coupled, in accordance with various embodiments.

FIG. 7A is a perspective view of a representative connector module 200. As shown in FIG. 6B, a wafer may include a column of connector modules 200. Each of the connector modules may be in a separate row at the mating and mounting interface of the connector. In a right angle connector, the modules in each row may have a different length intermediate portion 204. The mating ends and mounting ends may be the same, in some embodiments.

As shown in FIG. 7A, electromagnetic shielding members 210a and 210b are disposed around inner insulative member 230. In the illustrated embodiment, electromagnetic shielding members 210 fully cover connector module 200 on two sides, with a gap 218 on the remaining two sides such that only partial covering is provided on those sides. Inner insulative member 230 is exposed through gap 218. However, in some embodiments, electromagnetic shielding members 210 may fully cover the insulative member 230 on 4 sides. Gaps 218 may be relatively narrow, so as not to allow any significant amount of electromagnetic energy to pass through the gap. The gaps, for example, may be less than one half or, in some embodiments, less than one quarter of a wavelength of the highest frequency in the intended operating range of the connector. Signal conductors within connector module 200 are described herein including with reference to FIGS. 10A-10C. Electromagnetic shielding members 210 may be electrically conductive shielding. For example, electromagnetic shielding members 210 may be stamped from a sheet of metal.

FIG. 7A indicates transition region 208 of connector module 200. In transition region 208, mating ends 202 are connected to intermediate portions 204.

Electromagnetic shielding members 210a and 210b include electromagnetic shielding mating ends 212, at mating ends 202, and electromagnetic shielding tails 220, which extend from module 200 parallel to and alongside contact tails 206 of signal conductors within module 200. Electromagnetic shielding mating ends 212 surround the mating ends of the signal conductors.

Electromagnetic shielding mating ends 212 are embossed with outwardly projecting portions 214 in transition region 208 and with inwardly projecting portions 216 at the mating ends 202. Accordingly, outwardly projecting portions 214 are disposed between intermediate portions 204 and inwardly projecting portions 216. Embossing electromagnetic shielding mating ends 212 with outwardly projecting portions 214 offsets changes in impedance along a length of connector modules 200 associated with changes in shape of connector module 200 in the transition region. An impedance along signal paths through connector module 200 may be between 90 and 100 ohms at frequencies between 45-56 GHz, for example. In some embodiments, electromagnetic shielding members 210a and 210b may bound regions encompassing the intermediate portions 204 and contact tails 206 and having a cross-sectional area of less than 2.6 mm$^2$, such as square regions of electromagnetic shielding 211a, 211b, and 221c illustrated in FIGS. 7A-7B. In some embodiments, these regions may be configured to support a $TE_{1,0}$ resonant mode with a frequency of greater than 56 GHz, enabling reliable propagation of signals at speeds of at least 112 Gb/s over one differential pair.

Figure 8B:
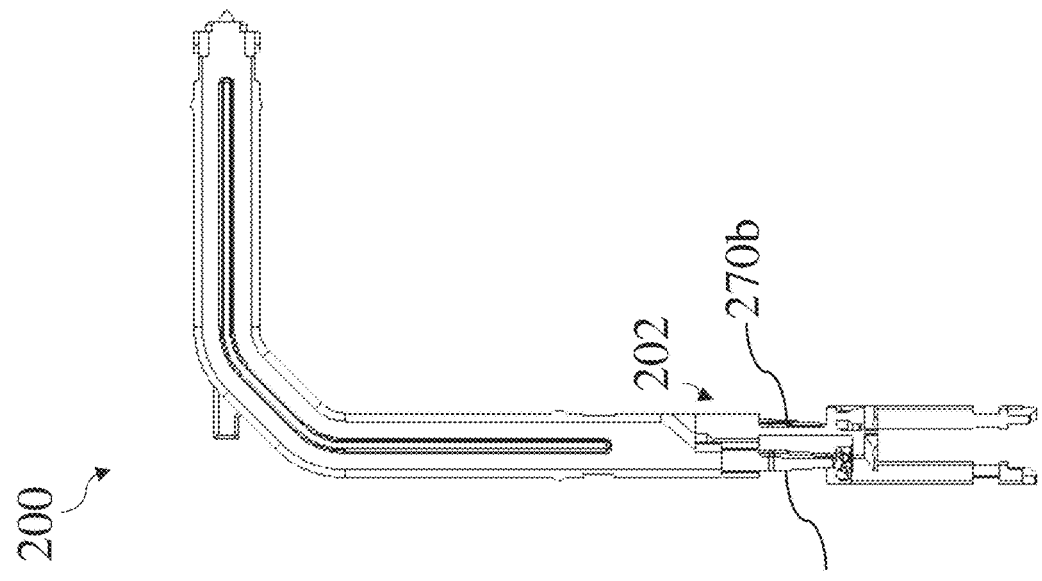
FIG. 8B is a side view of connector module 200 of FIG. 8A.
Figure 8A:
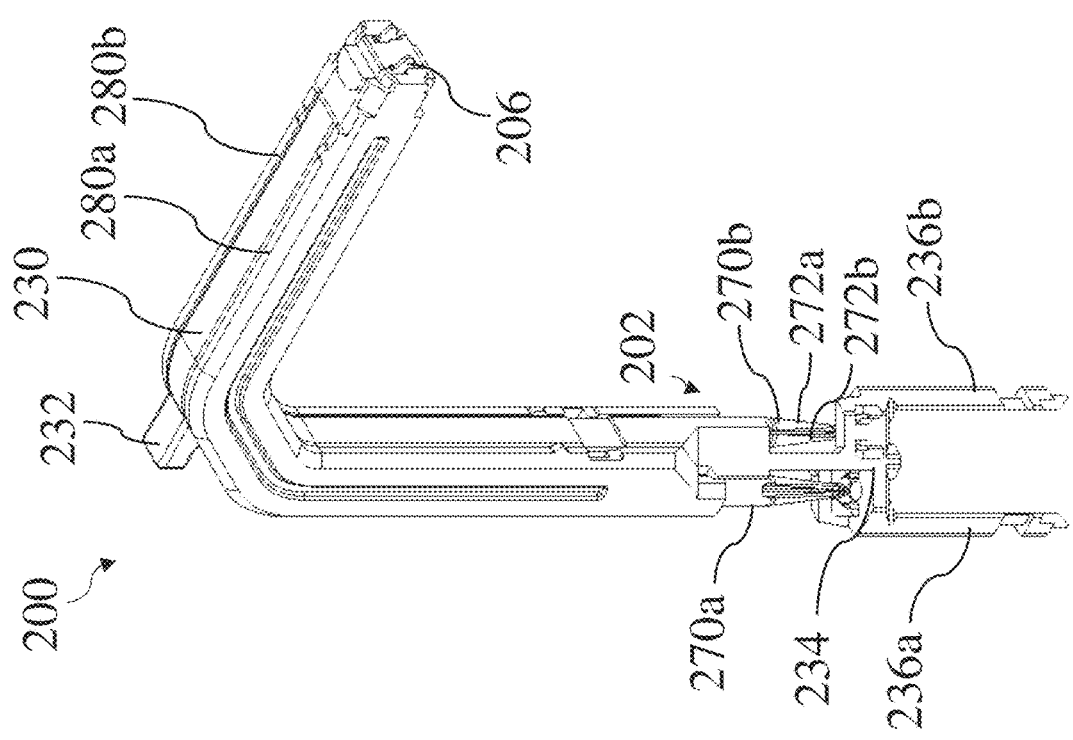
FIG. 8A is a perspective view of connector module 200 of FIG. 6B with electromagnetic shielding members 210 cut away.

Embossing electromagnetic shielding mating ends 212 with inwardly projecting portions 216 provides a more constant impedance between an operating state in which connector module 200 is pressed firmly against a mating connector and an operating stated in which connector module 200 is partially demated such that there is a separation between connector module 200 and the mating connector but the connectors are sufficiently close that the signal conductors in those connectors mate. In some embodiments, an impedance change between fully mated and partially demated configurations of mating ends 202 is less than 5 ohms at operating frequencies of the connector, such as in a range of 45-56 GHz. FIG. 7B is a perspective view of connector module 200 of FIG. 6B with outer insulative members 180a and 180b and inner insulative member 230 removed;

FIGS. 8A-8B are a perspective view and a side view, respectively, of connector module 200 with electromagnetic shielding members 210a and 210b cut away. As shown in FIGS. 8A-8B, outer insulative members 280a and 280b are disposed on opposite sides of inner insulative member 230. Outer insulative members 280a and 280b may be formed using a dielectric material such as plastic. Projection 232 of inner insulative member 230 is disposed closer to contact tails 206 than to mating ends 202 and extends in a direction opposite the direction along which contact tails 206 extend.

Mating ends 202 of signal conductors within connector module 200 include compliant receptacles 270a and 270b, each having mating arms 272a and 272b. In the illustrated embodiment, compliant receptacles 270a and 270b are configured to receive and make contact with a mating portion of a signal conductor of a mating connector between mating arms 272a and 272b.

Also shown in FIGS. 8A-8B, insulative portions of connector module 200 may insulate receptacles 270a and 270b from each other. Those insulative portions may also position receptacles 270a and 270b and provide apertures through which mating portions of a mating connector may enter receptacles 270a and 270b. Those insulative portions may be formed as part of insulative member 230. In the embodiment illustrated, inner insulative member 230 has an extended portion 234, which includes arms 236a and 236b. Extended portion 234 extends beyond compliant receptacles 270a and 270b in a direction along which mating ends 202 are elongated. Arms 236a and 236b are spaced farther apart than are mating ends 202. Apertures of extended portion 234 may be configured to receive wires therethrough such that the wires extend into compliant receptacles 270a and 270b. For example, gaps between arms 272a and 272b of compliant receptacles 270a and 270b may be aligned with the apertures.

Figure 9B:
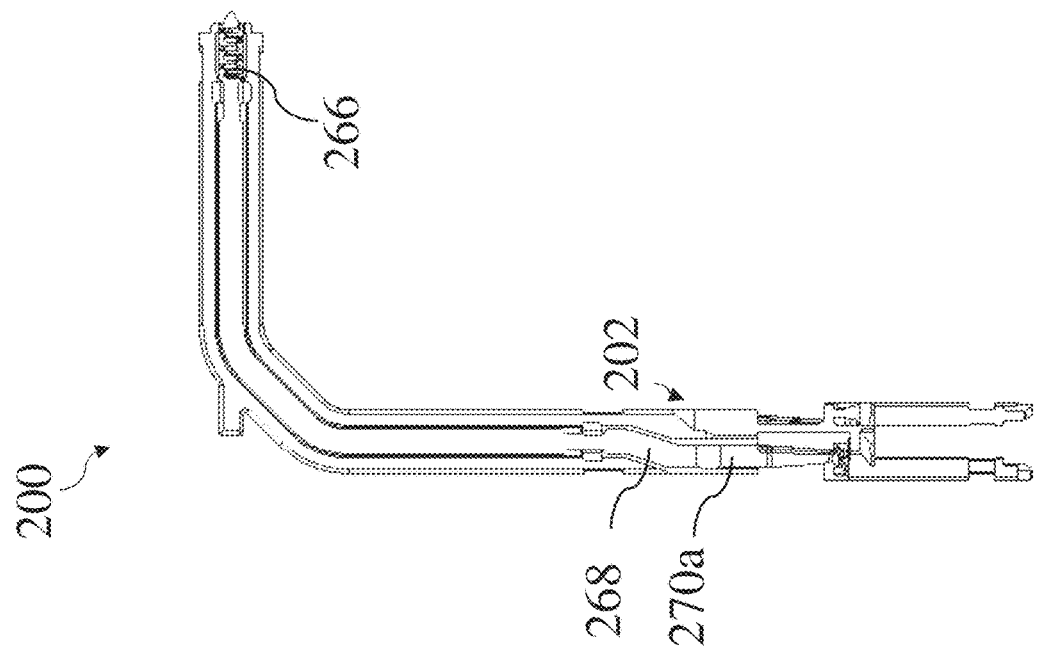
FIG. 9B is a side view of connector module 200 of FIG. 9A.
Figure 9A:
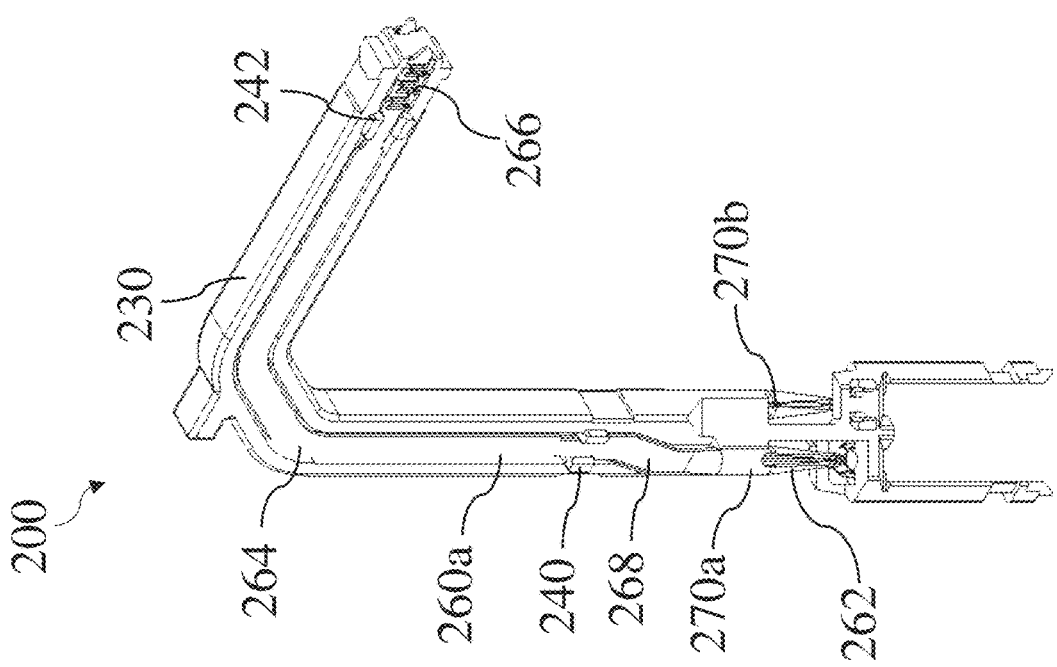
FIG. 9A is a perspective view of connector module 200 of FIG. 6B with electromagnetic shielding members 210 and outer insulative members 180a and 180b cut away.

FIGS. 9A-9B are a perspective view and a side view, respectively, of connector module 200 with electromagnetic shielding members 210a and 210b as well as outer insulative members 280a and 280b cut away. As shown in FIGS. 9A-9B, connector module 200 includes signal conductors 260, here shown as signal conductors 260a and 260b implemented as a differential pair. When connector module 200 is assembled, signal conductor 260a may be disposed between outer insulative member 280a and inner insulative member 230, and signal conductor 260b may be disposed between outer insulative member 280b and inner insulative member 230.

One or more of inner insulative member 230 and outer insulative members 280a and 280b may include features to hold the insulative components together, thereby firmly positioning the signal conductors 260 within in the insulative structure. In the illustrated embodiment, first and second retaining members 240 and 242 of inner insulative member 230 may extend into openings in outer insulative members 280a and 280b. In the illustrated embodiment, first retaining members 240 are disposed adjacent mating ends 202 and extend in a direction perpendicular to the direction along which mating ends 202 extend. Second retaining members 242 are disposed adjacent contact tails 206 and extend in a direction perpendicular to the direction along which contact tails 206 extend.

Intermediate portions of signal conductors 260a and 260b are on opposite sides of inner insulative member 230. In the illustrated embodiments, signal conductors 260a and 260b are each stamped from a sheet of metal and then bent into the desired shape. The intermediate portions are flat with a thickness equaling the thickness of the sheet of metal. As a result, the intermediate portions have opposing broadsides, joined by edges that are thinner than the broad sides. In the embodiment, the intermediate portions are aligned broadside to broadside, providing for broadside coupling within the module 200.

In FIGS. 9A-9B, signal conductors 260 include mating ends 262, intermediate portions 264, and compliant portions 266 located at mating ends 202, intermediate portions 204, and contact tails 206 of connector module 200, respectively. As shown, mating ends 262 include compliant receptacles 270a and 270b. The mounting ends include compliant portions 266 configured to compress in a direction in which a connector is pressed for connection to a substrate, as described herein including with reference to FIGS. 10A-10C.

A transition region 268 of signal conductors 260 connects mating ends 262 to intermediate portions 264. In transition region 268, the angular position about an axis parallel to the longitudinal dimension of the signal conductors 260a and 260*b* of the pair changes. The angular distance between the signal conductors 260*a* and 260*b* may remain the same, such as at 180 degrees. In the illustrated embodiment, the angular position of the signal conductors 260*a* and 260*b* changes 45 degrees within transition region 268 so that, considered across the transition region 268, there is an angular twist to the pair.

Inner insulative member 230 may be shaped to accommodate a pair of signal conductors with such a transition region. In some embodiments, signal conductors 260 may be disposed in grooves on opposite sides of inner insulative member 230. Transition region 268 of signal conductors 260 may be disposed within a transition guide of the grooves.

FIG. 10A-10C illustrate signal conductors 260*a* and 260*b* of connector module 200 of FIG. 9A-B. FIG. 10A is a perspective view of signal conductors 260*a* and 260*b*, FIG. 10B is an enlarged view of compliant portions 266*a* and 266*b* of signal conductors 260*a* and 260*b*, and FIG. 10C is a front view of signal conductors 260*a* and 260*b*. As shown in FIGS. 10A-10C, mating ends 262*a* and 262*b* extend in a first direction and compliant portions 266*a* and 266*b* extend in a second direction at a right angle relative to the first direction. Compliant portions 266*a* and 266*b* link contact tails, here shaped as pointed tips 1050*a* and 1050*b*, to intermediate portions of the signal conductors.

In some embodiments, each of the signal conductors may be stamped and formed form a sheet of metal of uniform thickness and each segment of the signal conductor may have the same thickness. That thickness, for example, may be between 2 and 4 mils, for example. In some embodiments, however, the thickness of the beams at mating ends 262*a* and 262*b* to make a reliable connection to a contact from a mating connector may be greater than the thickness of compliant portions 266*a* and 266*b* that generates a desired contact force at tips 1050*a* and 1050*b*. In such embodiments, mating ends 262*a* and 262*b* may be thicker than compliant portions of contact tails 266*a* and 266*b*. A signal conductor may be formed in this configuration, for example, by coining the portions from which compliant portions 266*a* and 266*b* are stamped.

In the illustrated embodiment, compliant portions 266*a* and 266*b* may include portions configured to compress in the direction in which signal conductors 260*a* and 260*b* are elongated proximate compliant portions 266*a* and 266*b*. In the illustrated embodiment, this direction is perpendicular to the surface of a printed circuit board to which the connector is mounted. For instance, compliant portions 266*a* and 266*b* may be configured such that, as the connector including compliant portions 266*a* and 266*b* nears the substrate in a mounting direction, the compliant portions 266*a* and 266*b* may compress in the mounting direction. In some embodiments, compliant portions 266*a* and 266*b* may compress such that tips 1050*a* and 1050*b* retract towards a housing of the electrical connector when a force is exerted on tips 1050*a* and 1050*b* in that direction. In some embodiments, compliant portions 266*a* and 266*b* may compress in a direction perpendicular to the dimensions (e.g., row and column directions) of the contact tail array that includes compliant portions 266*a* and 266*b*.

In some embodiments, compliant portions 266*a* and 266*b* may be configured as serpentine portions 1001 as illustrated in FIG. 10. Serpentine portions 1001 are shown including a number of arcuate segments separated by openings. In some embodiments, serpentine portions 1001 may include between 4 and 8 segments. These segments may compress by decreasing the openings between arcuate segments.

The serpentine portions 1001 may terminate in pointed tips 1050*a* and 1050*b*, as illustrated. In some embodiments, the tips may include gold plating.

As shown in FIG. 10B, compliant portion 266*b* includes first bend 1002 and second bend 1004. The bends 1002 and 1004 of compliant portion 266*b* are shown spaced from one another by a first distance. When compliant portion 266*b* is mounted to a surface, the distance between bends 1002 and 1004 decreases as bend 1004 is compressed towards bend 1002. As a result, bends 1002 and 1004 are spaced closer together when a connector having compliant portions 266*a* and 266*b* is pressed against a substrate. As illustrated bends, 1002 and 1004 are conductive. When bends 1002 and 1004 compress together, bends 1002 and 1004 may be brought into physical contact, and/or may be sufficiently close together that signals carried by signal conductors 260*a* and 260*b* may pass through compliant portions 266*a* and 266*b* with little or no degradation. The compression of the segments also generates a spring force that force tips 1050*a* and 1050*b* towards the substrate against which the connector is being pressed.

In some embodiments, compliant portions 266*a* and 266*b* may rotate when compressed. Rotation may be imparted by cutting tapered edges on the segments that form compliant portions 266*a* and 266*b* such that, when the segments are pressed together, one segment may ride over the tapered edge of an adjacent segment such that the segments, which may be co-planar in an uncompressed state, may move out of plane. For instance, in FIG. 10B, bend 1004 may press against spring portion 1006 when compressed, and spring portion 1006 may be slanted such that bend 1004 twists as it glides along the slant. When other bends of compliant portions 266*a* and 266*b* ride along similar slants, the bends of the compliant portions 266*a* and 266*b* may twist as well, causing compliant portions 266*a* and 266*b* to rotate about an axis 1052*a* and 1052*b* passing through the tips 1050*a* and 1050*b* when compressed. In some embodiments, compliant portions 266*a* and 266*b* may be configured to generate between 20 and 60 grams of force when compressed. In some embodiments, the compliant portions may be configured to generate between 25 and 45 grams of force when compressed.

Here, each signal conductor 260*a* and 260*b* is configured to carry a component of a differential signal. Signal conductors 260*a* and 260*b* each may be formed as a single, integral conductive element, which may be stamped from a metal sheet. However, in some embodiments, signal conductors 260*a* and 260*b* each may be formed of multiple conductive elements fused, welded, brazed or otherwise joined together. For example, portions of signal conductors 260*a* and 260*b*, such as contact tails 266*a* and 266*b* and mating ends 262*a* and 262*b*, may be formed using superelastic conductive materials.

Superelastic materials may include shape memory materials that undergo a reversible martensitic phase transformation when a suitable mechanical driving force is applied. The phase transformation may be a diffusionless solid-solid phase transformation which has an associated shape change; the shape change allows superelastic materials to accommodate relatively large strains compared to conventional (i.e. non-superelastic) materials, and therefore superelastic materials often exhibit a much larger elastic limit than traditional materials. The elastic limit is herein defined as the maximum strain to which a material may be reversibly deformed without yielding. Whereas conventional conductors typically exhibit elastic limits of up to 1%, superelastic conductive materials may have elastic limits of up to 7% or 8%. As a result, superelastic conductive materials can be made smaller without sacrificing the ability to tolerate sizeable strains. Moreover, some superelastic conductive materials may be returned to their original form, even when strained beyond their elastic limits, when exposed to a transition temperature specific to the material. In contrast, conventional conductors are usually permanently deformed once strained beyond their elastic limit.

Such materials may enable signal conductors that are small, yet provide robust structures. Such materials facilitate decreasing the width of electrical conductors of the electrical connectors, which can lead to decreasing spacing between the electrical conductors and electromagnetic shielding of the electrical connectors in connector modules 300. Superelastic members, for example, may have a diameter (or effective diameter as a result of having a cross sectional area that equals the area of a circle of that diameter) between and 20 mils in some embodiments, such as between 8 and 14 mils, or in some embodiments between 5 and 8 mils, or in any subrange of the range between 5 and 14 mils.

In addition to enabling routing channels in the row and column directions, more compact connector modules may have undesired resonant modes at high frequencies, which may be outside the desired operational frequency range of the electrical connector. There may be a corresponding reduction of the undesired resonant frequency modes in the operational frequency range of the electrical connector, which provides increased signal integrity for signals carried by the connector modules.

In some embodiments, contact tails of contact tail array 336a (or 336b, 136a, 136b, etc.) may include superelastic (or pseudoelastic) material. Depending on the particular embodiment, the superelastic material may have a suitable intrinsic conductivity or may be made suitably conductive by coating or attachment to a conductive material. For example, a suitable conductivity may be in the range of about 1.5µΩcm to about 200 µΩcm. Examples of superelastic materials which may have a suitable intrinsic conductivity include, but are not limited to, metal alloys such as copper-aluminum-nickel, copper-aluminum-zinc, copper-aluminum-manganese-nickel, nickel-titanium (e.g. Nitinol), and nickel-titanium-copper. Additional examples of metal alloys which may be suitable include Ag—Cd (approximately 44-49 at % Cd), Au—Cd (approximately 46.5-50 at % Cd), Cu—Al—Ni (approximately 14-14.5 wt %, approximately 3-4.5 wt % Ni), Cu—Au—Zn (approximately 23-28 at % Au, approximately 45-47 at % Zn), Cu—Sn (approximately 15 at % Sn), Cu—Zn (approximately 38.5-41.5 wt % Zn), Cu—Zn—X (X=Si, Sn, Al, Ga, approximately 1-5 at % X), Ni—Al (approximately 36-38 at % Al), Ti—Ni (approximately 49-51 at % Ni), Fe—Pt (approximately 25 at % Pt), and Fe—Pd (approximately 30 at % Pd).

In some embodiments, a particular superelastic material may be chosen for its mechanical response, rather than its electronic properties, and may not have a suitable intrinsic conductivity. In such embodiments, the superelastic material may be coated with a more conductive metal, such as silver, to improve the conductivity. For example, a coating may be applied with a chemical vapor deposition (CVD) process, a physical vapor deposition (PVD) process, or any other suitable coating process, as the disclosure is not so limited. Coated superelastic materials also may be particularly beneficial in high frequency applications in which most of the electrical conduction occurs near the surface of conductors.

In some embodiments, a connector element including a superelastic material may be formed by attaching a superelastic material to a conventional material which may have a higher conductivity than the superelastic material. For example, a superelastic material may be employed only in a portion of the connector element which may be subjected to large deformations, and other portions of the connector which do not deform significantly during operation of the connector may be made from a conventional (high conductivity) material.

The inventors have recognized and appreciated that implementing portions of an electrical connector using superelastic conductive materials enables smaller structures that are nonetheless sufficiently robust to withstand the operational requirements of an electrical connector, and therefore, may facilitate higher signal conductor density within the portions made of superelastic material. This closer spacing may be carried through the interconnection system. For example, a mounting footprint for receiving electrical connector 302a on a substrate may be adapted for receiving high density contact tail array 336b, as described herein including with reference to FIG. 12A.

As a result of transition region 268a, mating ends 262a and 262b are separated from each other along line 138, while intermediate portions 264a and 264b adjacent mating ends 262a and 262b are separated along mating row direction 142. As illustrated, for example in FIG. 5, connector 102 may be constructed such that all of the modules 200 positioned in rows that extend in the row direction 142. All of the modules may include similarly oriented mating ends, such that, for each module, the mating ends of the signal conductors will be separated from each other along a line parallel to line 138.

A relative position of signal conductors 260a and 260b varies along transition region 268 such that at a first end of transition region 268 adjacent mating ends 262a and 262b, signal conductors 260a and 260b are aligned along first parallel line 138, and at a second end of transition region 268 adjacent intermediate portions 264a and 264b, signal conductors 260a and 260b are aligned along mating row direction 142. In the illustrated example, transition region 268 provides a 45 degree twist between line 138 and mating row direction 142. Within transition region 268, signal conductor 260a extends away from contact tail column direction 144, and signal conductor 260b extends towards contact tail column direction 144.

Despite the variation of the relative position of the signal conductors 260a and 260b across the transition region, signal integrity of the pair of signal conductors may be enhanced by configuring module 200 to maintain each of signal conductors 260a and 260b adjacent the same respective shielding member 210a or 210b throughout the transition region. Alternatively or additionally, the spacing between the signal conductors 260a and 260b and the respective shielding member 210a or 210b may be relatively constant over the transition region. The separation between signal conductor and shielding member, for example, may vary by no more than 30%, or 20% or 10% in some embodiments.

Module 200 may include one or more features that provide this relative positioning and spacing of signal conductors and shielding members. As can be seen, for example from a comparison of FIG. 7A and FIGS. 10A and 10C, shielding members 210a and 210b have a generally planar shape in the intermediate portions 204, which parallels the intermediate portions 264 of a respective signal conductor 260a or 260b. The shield mating ends 212 may be formed from the same sheet of metal as the intermediate portions, with the shield mating ends 212 twisted with respect to the intermediate portions 204. The twist of the shielding member may have the same angle and/or same rate of angular twist as the signal conductors, ensure that each signal conductor, ensuring that the same shielding member is adjacent the same signal conductor throughout the transition region.

Further, as can be seen in FIGS. 10A and 10C, mating ends 262a and 262b are formed by rolling conductive material of the sheet of metal from which signal conductors 260 are formed into a generally tubular configuration. That material is rolled towards the centerline between mating ends 262a and 262b. Such a configuration leaves a flat surface of the signal conductors facing outwards toward the shield members, which may aid in keeping a constant spacing between the signal conductors and the shield members, even in the twist region.

It should be appreciated, that a spacing between signal conductors 260a and 260b may be substantially constant in units of distance. Alternatively, the spacing may provide a substantially constant impedance. In such a scenario, for example, where the signal conductors are wider, such as a result of being rolled into tubes, the spacing relative to the shield may be adjusted to ensure that the impedance of the signal conductors is substantially constant.

Figure 17A:
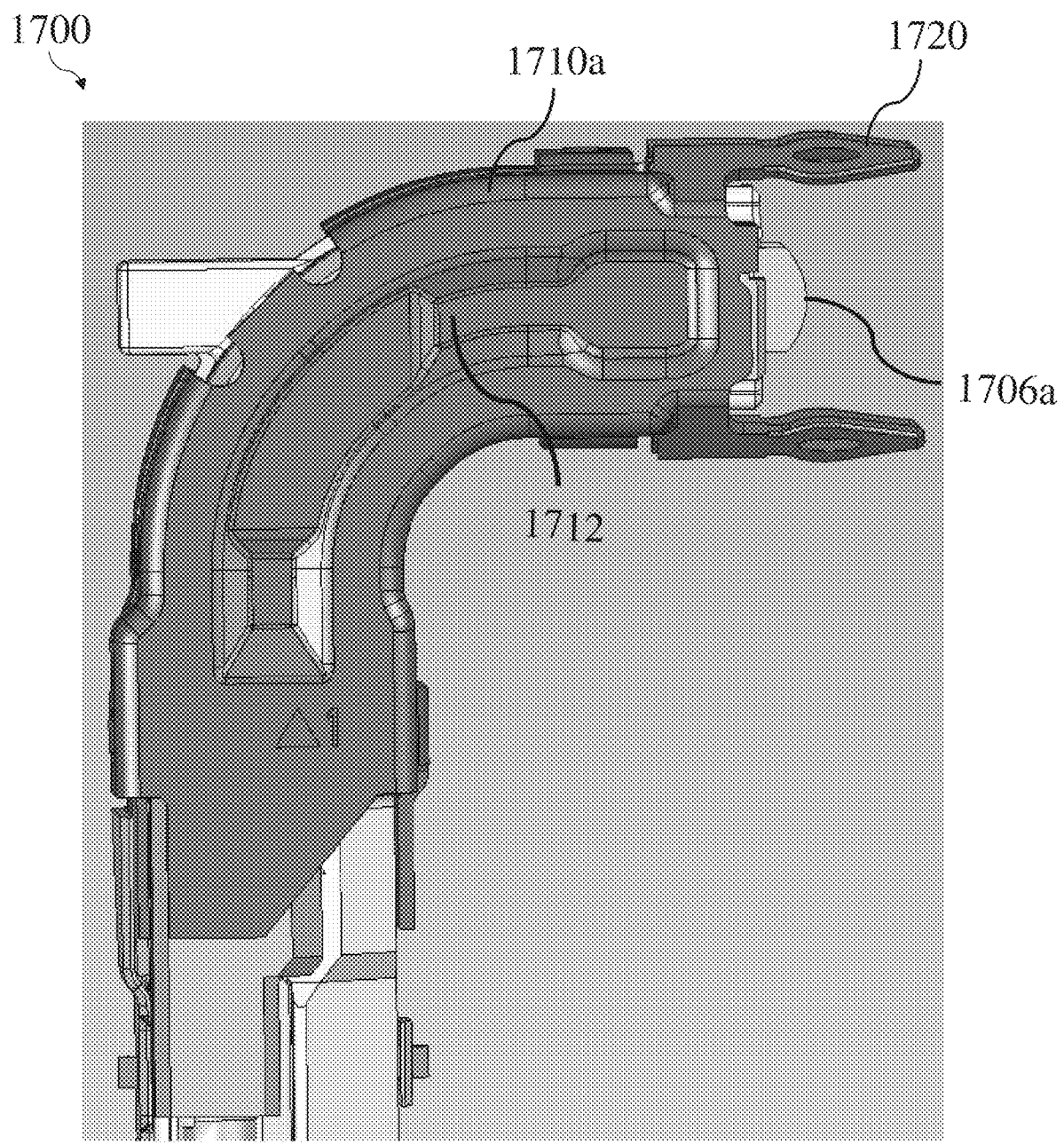
FIG. 17A is a side view of a portion of an alternative connector module 1700 that may be included in an electrical connector, in accordance with some embodiments.
Figure 17B:
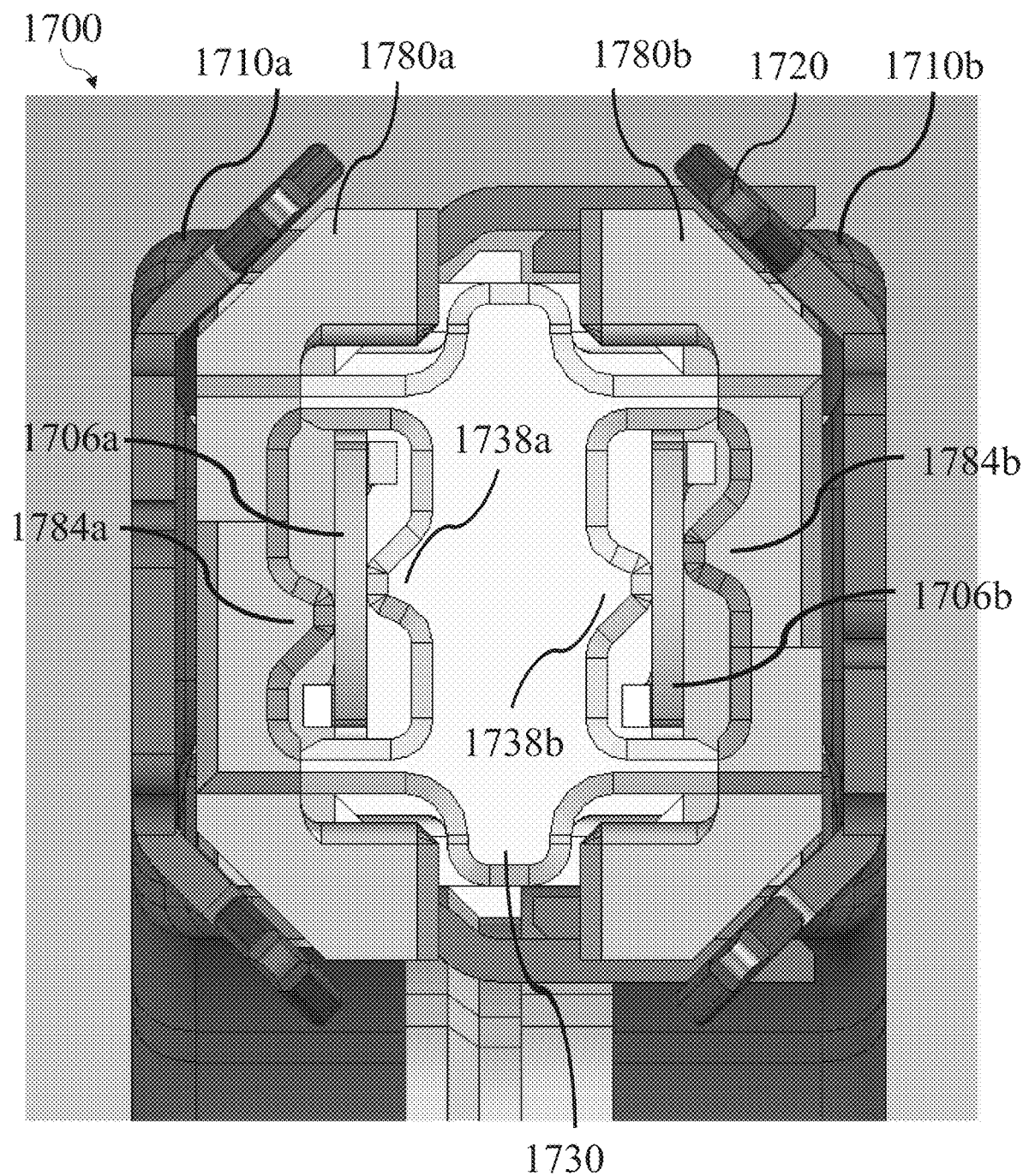
FIG. 17B is a front view of a portion of the connector module 1700 of FIG. 17A.

FIG. 17A is a side view of a portion of an alternative connector module 1700 that may be included in an electrical connector, in accordance with some embodiments. FIG. 17B is a front view of the portion of the connector module 1700 of FIG. 17A. In some embodiments, connector module 1700 may be configured in the manner described herein for connector module 200 including in connection with FIGS. 6B to 10C. For example, in FIGS. 17A and 17B, connector module 1700 includes electromagnetic shielding members 1710a and 1710b including electromagnetic shielding tails 1720, outer insulative members 1780a and 1780b, inner insulative member 1730, and signal conductors 1760a and 1760b having contact tails 1706a and 1706b shown in FIGS. 17A-17B. Signal conductors 1760a and 1760b are described further herein including in connection with FIGS. 19A to 21B.

As shown in FIG. 17A, electromagnetic shielding members 1710a and 1710b may include grooves 1712 projecting towards signal conductors 1760a and 1760b. In some embodiments, groove 1712 may provide closer spacing between electromagnetic shielding member 1710a and signal conductor 1760a. In some embodiments, grooves 1712 may be elongated parallel to signal conductors 1760a and 1760b, such as shown in FIG. 17A, where the illustrated groove 1712 follows a right angle bend of signal conductors 1760a.

In some embodiments, connector module 1700 may include one or more insulative members configured to control rotation of contact tails 1706a and 1706b when contact tails 1706a and 1706b are compressed. Contact tails 1706a and 1706b may include serpentine portions (e.g. serpentine portion 2101, FIG. 21A) with segments that are pressed together when the contact tails are compressed. The inventors have recognized that compression such that each segment contacts its adjacent segment leads to desirable electrical properties and further that controlling a rotation of contact tails 1706a and 1706b can prevent compression and/or exertion of stress on contact tails 1706a and 1706b that could otherwise preclude the contact tails from compressing into a state with desired electrical properties. In some embodiments, insulative member(s) of connector module 1700 may be configured to control contact tails 1706a and 1706b to rotate in a same direction when compressed. In some embodiments, and as described further herein including in connection with FIGS. 21A and 21B, contact tails 1706a and 1706b may be configured to rotate about an axis of insertion against a substrate when compressed along the axis of insertion against the substrate.

In some embodiments, insulative members of connector module 1700 may include projections configured to abut contact tails 1706a and 1706b when contact tails 1706a and 1706b are rotated towards the projections about the insertion axis. For example, as shown in FIG. 17B, outer insulative members 1780 include projections 1784a and 1784b that project towards contact tails 1706a and 1706b, respectively. Also shown in FIG. 17B, inner insulative member 1730 includes projections 1738a and 1738b that project towards signal conductors 1706a and 1706b, respectively. In the illustrated example, projection 1784a is offset from projection 1738a and projection 1784b is offset from projection 1738b in a direction perpendicular to a direction in which contact tail 1706a is spaced from contact tail 1706b. In the illustrated configuration, contact tails 1706a and 1706b may be configured to rotate in a same direction (e.g., counterclockwise in FIG. 17B) about the insertion axis when inserted against a substrate along the insertion axis.

It should be appreciated that, in some embodiments, projection 1784a may be aligned with projection 1738a, projection 1738b, and/or projection 1784b, as embodiments described herein are not so limited.

Figure 18:
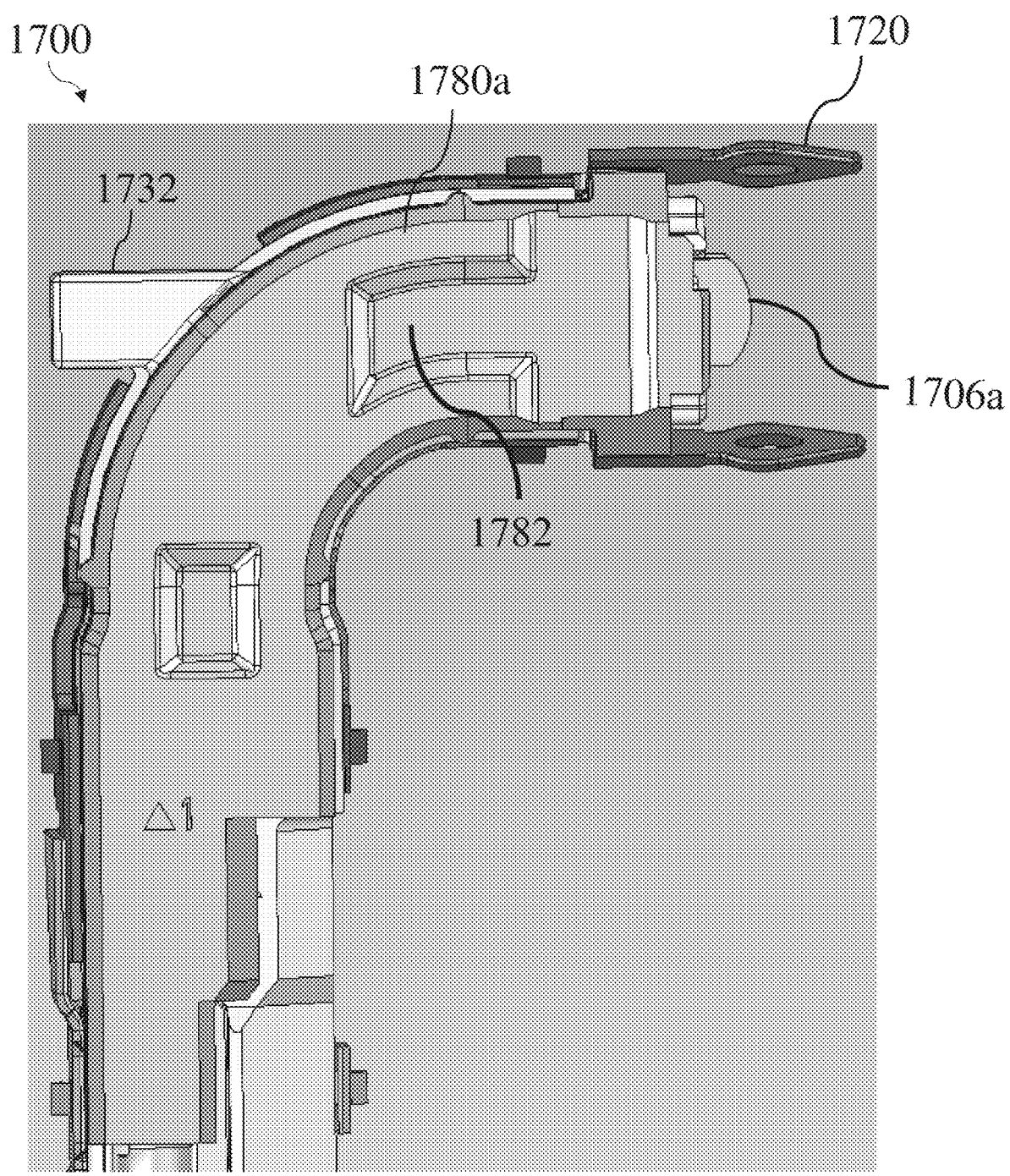
FIG. 18 is a side view of the portion of the connector module 1700 of FIG. 17A with electromagnetic shielding member 1710a cut away.

FIG. 18 is a side view of the portion of connector module 1700 shown in FIG. 17A with electromagnetic shielding member 1710a cut away. In FIG. 18, outer insulative member 1780a includes groove 1782, which may be configured to accommodate groove 1712 of electromagnetic shielding member 1710a.

Figure 19A:
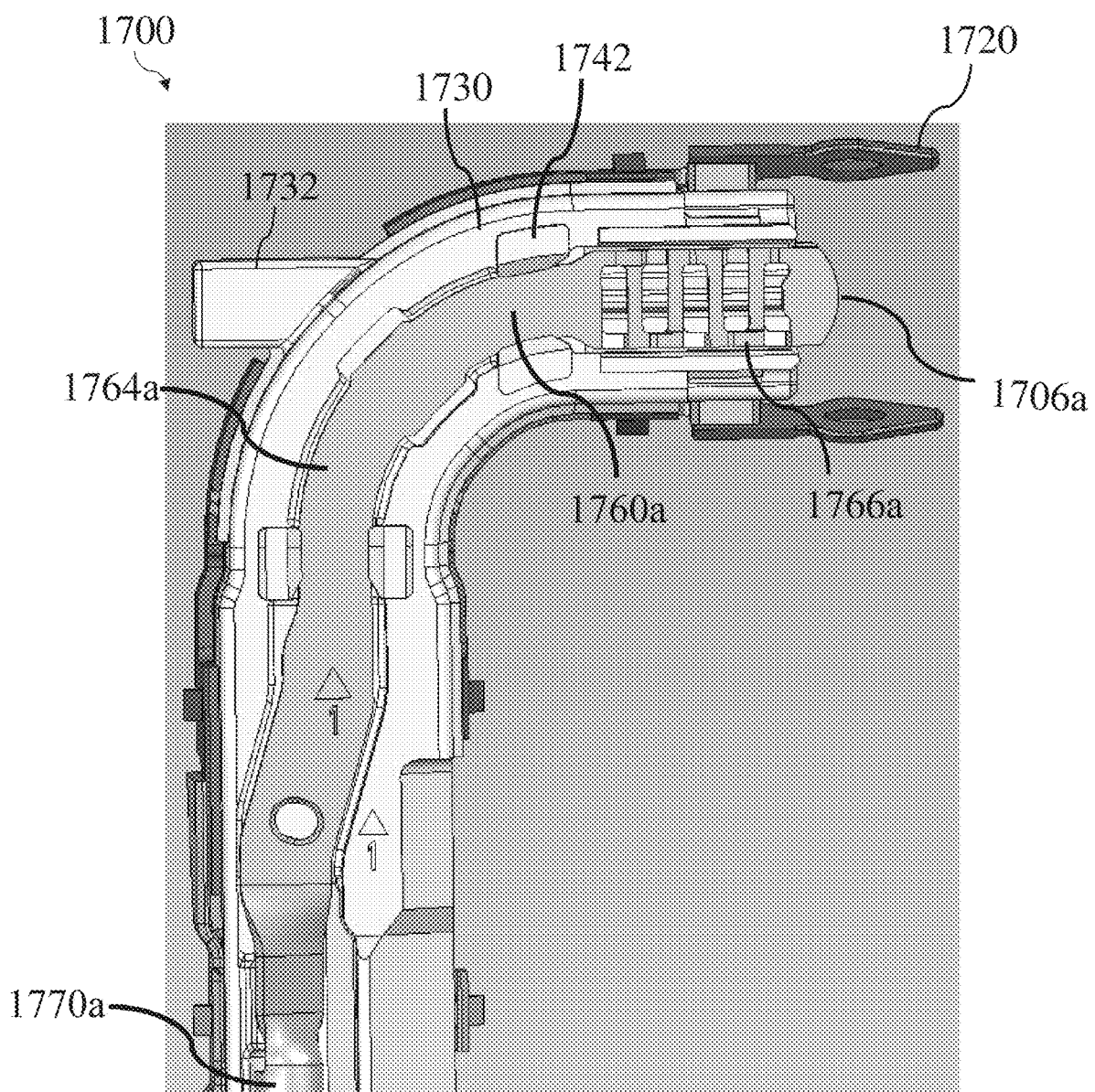
FIG. 19A is a side view of the portion of connector module 1700 of FIG. 17 with electromagnetic shielding member 1710a and outer insulative member 1780a cut away.
Figure 19B:
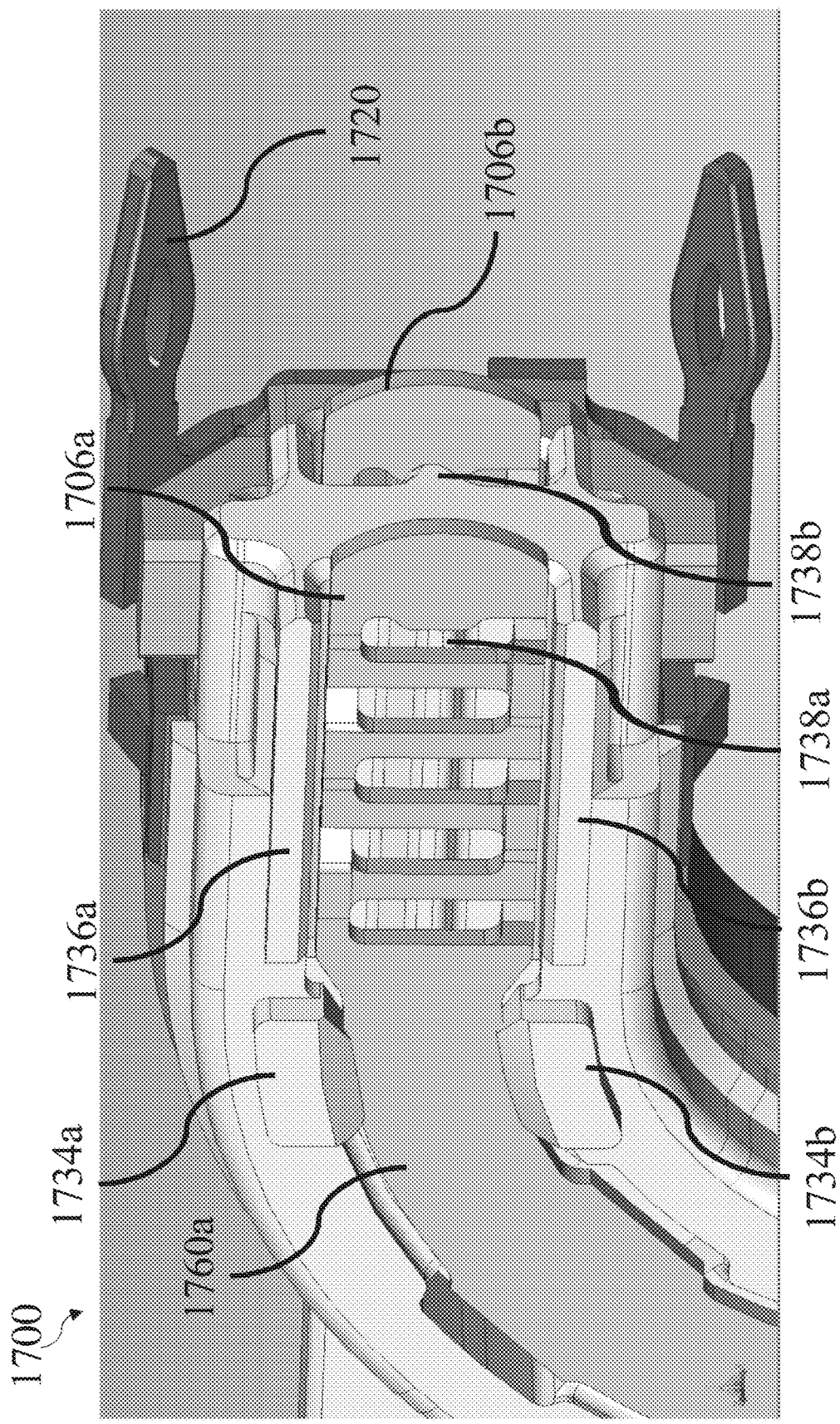
FIG. 19B is a perspective view of a portion of the connector module 1700 as shown in FIG. 19A.

FIG. 19A is a side view of the portion of connector module 1700 shown in FIG. 17A with electromagnetic shielding member 1710a and outer insulative member 1780a cut away. FIG. 19B is a perspective view of connector module 1700. FIGS. 19A and 19B show signal conductor 1760a and compliant portion 266a of signal conductor 1760a seated in a slot of inner insulative member 1730. In FIG. 19A, intermediate portion 1764a of signal conductor 1760a is shown circularly subtending a right angle bend. FIG. 19A also shows a portion of a compliant receptacle 1770a that serves as a mating end of signal conductor 1760a, and which may be configured in the manner described herein for compliant receptacle 270a of connector module 200. In FIGS. 19A and 19B, inner insulative member 1730 is shown including projection 1732, retaining members 1734a and 1734b, and projections 1736a, 1736b, and 1738a configured to engage signal conductor 1760a. In some embodiments, retaining members 1734a and 1734b and projections 1736a, 1736b, and 1738a may be configured to control rotation of contact tail 1706a about an axis of insertion when contact tail 1706a is compressed along the axis of insertion.

Figure 20:
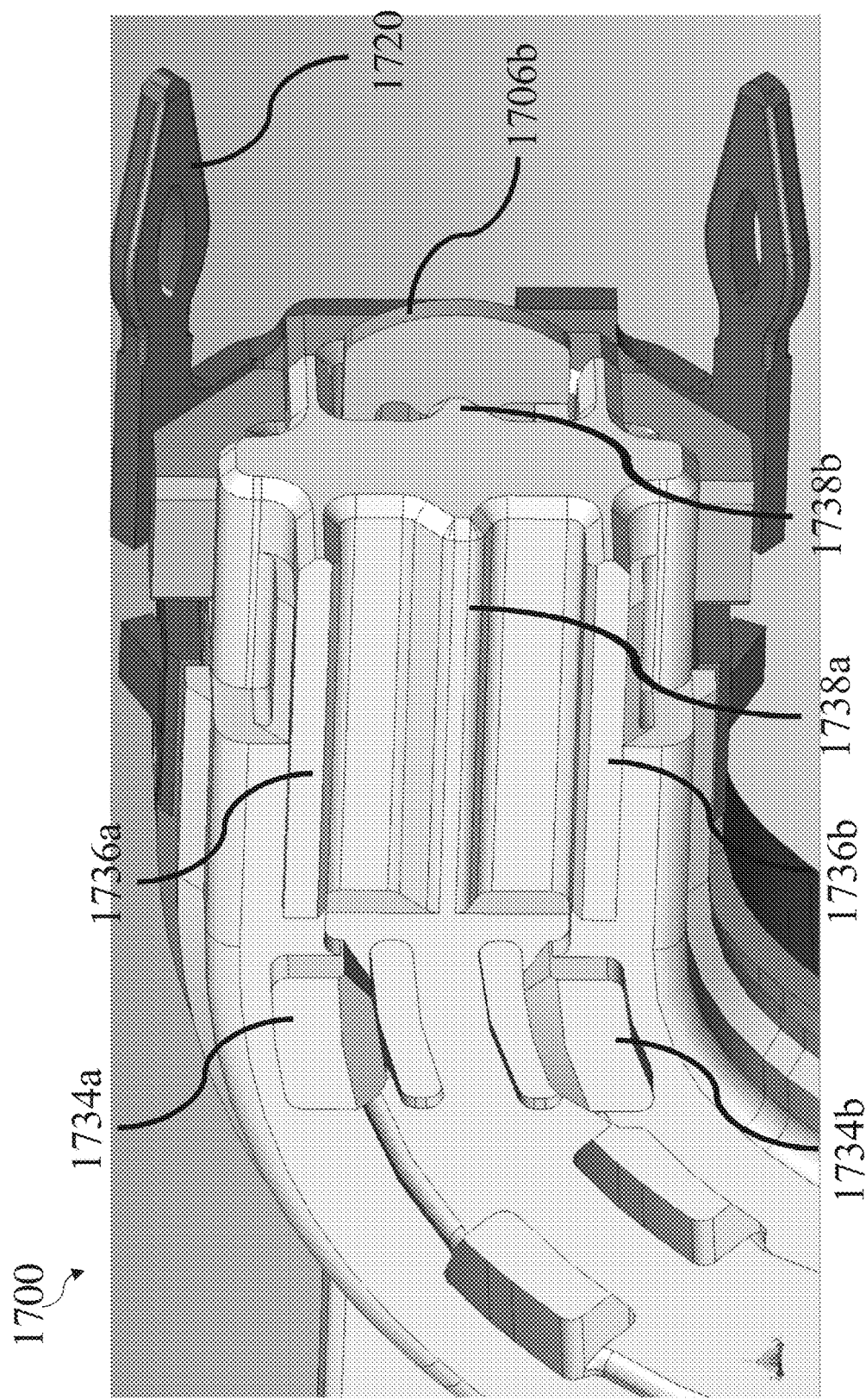
FIG. 20 is a perspective view of the portion of the connector module 1700 of FIG. 17 with electromagnetic shielding member 1710a, outer insulative member 1780a, and signal conductor 1760a cut away.

FIG. 20 is a perspective view of the portion of connector module 1700 of FIG. 19B with electromagnetic shielding member 1710a, outer insulative member 1780a, and signal conductor 1760a cut away. As shown in FIG. 20, in some embodiments, projections 1736a, 1736b, and 1738a may extend alongside contact tail 1706a in the direction of elongation of contact tail 1706a.

Figure 21A:
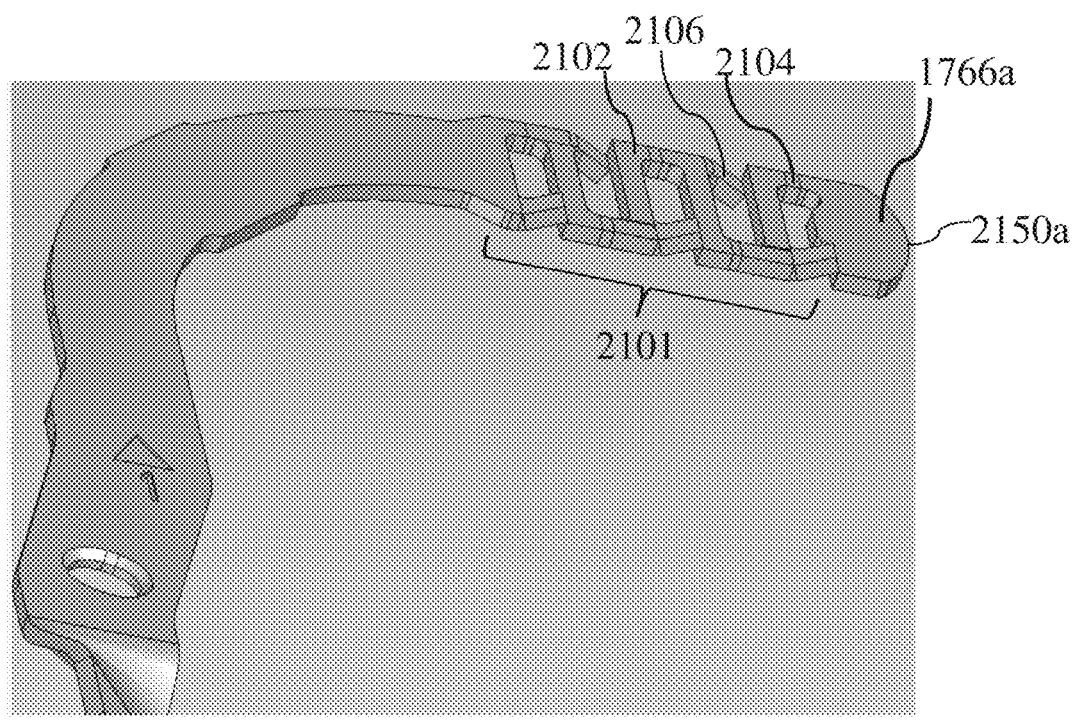
FIG. 21A is a perspective view of a portion of signal conductor 1760a of connector module 1700.
Figure 21B:
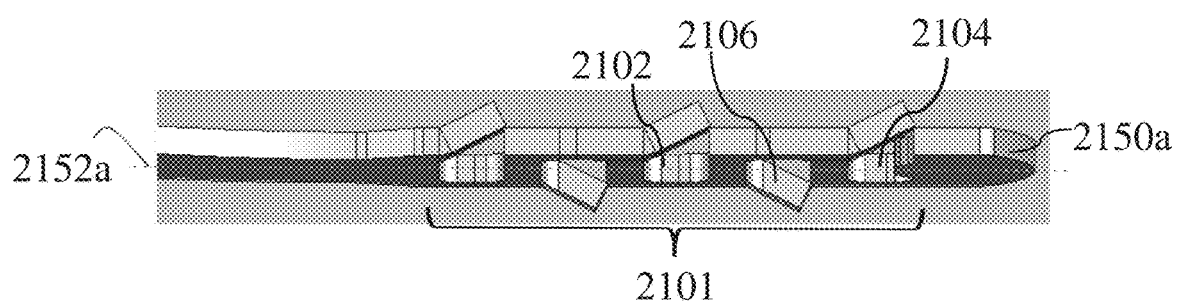

FIG. 21A is a perspective view of a portion of signal conductor 1760a of connector module 1700. FIG. 21B is a side view of compliant portion 1766a of signal conductor 1760a. In some embodiments, compliant portion 1766a may be configured in the manner described herein for compliant portion 266a including in connection with FIG. 10B. For example, in FIGS. 21A and 21B, compliant portion 1766a includes serpentine portion 2101, first bend 2102, second bend 2104, and tabs 2106. Similar to compliant portion 266a, in some embodiments, compliant portion 1766a may be configured to compress in a direction in which signal conductors 1760 are elongated proximate compliant portions 1766. In some embodiments, compliant portion 1766a may rotate when compressed (e.g., about axis 2152a).

In the embodiment of FIGS. 21A and 21B, serpentine portion 2101 resembles a ladder with the rails severed on alternating sides between each rung. The severed rails are bent into tabs 2106, which slope in opposite directions on opposite sides. In this configuration, as the contact is compressed, each rung, and a segment of the rail, at one side, can compress backwards towards the rail a severed rung behind it. The rearward edge of the severed rung will be pushed out of the plane of the contact as it rides along the slope of the tab 2106 behind it. As the tabs slope in opposite directions, opposite sides of the contact will be deflected in opposite directions normal to the plane of the undeflected contact, thus imparting rotation to the contact.

In contrast to pointed tip 1050a of compliant portion 266a, compliant portion 1766a includes rounded tip 2150a, which may include gold plating in some embodiments. In some embodiments, rounded tip 2150a may be configured to physically contact a conductive pad on a substrate over a larger area, thereby making it easier to land the rounded tip 2150a on the conductive pad during mounting, and also reducing the impedance of the mounting interface between the connector module 1700 and the conductive pad.

In some embodiments, compliant portion 1766a may have fewer than 6 bends. The inventors have recognized that including a small number of bends in a compliant portion can be advantageous because doing so makes a more reliable mounting interface. For example, in some embodiments, a pair of adjacent bends of a compliant portion failing to contact one another can cause an impedance increase as high as 7 ohms ($\Omega$), which can create impedance mismatch problems. By including fewer bends in the compliant portion, such as fewer than 8 bends, fewer than 7 bends, or fewer than 6 bends, fewer bends of the compliant portion can fail to contact one another, reducing the likelihood of such an impedance discontinuity at the mounting interface.

In some embodiments, the angle at which tabs 2106 of compliant portion 1766 slope relative to the uncompressed plane of the contact may both reduce the average magnitude and variability in any impedance discontinuity. In some embodiments, each of the tabs 2106 may slope at an angle less than 45 degree with respect to the axis 2152a. For example, by reducing the angle at which the spring portions of compliant portion 1766a are bent, such as less than 45 degrees, less than 35 degrees, or 30 degrees, it is less likely that the spring portions 2106 will fail to contact the adjacent bends of compliant portion 1766 when compliant portion 1766 is compressed, thereby additionally reducing the chance of impedance discontinuities when mounting connector module 1700 to a substrate. In accordance with some embodiments, the tabs 2106 may slope at an angle with an absolute value between 20 and 45 degrees, or in some embodiments between 25 and 40 degrees.

Returning to FIG. 10A, signal conductors 260a and 260b in each of the modules are shown broadside coupled. In a right angle connector, broadside coupling with the signal conductors of each differential pair, aligned in a row direction that parallels the edge of the PCB to which the connector is mounted, can provide desirable electrical performance. Alignment in a row direction enables both signal conductors of each pair to have the same length. In contrast, a pair of signal conductors aligned in a column direction may require signal conductors of different lengths, which can lead to skew within the pair. As skew within a pair can reduce signal integrity, alignment of the signal conductors of a pair in a row direction may promote signal integrity. As illustrated, for example in FIGS. 6A and 6B, connector modules as described herein may be incorporated into a connector with the broadside coupled signal couples aligned in a row direction.

The inventors have recognized and appreciated, however, that a configuration for efficient routing of traces out of the connector footprint of a PCB to which such a connector is mounted may not be compatible with broadside coupled signal conductors within a connector, using conventional connector mounting techniques. An efficient configuration of a PCB may have pairs of signal vias aligned in a vertical direction perpendicular to an edge of the PCB. Frequently, in an electronic system, a connector is mounted to an edge of the PCB and other components, to which the connector is connected with traces in the PCB, are mounted at the interior portion of the PCB. To make connections between the connector and these components, traces within the PCB may be routed from the vias that couple to signal conductors of the connector in a direction perpendicular to the edge of the PCB. However, for a connector footprint, traces are conventionally routed in routing channels parallel to the direction in which the signal vias are separated. Such routing results from the vias to which the signal conductors are attached being separated in the same direction as the signal conductors.

Conventionally, the ends of signal conductors in a connector align with vias in the PCB to which the connector is mounted. For a connector with broadside coupled signal conductors in each pair aligned in the row direction, the corresponding signal vias in the PCB extend in a direction parallel to the edge, rather than perpendicular to it. As a result, broadside coupling to achieve low skew within a connector conventionally results in routing channels within the connector footprint parallel to the edge, which for some systems may not be efficient.

The inventors have recognized and appreciated, that, notwithstanding a broadside coupled connector with signal conductors of each pair separated in a row direction, the signal vias coupled to those signal conductors may be positioned for more efficient routing channels perpendicular to the edge. That configuration may be enabled by a transition of the orientation of the signal conductors within the top layers of the PCB.

Figures 11A, 11B, 11C:
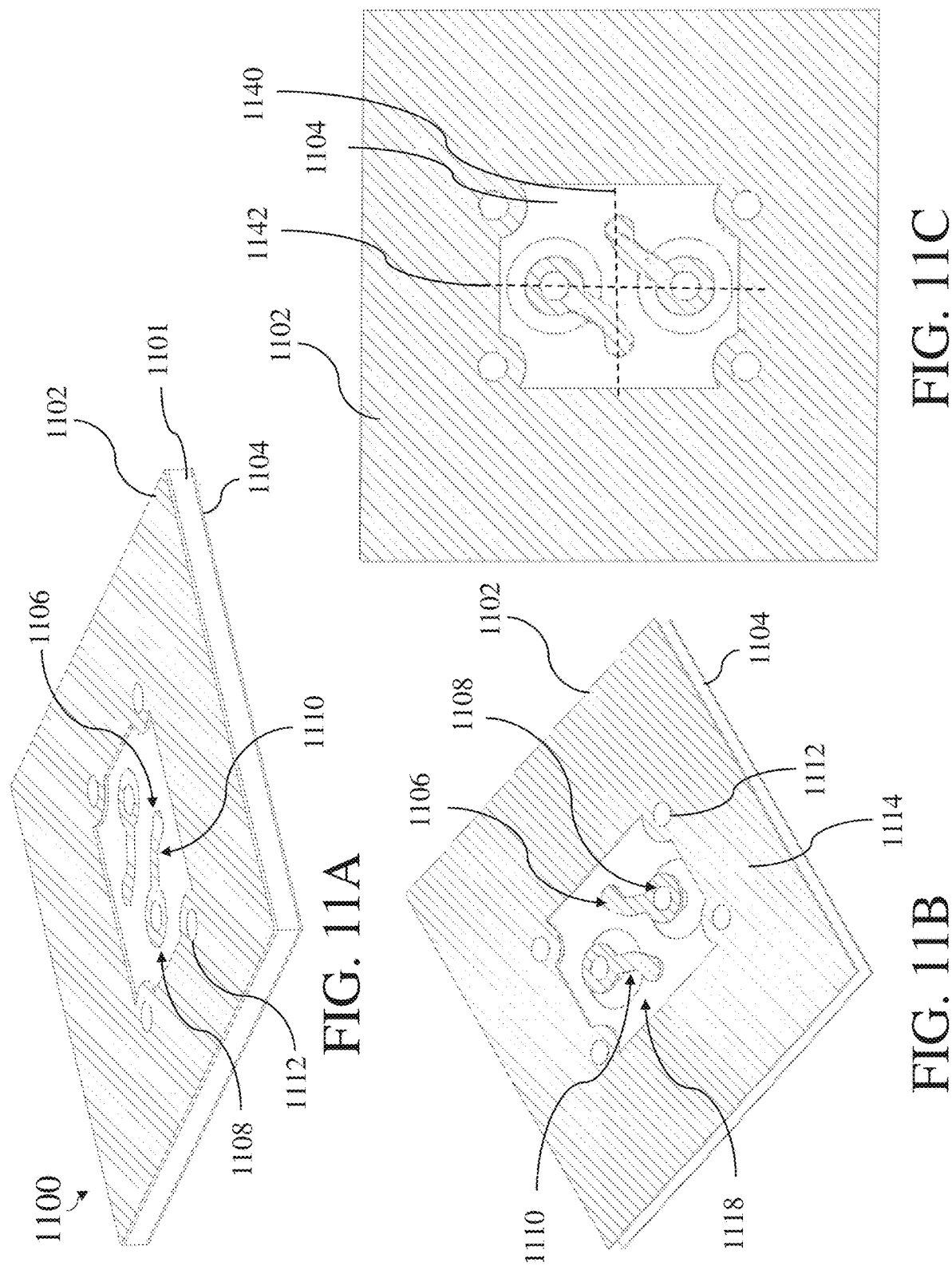
FIG. 11A is a side perspective view of a portion of a substrate configured for receiving a portion of an electrical connector, in accordance with some embodiments.
FIG. 11B is a top perspective view of a top conductive layer and a lower ground layer of substrate 1100 of FIG. 11A.
FIG. 11C is a top view of the layers of substrate 1100 shown in FIG. 11B.

FIGS. 11A-11C are a side perspective view, a top perspective view, and a top view, respectively, of a portion of a substrate 1100 configured for receiving an electrical connector using an edge-to-pad mounting for signal conductors. For instance, substrate 1100 may be configured for connecting to electrical connectors 302a or 302b of FIGS. 3A-3D. The portion illustrated in FIGS. 11A, 11B and 11C may correspond to the structures in the substrate that connect with the tails of signal conductors and shields of a connector module. Accordingly, the illustrated portion may correspond to the footprint for one module, and may be replicated for each like module of a connector that is mounted to the substrate.

In some embodiments, substrate 1100 may be a printed circuit board. FIGS. 11A, 11B and 11C illustrate only two layers of a printed circuit board where a transition region is implemented. The printed circuit board may have other layers on which signal traces are routed and other ground layers to separate those layers, which are not illustrated for simplicity.

Substrate 1100 includes first conductive layer 1102 and second conductive layer 1104 separated from first conductive layer 1102 by an insulative layer 1101. For example, first and second conductive layers 1102 and 1104 may be disposed on opposing surfaces of insulative layer 1101. Substrate 1100 may also include one or more vias, such as vias 1108 and 1112. Substrate 1100 may include an array of the portion illustrated in FIGS. 11A-11C, and/or additional conductive layers, such as a third conductive layer, as described herein including with reference to FIGS. 12A-12D.

Conductive layers of substrate 1100 may be configured for coupling to an electrical connector. For instance, first conductive layer 1102, which may be a top-most layer of substrate 1100, includes conductive contact pads 1106 that may be configured for attaching and/or electrically connecting to contact tails of an electrical connector. As shown in FIGS. 11A-11C, contact pads 1106 may be configured to receive pairs of contact tails carrying components of a differential signal and to provide the differential signal components to vias 1108. In this example, the contact pads 1106 may be positioned to align with a distal edges of the contact tails of a pair of signal conductors configured for broadside coupling in the connector, such as is illustrated in FIG. 10A-10C. Contact pads 1106 may be exposed to facilitate physical contact between contact pads 1106 and the contact tails of the connector when mounted. The contact pads may be plated with gold or other noble metal, or other plating that resists oxidation for a reliable pressure mount connection.

In one example, contact tails of a connector may be pressure-mounted to contact pads 1106 (e.g., compliant portions 266 of FIGS. 10A-10C). In another example, contact tails of a connector may be soldered to contact pads 1106 using butt joints. In some embodiments, contact pads 1106 may have a diameter between 10 and 14 mils or between 11 and 13 mils in some embodiments.

Portions of first conductive layer 1102 may be configured for contacting a ground structure of a connector mounted to substrate 1100. For instance, some locations of ground plane portion 1114 may be configured to receive electromagnetic shielding tails of the electrical connector. Such portions may be exposed to facilitate physical contact between the exposed portions and the shielding tails when the connector is mounted. In the illustrated embodiment, connection is made with press-fit contact tails extending from the shields of each module. The shielding contact tails may be inserted into vias 1112.

Ground plane portion 1114 may be electrically connected to vias 1112, such that vias 1112 are ground vias. Signal vias 1108 may be electrically isolated from ground portion 1114. As shown, vias 1108 are within openings of ground plane portion 1114. Similar openings in other ground plane layers within the printed circuit board may be provided concentric with signal vias 1108 that may separate vias 1108 from the ground structures of substrate 1100. In contrast, ground vias 1112 may be electrically coupled to second conductive layer 1104, which may also be grounded. In some embodiments, ground vias 1112 may have a drilled diameter of less than 16 mils, but greater than 10 mils, to accommodate a press-fit.

Signal vias 1108 may be electrically coupled to a third and/or additional conductive layers of substrate 1100, which may serve as signal routing layers. A third conductive layer having signal traces coupled to vias 1108 (FIGS. 12A-12D) may be positioned adjacent second conductive layer 1104, such as having a second insulative layer positioned between the second and third conductive layers, or additional insulative layers may be positioned between the second and third conductive layers.

In some embodiments, vias 1108 may have a drilled diameter of less than 10 mils. In some embodiments, vias 1108 may have a drilled diameter between 7 and 9 mils. As shown in FIGS. 11A-11C, contact pads 1106 are spaced from one another along first line 1140, and vias 1108 are spaced from one another along second line 1142. In some embodiments, first line 1140 and second line 1142 may be disposed at an angle of at least 45 degrees with respect to one another. For example, in FIGS. 11A-11C, first line 1140 and second line 1142 are perpendicular to one another. Line 1140, for example, may be parallel to an edge of the PCB adjacent the illustrated footprint. Line 1142 may be perpendicular to the edge.

Conductive traces 1110 connect contact pads 1106 to vias 1108. In the illustrated embodiment, conductive traces 1110 are elongated at an angle of about 45 degrees with respect to second line 1142. The conductive traces 1110 may serve to gradually transition the relative positioning of contact pads 1106 to the relative positioning of vias 1108. Portions 1118 of second conductive layer 1104 may be positioned adjacent conductive traces 1110, with insulative layer 1101 separating portions 1118 from conductive traces 1110.

In some embodiments, second conductive layer 1104 may be spaced within a few millimeters of first conductive layer 1102 so as to provide a ground reference for the conductive traces 1110. Portions 1118 may accommodate the transition from the relative positioning of contact pads 1106 to the relative positioning of vias 1108. A ground reference, coupled to both the shields within the connector that serve as reference for the signal conductors in the connector and the ground planes that serve as a ground reference for traces within the substrate, enables continuity of ground current referenced to the path carrying the differential signal throughout the transition. Such a ground reference further promotes transition of the signal paths without mode conversion or other undesired signal integrity characteristics. Avoiding mode conversion for a connector module with shields per pair may avoid exciting resonances within the shields of the module and provide improved signal integrity. Moreover, the straight-through configuration of the mounting ends of the signal conductors (as illustrated above in FIG. 10A, for example) enables the largest dimension of the shield to be smaller than if a transition or other geometry change were included in the module. In the illustrated embodiment, the shields may be substantially square for each connector module. Such a configuration may provide for a high frequency of the lowest resonant mode supported by the shields, which further contributes to high frequency operation of the connector.

For example, signal conductors of a mounted connector may be broadside coupled to one another adjacent substrate 1100, with the signal conductors spaced from one another along first line 1140. Rather than transitioning the broadside coupled signal conductors to edge coupled contact tails for mounting to substrate 1100, the connector may have broadside coupled contact tails, and the transition may be achieved using traces 1110, such that the signals are edge coupled at vias 1108. In some embodiments, an electrical connector mounted to substrate 1100 may transmit differential signals with less than −40 dB of suck out loss over the frequency range of 25 GHz to 56 GHz.

FIGS. 12A-12D illustrate portions of an exemplary substrate 1200 including an array of the portions of substrate 1100 illustrated in FIGS. 11A-11C. FIG. 12A is a top view of first conductive layer 1202 of substrate 1200, FIG. 12B is a top view of a second conductive layer 1204 of substrate 1200, FIG. 12C is a top view of a third conductive layer 1220 of substrate 1200, and FIG. 12D is a cross-sectional view of a portion of substrate 1200 illustrating insulative layer 1201 and conductive layers 1202, 1204, and 1220.

In FIG. 12A, first conductive layer 1202 includes a connector footprint having regions disposed in rows along row direction 1240 and columns along column direction 1242. Each region of the connector footprint may include the portion of conductive layer 1102 illustrated in FIGS. 11A-11C. For instance, as shown in FIGS. 12A, each region includes a pair of signal vias 1208 and a pair of conductive contact pads 1206, and traces 1210 interconnecting ones of the pairs of signal vias 1208 with ones of the pairs of contact pads 1206. Vias 1208, contact pads 1206, and traces 1210 may be configured in the manner described herein for vias 1108 contact pads 1106, and traces 1110, respectively, including with reference to FIGS. 11A-11C. Also, signal vias 1208 of each pair are shown separated from one another along column direction 1242, and contact pads are shown separated from one another along row direction 1240. Conductive layer 1202 is also shown including ground vias 1212. FIG. 12B shows second conductive layer 1204, which is disposed on an opposite side of insulative layer 1201 from first conductive layer 1202.

Spacing between vias 1208 and/or ground vias 1212 on substrate 1200 may be adapted to match the spacing of pairs of contact tails and/or electromagnetic shielding tails of electrical connector 102, for example. Accordingly, closer spacing between signal conductors and/or smaller spacing between signal conductors and ground conductors will yield a more compact footprint. Alternatively or additionally, more space will be available for routing channels. Further, closer spacing may enable the largest dimension of the shielding enclosure for a module to be mounted to the footprint to be reduced, thereby increasing the operating frequency range of the connector.

In some embodiments, contact tails of electrical connector 102 (or 302a, 302b, etc.) may be implemented with superelastic conductive materials, which may enable smaller vias and closer spacing between adjacent pairs than for conventional contact tails.

Such close spacing may be achieved, by thin contact tails, such as may be implemented with superelastic wires of a diameter less than 10 mils, for example. In some embodiments, contact tails of connectors described herein may be configured to be inserted into plated holes formed with an unplated diameter of less than or equal to 20 mils. In some embodiments, the contact tails may be configured to be inserted into vias drilled with an unplated diameter of less than or equal to 10 mils. In some embodiments, the contact tails may each have a width between 6 and 20 mils. In some embodiments, the contact tails may each have a width between 6 and 10 mils, or between 8 and 10 mils in other embodiments. In some embodiments, each region of the connector footprint may have an area of less than 2.5 mm$^2$. For instance, columns of the connector footprints may be separated center-to-center by less than 2.5 mm in column direction 1242, and rows of the connector footprint my be separated center-to-center by less than 2.5 mm in row direction 1240.

FIG. 12C shows third conductive layer 1220, which may be a routing layer of substrate 1220. For example, as shown in the schematic cross section of FIG. 12D, some or all of the signal vias 1208 may connect to third conductive layer 1220, and traces 1230 may route signals from vias 1208 to other portions of substrate 1220. For example, third conductive layer may support connections to one or more electronic devices, such as microprocessors and/or memory devices, and/or other electrical connectors, mounted in the central portion of the PCB and to which traces 1230 may connect. The signal vias 1208 may terminate at the routing layer at which they connect. Such a configuration may be achieved by back-drilling the portions of the signal vias that extend beyond the routing layer. Ground vias 1212 may also extend partially into the PCB, for example extending only so far as is necessary to receive a press-fit. However, in other embodiments, the signal and or ground vias may extend further into the PCB than illustrated in FIG. 12D.

As shown in FIG. 12C, traces 1230 may extend in column direction 1242 between pairs of vias 1208 in adjacent ones of the columns, perpendicular to edge 1209 of the board to which the connector footprint is adjacent. As can be seen in FIG. 12C, each routing layer supports a routing channel wide enough for two pairs of traces to be routed through that channel. In some embodiments, a connector footprint may have one routing layer for every two rows that must be routed out of the footprint. As adding routing layers in a printed circuit board may increase cost, efficient routing of two rows per layer may lead to lower cost PCBs.

Figure 22:
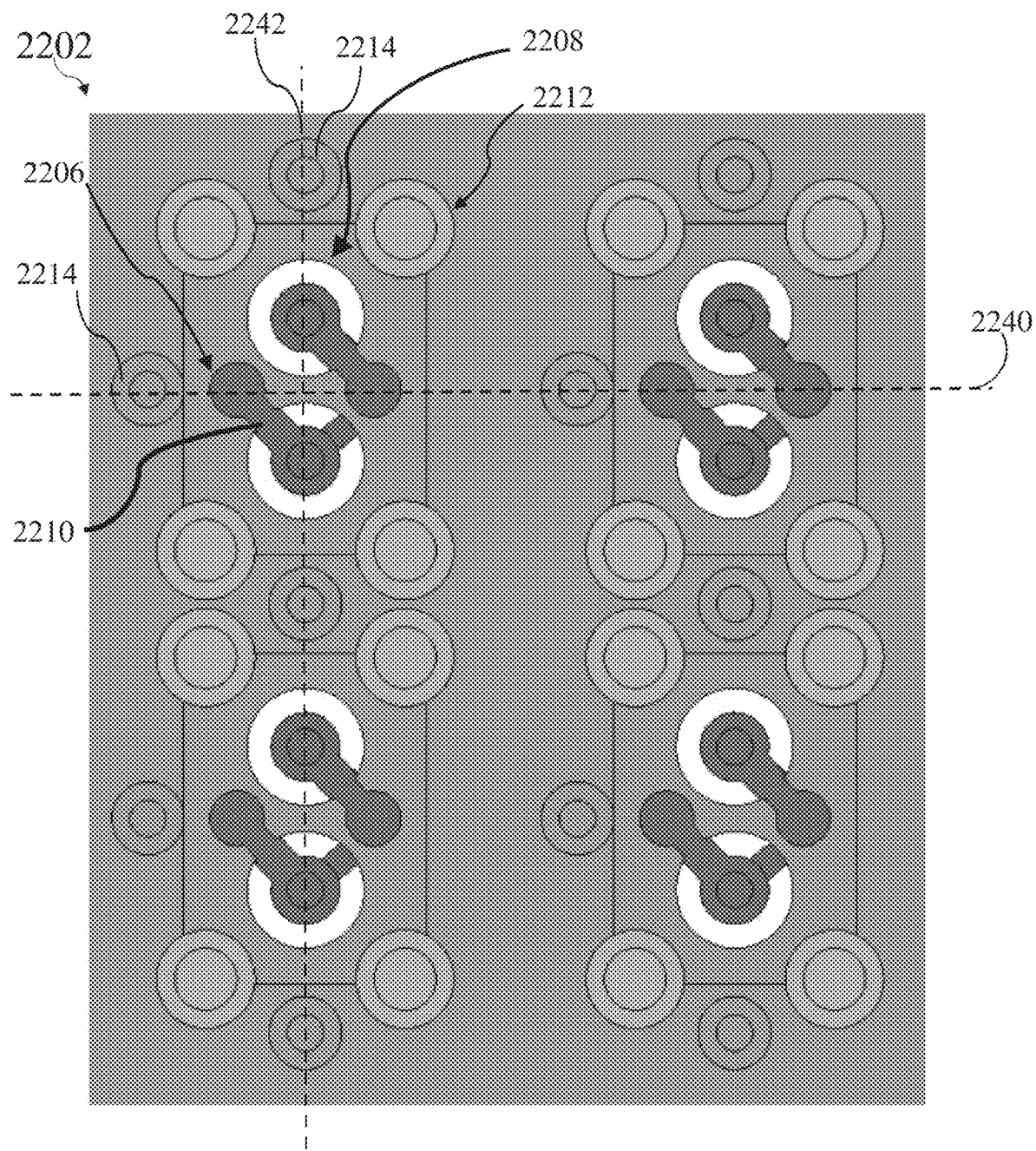
FIG. 22 is a top view of a top view of a first conductive layer 2202 of an alternative substrate 2200 configured for receiving a portion of an electrical connector, in accordance with some embodiments.

FIG. 22 is a top view of a top view of a portion of a conductive layer 2202 of an alternative substrate configured for receiving a portion of an electrical connector, in accordance with some embodiments. In some embodiments, conductive layer 2202 may be configured in the manner described herein for conductive layer 1202 including in connection with FIGS. 12A to 12C. For example, in some embodiments, the substrate that includes conductive layer 2202 may also include a second conductive layer configured in the manner described herein for second conductive layer 1204 including in connection with FIG. 12B and/or a third conductive layer configured in the manner described herein for third conductive layer 1220 including in connection with FIG. 12C.

As shown in FIG. 22, conductive layer 2202 includes a connector footprint having regions disposed in rows along row direction 2240 and columns along column direction 2242. Each region is shown in FIG. 22 including a pair of signal vias 2208 and a pair of conductive contact pads 2206, with traces 2210 interconnecting ones of the pairs of signal vias 2208 with ones of the pairs of contact pads 2206. Conductive layer 2202 is also shown including ground vias 2212. Also shown in FIG. 22, conductive layer 2202 includes auxiliary vias 2214 positioned on three sides of signal vias 2208. In some embodiments, auxiliary vias 2214 may be configured to provide additional electromagnetic shielding between adjacent pairs of signal vias 2208. For example, auxiliary vias 2214 may extend from conductive layer 2202 to a second and/or third conductive layer of the substrate. In some embodiments, auxiliary vias 2214 may have a smaller diameter than ground vias 2212, which may allow for positioning of auxiliary vias 2214 in places too small to accommodate a ground via 2212. For example, in some embodiments, ground vias 2212 may have a drilled diameter of less than 16 mils and greater than 10 mils, and auxiliary vias 2214 may have a drilled diameter of less than 10 mils, such as less than 8 mils and greater than 5 mils.

Figure 23:
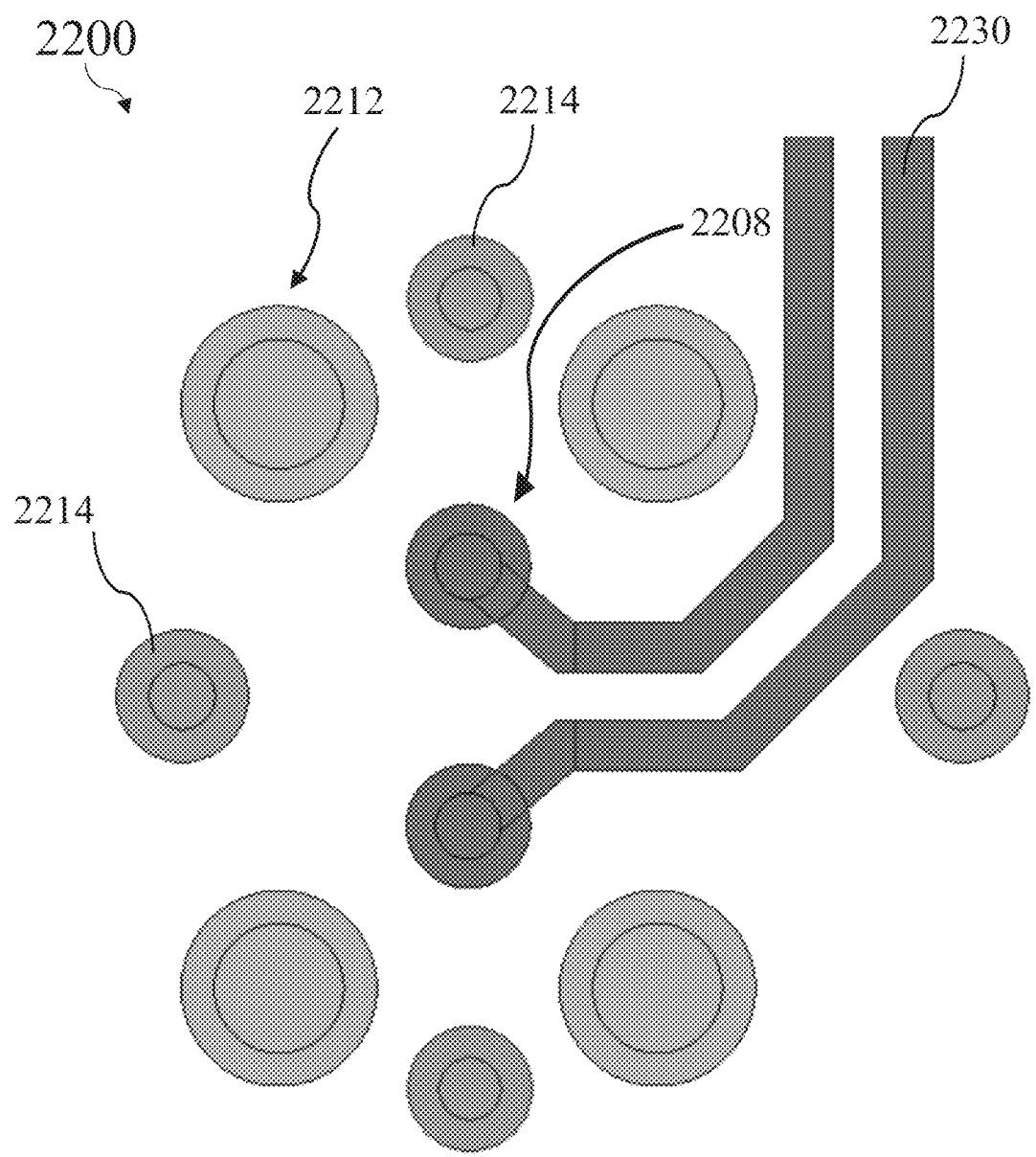
FIG. 23 is a top view of a portion of the substrate 2200 that includes first conductive layer 2202 of FIG. 22.

FIG. 23 is a top view of a region of the substrate 2200 that includes conductive layer 2202 of FIG. 21. In FIG. 23, conductive layer 2202 further includes conductive traces 2130 that may be configured in the manner described herein for traces 1230 including in connection with FIG. 12C. For example, in some embodiments, traces 2230 may be disposed on a third conductive surface of the substrate 2200 and include the signal vias 2208 extending from the conductive layer 2202 shown in FIG. 22. As shown in FIG. 23, the second conductive layer of the substrate 2200 including a ground plane has been hidden from view to show the positioning of traces 2230 relative to signal vias 2208, ground vias 2212, and auxiliary vias 2214. For example, in FIG. 23, traces 2230 are routed between two ground vias 2212 and then between a ground via 2212 and an auxiliary via 2214. In some embodiments, the illustrated configuration may provide increased shielding for traces 2230.

Figure 13B:
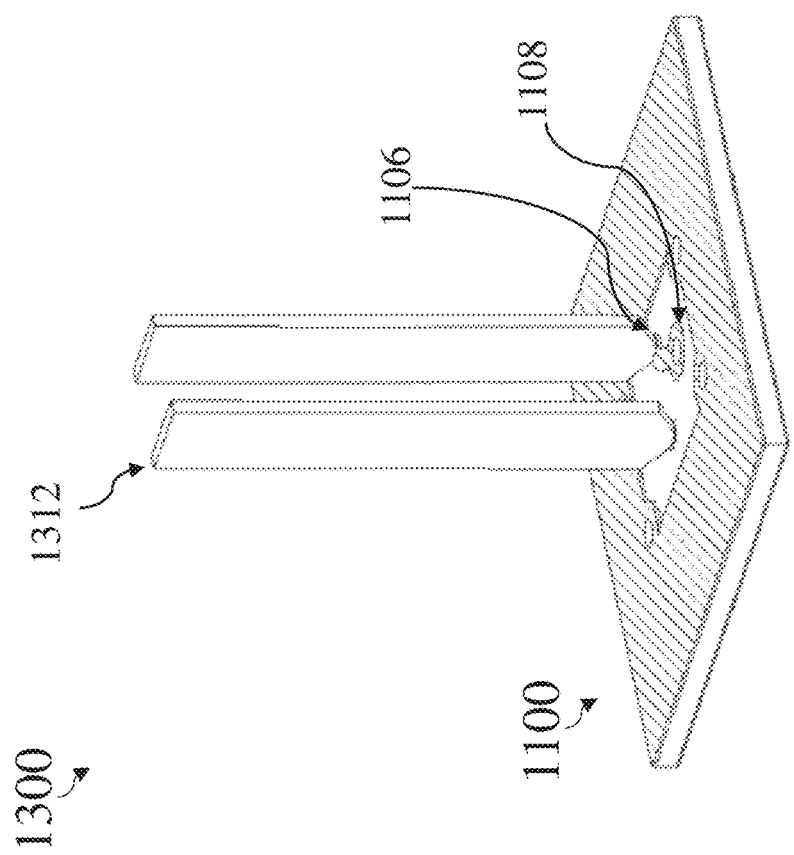
FIG. 13B is a perspective view of the electronic assembly 1300 of FIG. 13A.
Figure 13A:
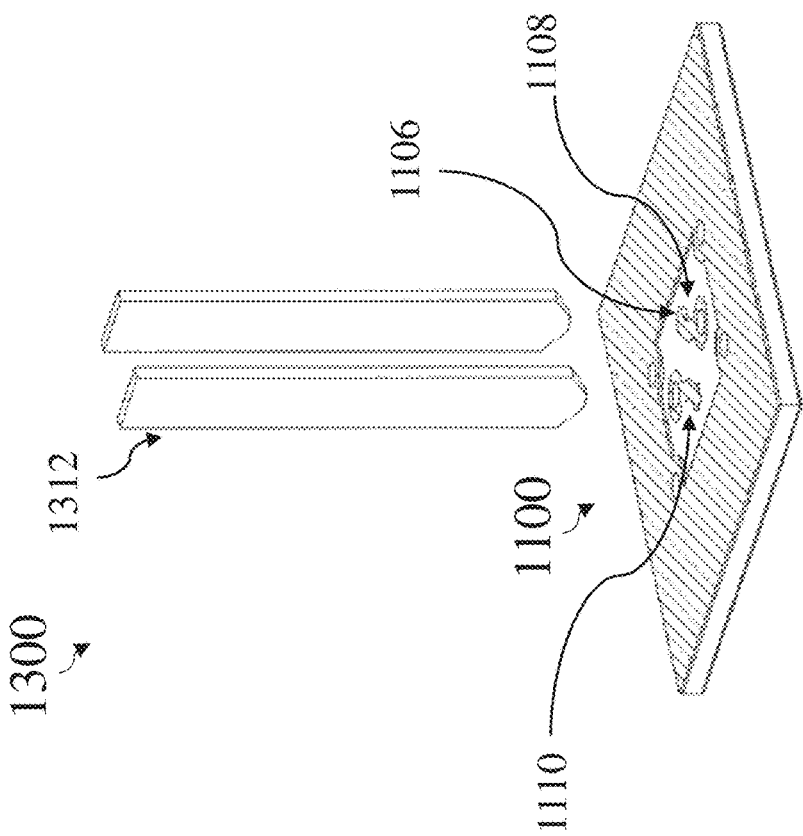
FIG. 13A is an exploded view of an electronic assembly 1300 including substrate 1100 of FIG. 11A and a pair of contact tails of an electrical connector.

FIGS. 13A-13B illustrate a portion of an electronic assembly 1300 that includes an electrical connector and substrate 1100. FIG. 13A is an exploded view with contact tails 1312 of the electrical connector shown away from substrate 1100. FIG. 13B shows the contact tails 1312 together with contact pads 1106 and connected to vias 1108 substrate 1100. Contact tails 1312 may be configured for edge-to-pad mounting. In some embodiments, contact tails 1312 may be configured for pressure mounting. In some embodiments, contact tails 1312 may be configured to mount contact pads 1106 using butt joints that are soldered in place.

Using such edge-to-pad connections for the signal conductors of each pair enables broadside coupling within a compact shield. FIGS. 14A-14B are partially exploded views, and FIGS. 14C-D are perspective views of the electronic assembly 1300 with portions of shielding member 1320 cut away. FIGS. 14A-14B further illustrate shielding member 1320 of the electrical connector, which is disposed around contact tails 1312. For instance, shielding member 1320 and contact tails 1312 may be part of a same connector module of the electrical connector. In FIG. 14A, shielding member 1320 is shown separated from substrate 1100, while contact tails 1312 are shown pressing against contact pads 1106 of substrate 1100. In FIG. 14B, both shielding member 1320 and contact tails 1312 are shown separated from substrate 1100. In each case, the distal portion of the contact tails extending from shielding member 1320 are not illustrated. The distal ends may be press-fits as described above. Alternatively or additionally, the distal ends may make electrical connections to ground structures in the substrate 1100 in other ways, such as using pressure mounts, or surface mount soldering.

FIGS. 14A and 14B illustrate a single shielding member 1320 surrounding the pair of signal conductors. The shielding around each differential pair may be interrupted with one or more slots, such as slots 1450, over some or all of the length of the signal conductors. Here, the slots are shown aligned with the midpoint of the differential pair. Such slots may be formed, for example, by cutting away material in a unitary member. Alternatively or additionally, the slots may be formed by forming the shielding member 1320 in multiple pieces that collectively partially surround the pair, leaving the slots as illustrated.

In FIG. 14C a portion of shielding member 1320 is cut away, showing shielding tails 1322 of shielding member 1320 connected to portion 1114 of substrate 1100, which may be a ground plane.

In FIG. 14D, a portion of shielding member 1320 and half of each contact tail 1312 are cut away, showing contact tails 1312 connected to contact pad 1106.

FIG. 15 illustrates a header connector 2120, such as might be mounted to a printed circuit board formed with modules 2130 that may be formed using construction techniques as described above. In this example, header connector 2120 has a mating interface that is the same as the mating interface of connector 102a. In the illustrated embodiment, both have mating ends of pairs of signal conductors aligned along parallel lines angled at 45 degrees relative to column and/or row directions of the mating interface. Accordingly, header connector 2120 may mate with a connector in the form of connector 102b.

The mounting interface 2124 of header connector 2120, however, is in a different orientation with respect to the mating interface than the mounting interface of connector 102a. Specifically, mounting interface 2124 is parallel to mating interface 2122 rather than perpendicular to it. Nonetheless, the mounting interface may include edge-to-pad connections between signal conductors and a substrate, such as PCB. The signal conductors may support broadside coupling such that shielding may be configured to inhibits low frequency resonances as described above.

Header connector 2120 may be adapted for use in backplane, mid-board, mezzanine, and other such configurations. For example, header connector 2120 may be mounted to a backplane, a midplane or other substrate that is perpendicular to a daughtercard or other printed circuit board to which a right angle connector, such as connector 102b, is attached. Alternatively, header connector 2120 may receive a mezzanine connector having a same mating interface as connector 102b. The mating ends of the mezzanine connector may face a first direction and the contact tails of the mezzanine connector may face a direction opposite the first direction. For example, the mezzanine connector may be mounted to a printed circuit board that is parallel to the substrate onto which header connector 2120 is mounted. In some embodiments, contact tails of header connector 2120 may be configured to compress in a direction in which header connector 2120 is attached or mounted to a substrate.

In the embodiment illustrated in FIG. 15, header connector 2120 has a housing 2126, which may be formed of an insulative material such as molded plastic. However, some or all of housing 2126 may be formed of lossy or conductive material. The floor of housing 2126, though which connector modules pass, for example, may be formed of or include lossy material coupled to electromagnetic shielding of connector modules 2130. As another example, housing 2126 may be die cast metal or plastic plated with metal.

Housing 2126 may have features that enable mating with a connector. In the illustrated embodiment, housing 2126 has features to enable mating with a connector 102b, the same as housing 120. Accordingly, the portions of housing 2126 that provide a mating interface are as described above in connection with housing 120 and FIG. 2A. The mounting interface 2124 of housing 2126 is adapted for mounting to a printed circuit board.

Such a connector may be formed by inserting connector modules 2130 into housing 2126 in rows and columns. Each module may have mating contact portions 2132a and 2132b, which may be shaped like mating portions 304a and 304b, respectively. Mating contact portions 2132a and 2132b may similarly be made of small diameter superelastic wires.

Modularity of components as described herein may support other connector configurations using the same or similar components. Those connectors may be readily configured to mate with connectors as describe herein. FIG. 16, for example, illustrates a modular connector in which some of the connector modules, rather than having contact tails configured for mounting to a printed circuit board, are configured for terminating a cable, such as a twin-ax cable.

Those portions of the connector configured for mounting to a PCB, however, may use edge-to-pad mounting techniques as described herein for high frequency operation.

In the example of FIG. 16, a connector has a wafer assembly 2204, a cabled wafer 2206 and a housing 2202. In this example, cabled wafer 2206 may be positioned side-by-side with the wafers in wafer assembly 2204 and inserted into housing 2202, in the same way that wafers are inserted into a housing 110 or 120 to provide a mating interface with receptacles or pins, respectively. In alternative embodiments, the connector of FIG. 16 may be a hybrid-cable connector as shown with wafer assembly 2204 and cabled wafer 2206 side by side or, in some embodiments, with some modules in the wafer having tails configured for attachment to a printed circuit board and other modules having tails configured for terminating a cable.

With a cabled configuration, signals passing through that mating interface of the connector may be coupled to other components within an electronic system including connector 2200. Such an electronic system may include a printed circuit board to which connector 2200 is mounted. Signals passing through the mating interface in modules mounted to that printed circuit board may pass over traces in the printed circuit board to other components also mounted to that printed circuit board. Other signals, passing through the mating interface in cabled modules may be routed through the cables terminated to those modules to other components in the system. In some system, the other end of those cables may be connected to components on other printed circuit boards that cannot be reached through traces in the printed circuit board.

In other systems, those cables may be connected to components on the same printed circuit board to which the other connector modules are mounted. Such a configuration may be useful because connectors as described herein support signals with frequencies that can be reliably passed through a printed circuit board only over relatively short traces. High frequency signals, such as signals conveying 56 or 112 Gbps, are attenuated significantly in traces on the order of 6 inches long or more. Accordingly, a system may be implemented in which a connector mounted to a printed circuit board has cabled connector modules for such high frequency signals, with the cables terminated to those cabled connector modules also connected at the mid-board of the printed circuit board, such as 6 or more inches from the edge or other location on the printed circuit board at which the connector is mounted. In some embodiments, contact tails of the connector of FIG. 16 may be configured to compress in a direction in which the connector is mounted or attached to a substrate.

In the example of FIG. 16, the pairs at the mating interfaces are not rotated with respect to the row or column direction. But a connector with one or more cabled wafers may be implemented with rotation of the mating interface as described above. For example, mating ends of the pairs of signal conductors may be disposed at an angle of 45 degrees relative to mating row and/or mating column directions. The mating column direction for a connector may be a direction perpendicular to board mounting interface, and the mating row direction may be the direction parallel to the board mounting interface.

Further, it should be appreciated that, though FIG. 16 shows that cabled connector modules are in only one wafer and all wafers have only one type of connector module, neither is a limitation on the modular techniques described herein. For example, the top row or rows of connectors modules may be cabled connector modules while the remaining rows may have connector modules configured for mounting to a printed circuit board.

Having thus described several aspects of at least one embodiment of this invention, it is to be appreciated that various alterations, modifications, and improvements will readily occur to those skilled in the art.

For example, the connector modules 200 in FIGS. 6B to 10C are shown including signal conductors 260 including compliant portions 266 and electromagnetic shielding members 210 including electromagnetic shielding tails 220 configured as press-fit ends, and the connector module 1700 in FIGS. 17 to 20B is shown including signal conductors 1760 including compliant portions 1766 and electromagnetic shielding members 1710 including electromagnetic shielding tails 1720 configured as press-fit ends. It should be appreciated, however, that the electromagnetic shielding tails 220 and/or 1720 may alternatively or additionally include compliant portions (e.g., configured in the manner described herein for compliant portions 266 and/or 1766). According to various embodiments, connector modules described herein may include complaint signal portions and press-fit shielding tails, compliant shielding tails and press-fit signal portions, and/or compliant shielding tails and compliant signal portions.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A substrate, comprising:
an insulative layer comprising a surface;
a pair of signal vias;
a pair of signal contact pads disposed on the surface, wherein contact pads of the pair are spaced from one another along a first line; and
conductive traces disposed on the surface and electrically coupling respective contact pads of the pair of contact pads and signal vias of the pair of signal vias,
wherein signal vias of the pair of signal vias are spaced from one another along a second line disposed at an angle of at least 45 degrees with respect to the first line.

2. The substrate of claim 1, wherein the angle is 90 degrees.

3. The substrate of claim 1, wherein:
the substrate further comprises a ground plane on the surface, the ground plane comprising an opening;
the pair of signal contact pads and the pair of signal vias are within the opening; and
the substrate further comprises a plurality of ground vias electrically coupled to the ground plane.

4. The substrate of claim 3, wherein the ground vias have a drilled diameter of less than 16 mils.

5. The substrate of claim 3, wherein the ground plane comprises a plurality of portions exposed for physically contacting a ground structure of a connector mounted to the substrate.

6. The substrate of claim 1, wherein the signal vias have a drilled diameter of less than 10 mils.

7. The substrate of claim 1, wherein the signal vias have a drilled diameter between 7 and 9 mils.

8. The substrate of claim 1, wherein the signal contact pads have a diameter between 10 and 14 mils.

9. A substrate comprising a connector footprint, wherein the connector footprint comprises a plurality of regions disposed in rows and columns, each region comprising:
a pair of signal vias, wherein signal vias of the pair are separated from one another along a first direction;
a pair of conductive pads, wherein conductive pads of the pair are separated from one another along a second direction that is orthogonal to the first direction; and
conductive traces interconnecting respective ones of the signal vias and conductive pads.

10. The substrate of claim 9, further comprising:
routing channels extending in the first direction between pairs of signal vias in adjacent columns.

11. The substrate of claim 10, wherein each region further comprises:
a plurality of ground vias.

12. The substrate of claim 10, further comprising an edge, wherein:
the connector footprint is adjacent the edge; and
the first direction is perpendicular to the edge.

13. The substrate of claim 9, wherein:
each region of the plurality of regions has an area of less than 2.5 mm$^2$.

14. The substrate of claim 9, wherein:
regions of the plurality of regions are separated, center-to-center, in the first direction by less than 2.5 mm.

15. The substrate of claim 9, wherein:
regions of the plurality of regions are separated, center-to-center, in the second direction by less than 2.5 mm.

16. An electronic assembly comprising:
a substrate comprising a plurality of conductive pads on a surface of the substrate and a plurality of vias, wherein the conductive pads are connected to signal traces within the substrate and the vias are connected to ground structures within the substrate; and
a connector mounted to the substrate, wherein:
the connector comprises a plurality of signal conductors and a plurality of shielding members at least partially surrounding subsets of the plurality of signal conductors;
the signal conductors comprise contact tails comprising broad sides and edges and the edges are facing and connected to respective ones of the plurality of conductive pads;
the plurality of shielding members comprise contact tails inserted within respective vias of the plurality of vias.

17. The electronic assembly of claim 16, wherein:
the contact tails are connected to respective ones of the plurality of conductive pads with soldered butt joints.

18. The electronic assembly of claim 16, wherein:
the contact tails are connected to respective ones of the plurality of conductive pads with a pressure mount connection.

19. The substrate of claim 3, wherein the plurality of ground vias comprises a first ground via having a first drilled diameter and a second ground via having a second drilled diameter different from the first drilled diameter.

20. The substrate of claim 19, wherein the first ground via is exposed for physically contacting a ground structure of a connector mounted to the substrate.

21. The substrate of claim 19, wherein the second ground via is spaced from the pair of signal contact pads along the first line.

22. The substrate of claim 19, wherein the second ground via is spaced from the pair of signal vias along the second line.

23. The substrate of claim 3, wherein:
the pair of signal contact pads, the conductive traces, and the ground plane comprise a first conductive layer of the substrate;
the ground plane is a first ground plane; and
the substrate further comprises a second conductive layer comprising a second ground plane that is electrically coupled to the first ground plane by the plurality of ground vias.

24. The substrate of claim 23, further comprising a third conductive layer comprising a plurality of conductive traces electrically coupled to respective ones of the conductive traces of the first conductive layer by the pair of signal vias, wherein the pair of signal vias extend from the first conductive layer to the third conductive layer through the second conductive layer.

25. The substrate of claim 24, further comprising:
an electrical connector comprising a pair of broadside coupled signal conductors coupled to the pair of signal contact pads,
wherein:
the conductive traces on the third conductive layer connected to the pair of signal vias are edge coupled; and
the substrate and electrical connector are configured such that differential signals are coupled between the signal conductors of the connector and the conductive traces on the third conductive layer with less than −40 dB of suck out loss over the frequency range of 56 GHz to 112 GHz.

26. The substrate of claim 24, further comprising a pair of un-plated holes extending from the first conductive layer toward the third conductive layer and concentric with the pair of signal vias.

27. The substrate of claim 11, further comprising a first ground via disposed between a first region and a second region of the plurality of regions.

28. The substrate of claim 27, wherein the first ground via is disposed between the first and second regions in the row direction, and the substrate further comprises a second via disposed between the first region and a third region of the plurality of regions in the column direction.

29. The substrate of claim 28, wherein the plurality of ground vias of each region have a first drilled diameter and the first and second ground vias have drilled diameters that are smaller than the first drilled diameter.

30. The electronic assembly of claim 16, wherein the substrate further comprises a first auxiliary via disposed between a first pair of the signal conductors and a second pair of the signal conductors of the connector in a first direction separating the broad sides of the first pair of the signal conductors.

31. The electronic assembly of claim 30, wherein the substrate further comprises a second auxiliary via disposed between the first pair of the signal conductors and a third pair of the signal conductors of the connector in a second direction that is parallel to the surface of the substrate and perpendicular to the first direction.

32. The electronic assembly of claim 31, wherein the first and second auxiliary vias have drilled diameters that are smaller than drilled diameters of the plurality of vias.

* * * * *